(12) United States Patent
Zhang et al.

(10) Patent No.: US 9,876,066 B2
(45) Date of Patent: Jan. 23, 2018

(54) DEVICE AND STRUCTURE AND METHOD FOR FORMING THE SAME

(71) Applicant: Nanyang Technological University, Singapore (SG)

(72) Inventors: Qing Zhang, Singapore (SG); Pingqi Gao, Singapore (SG)

(73) Assignee: Nanyang Technological University, Singapore (SG)

(*) Notice: Subject to any disclaimer, the term of this patent is extended or adjusted under 35 U.S.C. 154(b) by 0 days.

(21) Appl. No.: 14/401,421

(22) PCT Filed: May 14, 2013

(86) PCT No.: PCT/SG2013/000191
§ 371 (c)(1),
(2) Date: Nov. 14, 2014

(87) PCT Pub. No.: WO2013/172784
PCT Pub. Date: Nov. 21, 2013

(65) Prior Publication Data
US 2015/0129941 A1    May 14, 2015

Related U.S. Application Data

(60) Provisional application No. 61/647,178, filed on May 15, 2012.

(51) Int. Cl.
*H01L 27/32* (2006.01)
*H01L 21/683* (2006.01)
(Continued)

(52) U.S. Cl.
CPC .......... *H01L 27/3274* (2013.01); *B82Y 10/00* (2013.01); *B82Y 30/00* (2013.01);
(Continued)

(58) Field of Classification Search
CPC .............. H01L 27/3274; H01L 27/283; H01L 27/3276; H01L 27/6835; H01L 51/5246;
(Continued)

(56) References Cited

U.S. PATENT DOCUMENTS 4,846,931 A    7/1989   Gmitter et al.
6,071,795 A    6/2000   Cheung et al.
(Continued)

FOREIGN PATENT DOCUMENTS

WO    WO 2010/062644 A2    6/2010

OTHER PUBLICATIONS

Zhang et al., "Thermal imidization of poly_amic acid. precursors on glycidyl methacrylate_GMA. graft-polymerized Si_100. surface", Thin Solid Films 374, 2000, pp. 70-79.*
(Continued)

*Primary Examiner* — Tom Thomas
*Assistant Examiner* — Vincent Wall
(74) *Attorney, Agent, or Firm* — Alston & Bird LLP

(57) ABSTRACT

In various embodiments, a method for forming a device may be provided. The method may include forming a contact layer at least partially on a substrate. The method may also include forming a device structure adhered to the contact layer. In addition, the method may include depositing a transfer medium such that the device structure is at least partially covered by the transfer medium. The method may further include solidifying the transfer medium. The method may also include separating the contact layer, the device structure and the transfer medium from the substrate. The contact layer may have a greater adhesion to the device structure than to the substrate.

19 Claims, 42 Drawing Sheets

(51) Int. Cl.
*B82Y 30/00* (2011.01)
*B82Y 10/00* (2011.01)
*H01L 27/28* (2006.01)
*H01L 51/52* (2006.01)
H01L 51/00 (2006.01)
H01L 51/05 (2006.01)

(52) U.S. Cl.
CPC ........ *H01L 21/6835* (2013.01); *H01L 27/283* (2013.01); *H01L 27/3276* (2013.01); *H01L 51/0013* (2013.01); *H01L 51/0097* (2013.01); *H01L 51/5237* (2013.01); *H01L 51/5246* (2013.01); *H01L 51/0048* (2013.01); *H01L 51/0558* (2013.01); *H01L 2221/6835* (2013.01); *H01L 2221/68386* (2013.01); *H01L 2227/323* (2013.01); *H01L 2251/5338* (2013.01); *H01L 2924/0002* (2013.01); *Y02E 10/549* (2013.01)

(58) Field of Classification Search
CPC ............. H01L 51/5237; H01L 51/0097; H01L 51/0013; H01L 51/0558; H01L 51/0048
See application file for complete search history.

(56) References Cited

U.S. PATENT DOCUMENTS

| | | | | |
|---|---|---|---|---|
| 2004/0144972 | A1* | 7/2004 | Dai | B82Y 10/00 257/20 |
| 2005/0184641 | A1* | 8/2005 | Armitage | B82Y 10/00 313/495 |
| 2006/0113510 | A1* | 6/2006 | Luo | B82Y 10/00 252/500 |
| 2009/0224230 | A1* | 9/2009 | Pesetski | B82Y 10/00 257/24 |
| 2010/0001374 | A1 | 1/2010 | Gmitter et al. | |
| 2011/0253982 | A1* | 10/2011 | Wang | B82Y 10/00 257/24 |
| 2013/0119348 | A1* | 5/2013 | Zhou | H01L 29/775 257/29 |

OTHER PUBLICATIONS

Williams et al., "Etch Rates for Micromachining Processing-Part II", Journal of Micro. Elec. Mech. Sys., vol. 12, No. 6, 2003, pp. 761-778.*
Kang et al., "Printed Multilayer Superstructures of Aligned Single-Walled Carbon Nanotubes for Electronic Applications", Nano Letters, vol. 7, No. 11, 2007, pp. 3343-3348.*
Unarunotai et al., "Layer-by-Layer Transfer of Multiple, Large Area Sheets of Graphene Grown in Multilayer Stacks on a Single SiC Wafer", ACSNano, vol. 4, No. 10, 2010, pp. 5591-5598.*
International Search Report and Written Opinion for International Application No. PCT/SG2013/000150 dated Jun. 25, 2013.
International Preliminary Report on Patentability for International Application No. PCT/SG2013/000150 dated Oct. 28, 2014.
International Search Report and Written Opinion for International Application No. PCT/SG2013/000191 dated Aug. 30, 2013.
International Preliminary Report on Patentability (Chapter II) for International Application No. PCT/SG2013/000191 dated Apr. 11, 2014.
J. H. Ahn, H. S. Kim, K. J. Lee, S. Jeon, S.J. Kang, Y. Sun, R. G. Nuzzo, J. A. Rogers, "Heterogeneous three-dimensional electronics by use of printed semiconductor nanomaterials," Science 314 (5806), 1754-1757 (2006).
Q. Cao, H. S. Kim, N. Pimparkar, Kulkarni J P, Wang C, Shim M, Roy K, Alam M. A., Rogers J. A."Medium-scale carbon nanotube thin-film integrated circuits on flexible plastic substrates," Nature 454, 495-500 (2008).
G. Gelinck, P. Heremans, K. Nomoto, T. D. Anthopoulos "Organic Transistors in Optical Displays and Microelectronic Applications," Adv. Mater. 22 (34), 3778-3798 (2010).
F. N. Ishikawa, H. K. Chang, K. Ryu, P Chen, A Badmaev, L G D Arco, G Shen, C Zhou, "Transparent Electronics Based on Transfer Printed Aligned Carbon Nanotubes on Rigid and Flexible Substrates," Acs Nano 3 (1), 73-79 (2009).
A. Javey, Q. Wang, A. Ural, Y. Li, H. Dai, "Carbon Nanotube Transistor Arrays for Multistage Complementary Logic and Ring Oscillators," Nano Letters 2 (9), 929-932 (2002).
S. J. Kang, C. Kocabas, H. S. Kim, Q. Cao, M. A. Meitl, D-Y Khang, J. A. Rogers, "Printed Multilayer Superstructures of Aligned Single-Walled Carbon Nanotubes for Electronic Applications," Nano Letters 7 (11), 3343-3348 (2007).
R. Melik, E. Unal, N. K. Perkgoz, C. Puttlitz, H. V. Demir, "Flexible metamaterials for wireless strain sensing," Applied Physics Letters 95 (18) 181105-1-181105-3 (2009).
X. G. Peralta, M. C. Wanke, C. L. Arrington, J. D. Williams, I. Brener et al."Large-area metamaterials on thin membranes for multilayer and curved applications at terahertz and higher frequencies," Applied Physics Letters 94 (16) 161113-1-161113-3 (2009).
T Sekitani, T Yokota, U Zschieschang, H Klauk, S Bauer, K Takeuchi, M Takamiya, T Sakurai, T Someya, "Organic Nonvolatile Memory Transistors for Flexible Sensor Arrays," Science 326 (5959), 1516-1519 (2009).
T. Someya, Y. Kato, T. Sekitani, S. Iba, Y. Noguchi, Y. Murase, H. Kawaguchi, T. Sakurai, "Conformable, flexible, large-area networks of pressure and thermal sensors with organic transistor active matrixes," PNAS; 102 (35), 12321-12325 (2005).
T. Someya, T. Sekitani, S. Iba, Y. Kato, H. Kawaguchi, T. Sakurai, "A large-area, flexible pressure sensor matrix with organic field-effect transistors for artificial skin applications," PNAS; 101(27), 9966-9970 (2004).
D. Sun, M. Y. Timmermans, Y. Tian, A. G. Nasibulin, E. I. Kauppinen, S. Kishimoto, T. Mizutani, Y. Ohno, "Flexible high-performance carbon nanotube integrated circuits," Nature Nanotechnology 6 (3), 156-161 (2011).
K. Takei, T. Takahashi, J. C. Ho, H. Ko, A. G. Gillies, P. W. Leu, R. S. Fearing, A. Javey, "Nanowire active-matrix circuitry for low-voltage macroscale artificial skin," Nature Materials 9 (10), 821-826 (2010).
J. Yoon, A. J. Baca, S. I. Park, P. Elvikis, J. B. Geddes III, L. Li, R. H. Kim, J. Xiao, S. Wang, T. Kim, M. J. Motala, B. Y. Ahn, E. Duoss, J. A. Lewis, R. G. Nuzzo, P. M. Ferreira, Y. Huang, A. Rockett, J. A. Rogers, "Ultrathin silicon solar microcells for semi-transparent, mechanically flexible and microconcentrator module designs," Nature Materials 7, 907-915 (2008).

* cited by examiner

FIG. 1

100 forming a contact layer at least partially on a substrate
— 102 forming a device structure adhered to the contact layer
— 104 depositing a transfer medium such that the device structure is at least partially covered by the transfer medium
— 106 solidifying the transfer medium
— 108 separating the contact layer, the device structure and the transfer medium from the substrate, wherein the contact layer has a greater adhesion to the device structure than to the substrate.
— 110

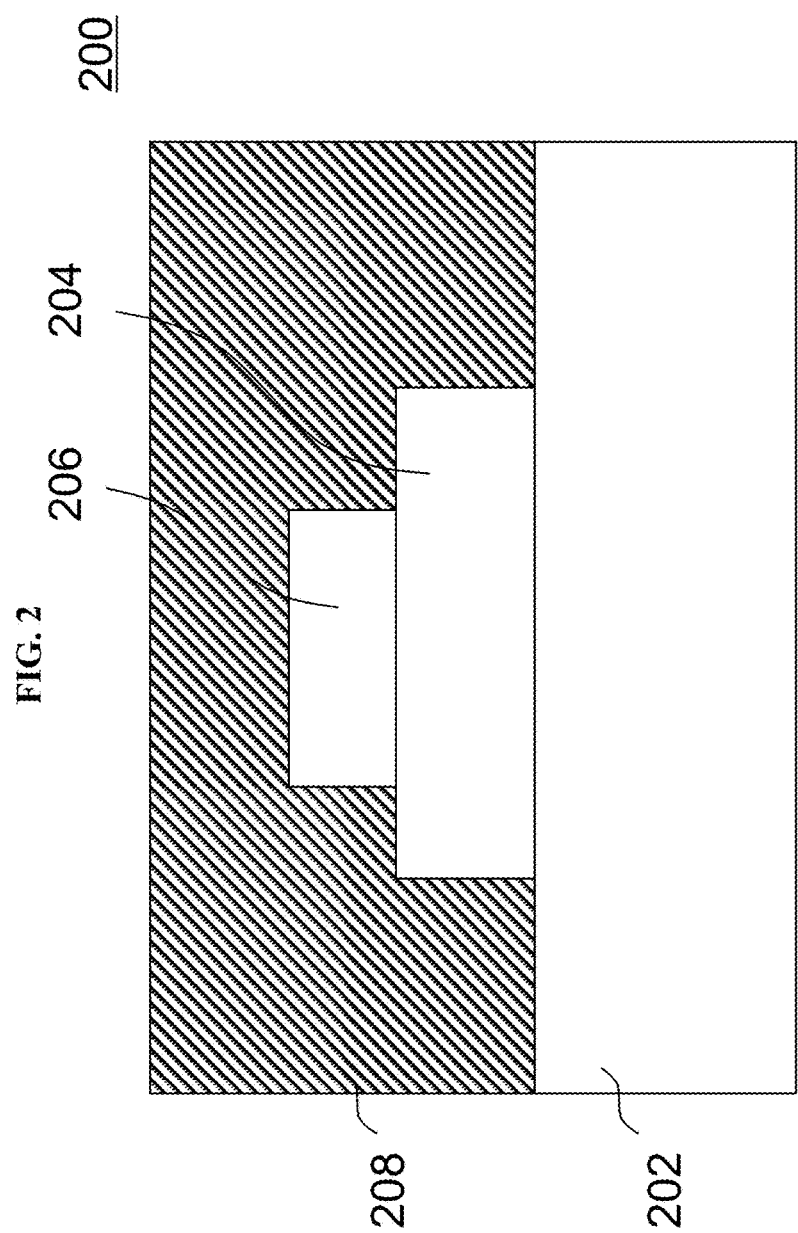

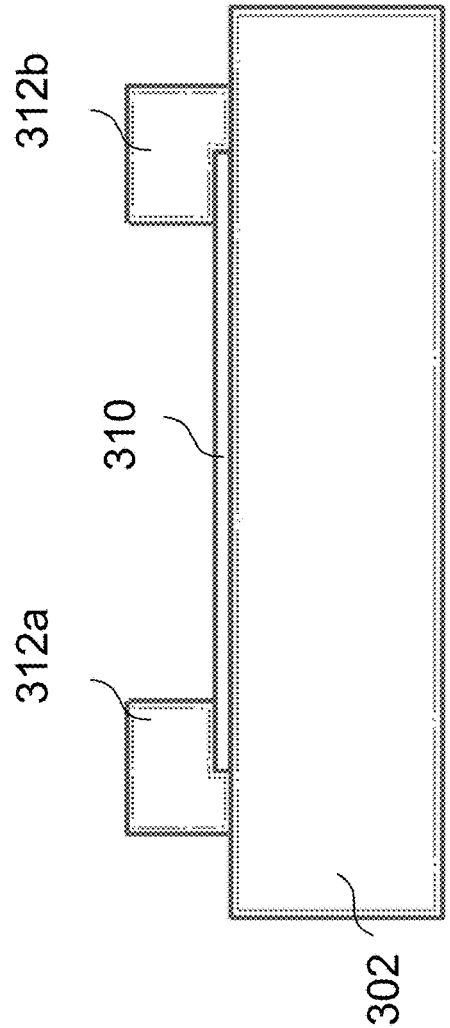

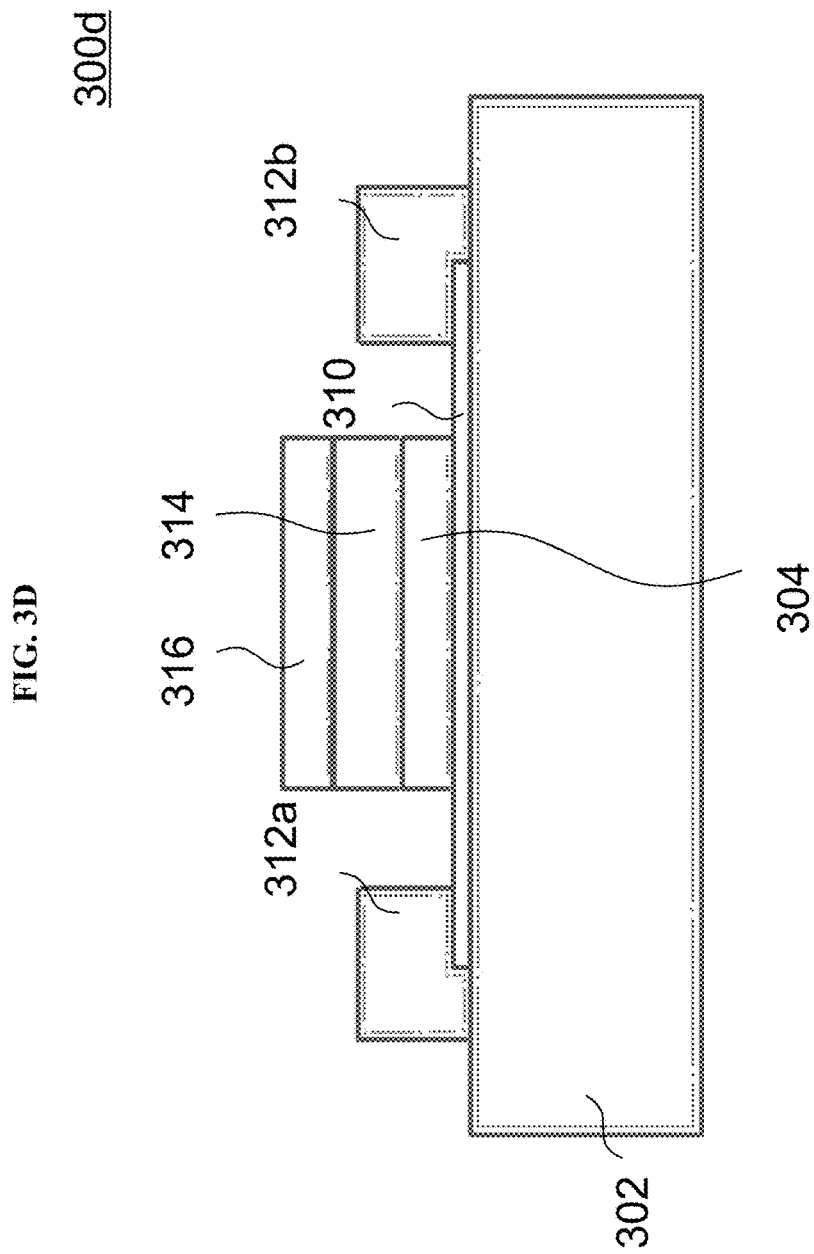

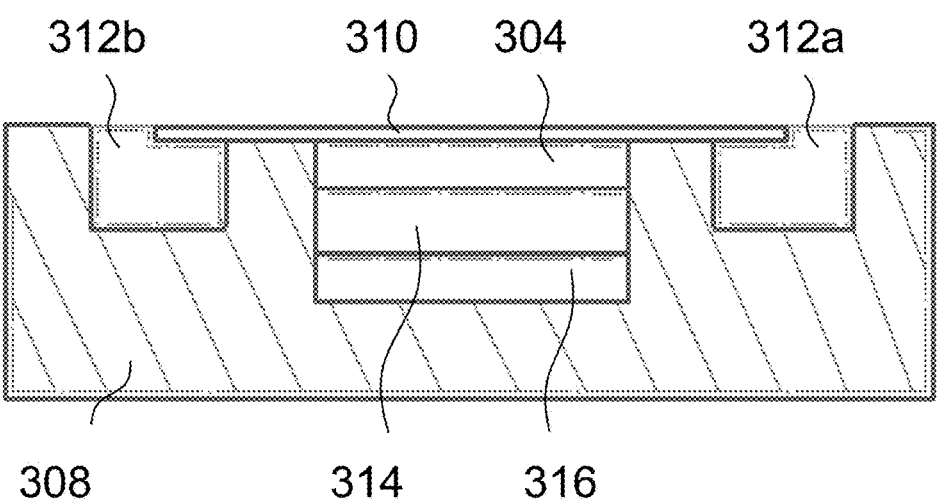
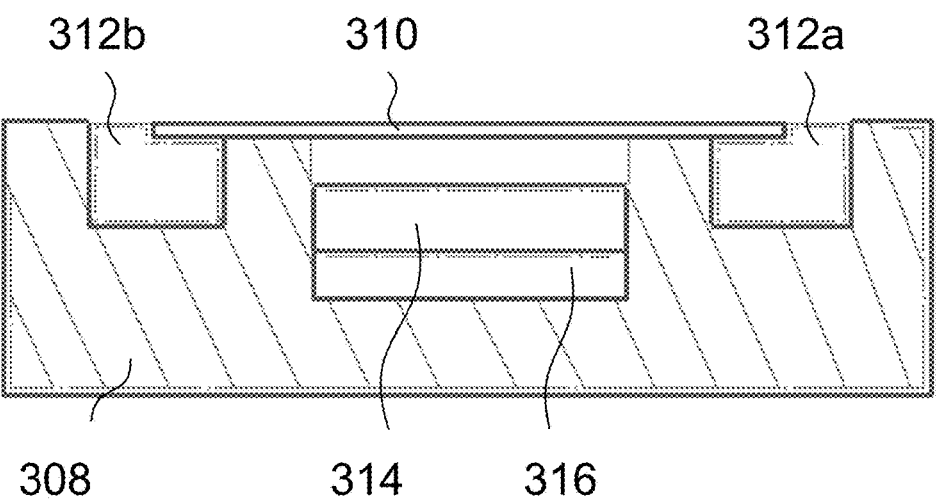

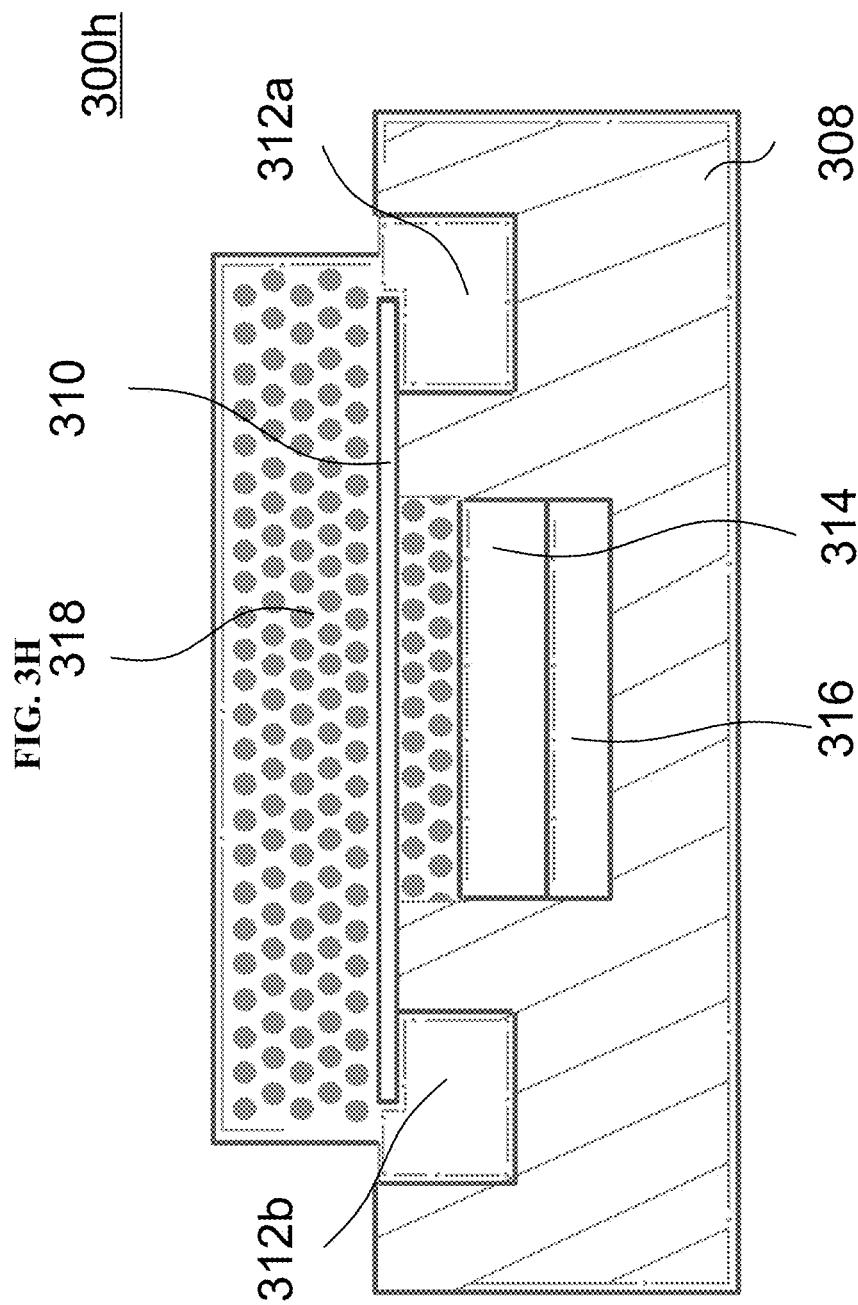

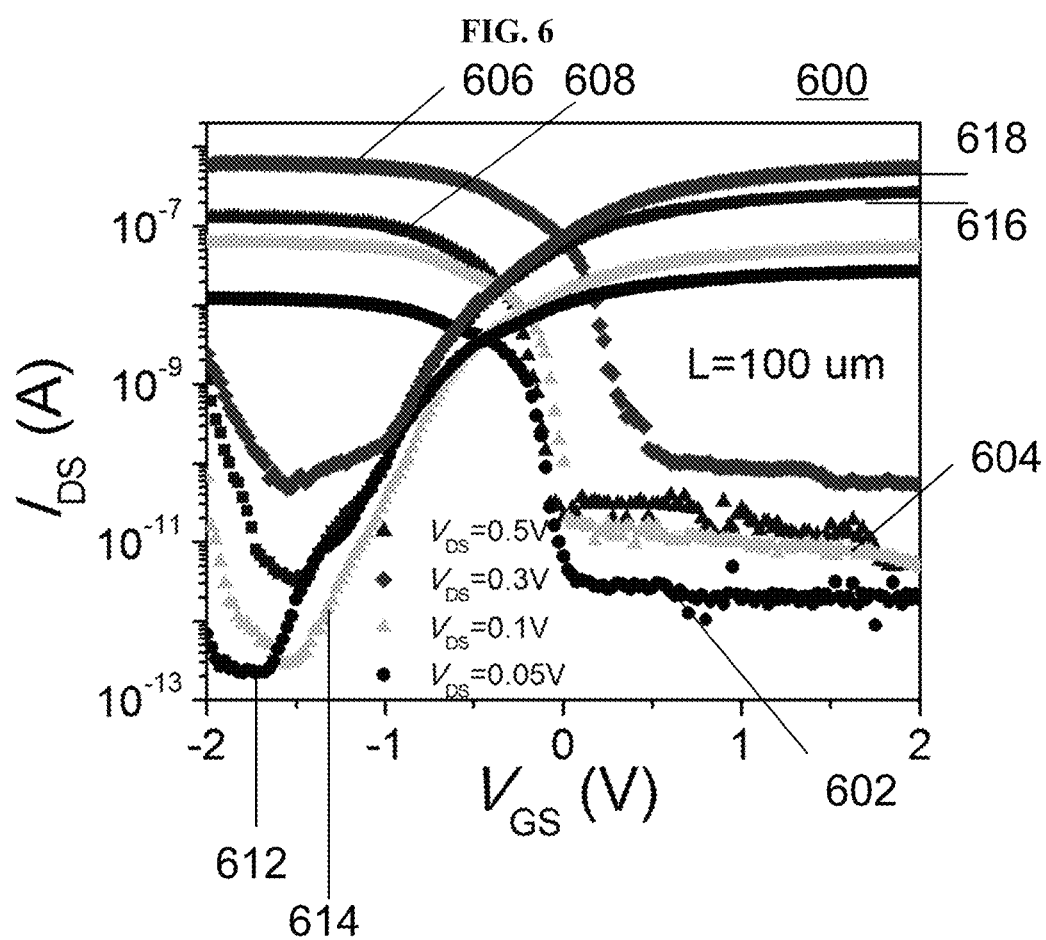

FIG. 8A
800a
802
NOR
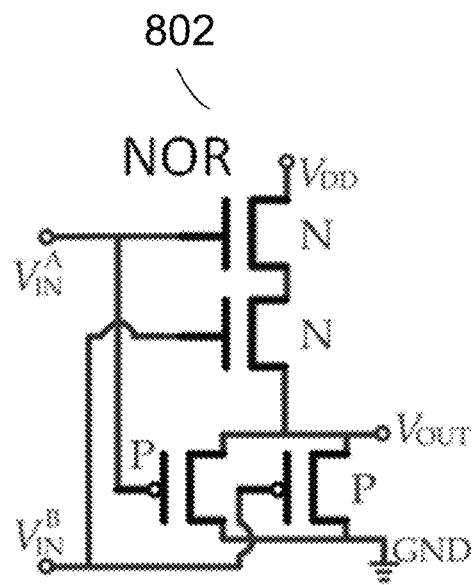
804
OR
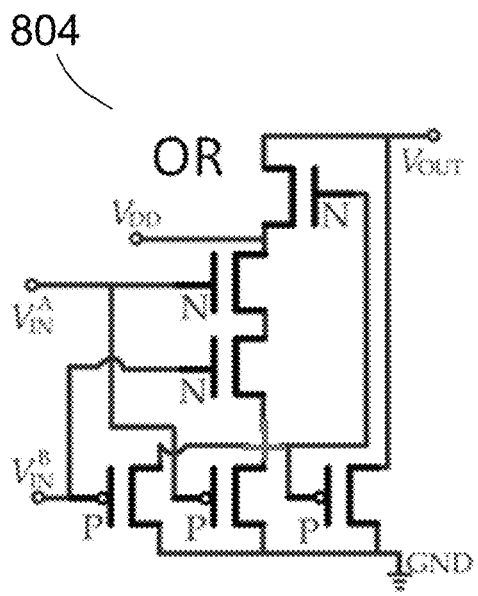
806
NAND
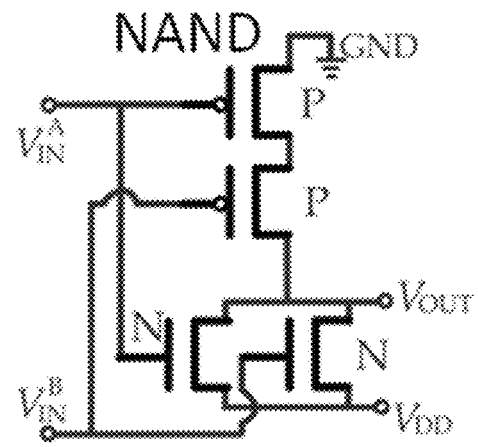
808
AND
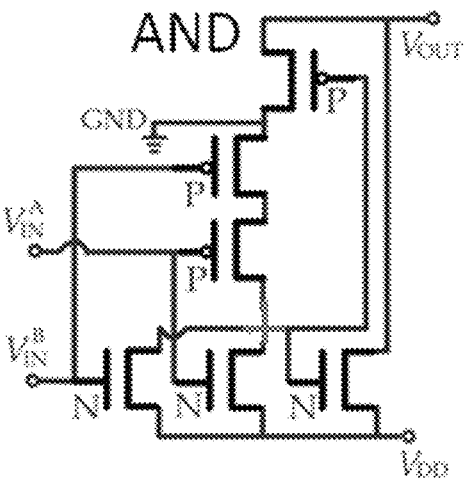

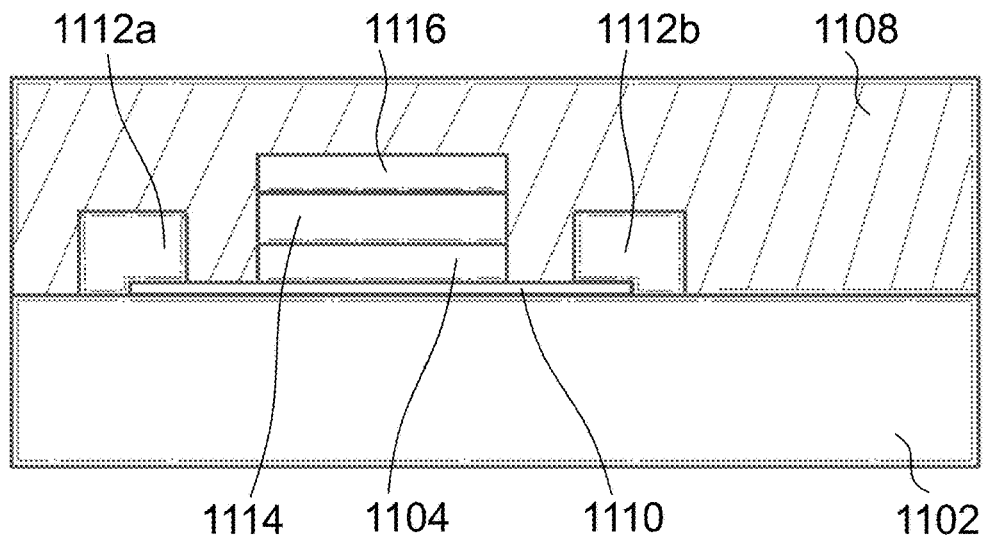
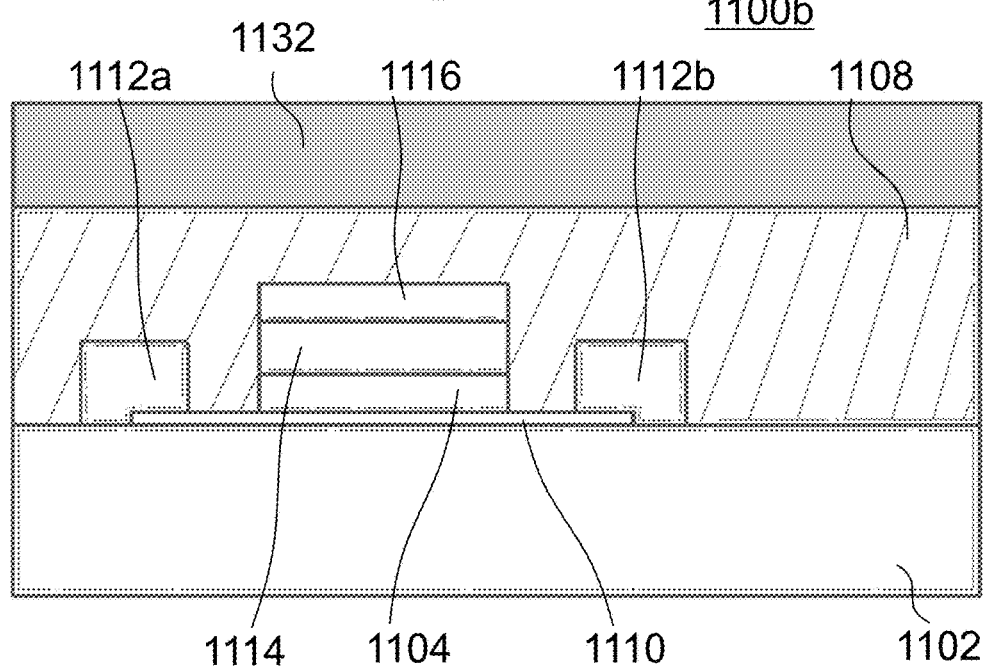

DEVICE AND STRUCTURE AND METHOD FOR FORMING THE SAME

CROSS-REFERENCE TO RELATED APPLICATIONS

This application claims the benefit of priority of U.S. application No. 61/647,178 filed May 15, 2012, the contents of it being hereby incorporated by reference in its entirety for all purposes.

TECHNICAL FIELD

Various aspects of this disclosure relate to electronic/electrical devices and structures and methods for forming the same.

BACKGROUND

Next generation electronic circuits, displays, data storages and other applications may be required to be flexible. Silicon may not be a good material for flexible electronic applications as silicon is brittle.

Attaching individual silicon chips onto a flexible plastic substrate may lead to reliability issues and high fabrication costs.

Device structures, including circuits, may be fabricated on the flexible substrates. Nanomaterial films such as carbon nanotube films and silicon nanowire films, etc may be transferred to a flexible substrate before being patterned. Metallic connections may also be formed on the flexible substrate. Multiple deposition and patterning steps may be required to be carried out on the flexible substrate to fabricate the device. For instance, carbon nanotube (CNT) based organic light emitting diodes (OLED) may be fabricated by transferring CNT films to a flexible substrate, patterning the source/drain (S/D) electrodes, electrically isolating each device, depositing dielectric layers, forming vias and interconnects etc. on the flexible substrates. Thus, several photolithographic, metallization and etching steps are required.

There are technical difficulties to implement all of these steps on flexible substrates, especially for thin substrates on a large scale. Fabricating device structures, including circuits on flexible substrates may inherently result in poor performance of the devices.

SUMMARY

In various embodiments, a method for forming a device may be provided. The method may include forming a contact layer at least partially on a substrate. The method may also include forming a device structure adhered to the contact layer. In addition, the method may include depositing a transfer medium such that the device structure is at least partially covered by the transfer medium. The method may further include solidifying the transfer medium. The method may also include separating the contact layer, the device structure and the transfer medium from the substrate. The contact layer may have a greater adhesion to the device structure than to the substrate.

In various embodiments, a structure may be provided. The structure may include a substrate. The device may also include a contact layer at least partially on the substrate. The device may additionally include a device structure adhered to the contact layer. The device may further include a transfer medium at least partially covering the device. The contact layer may have a greater adhesion to the device structure than to the substrate.

In various embodiments, a device may be provided. The device may include a device structure. The device structure may include a channel between a first electrode and a second electrode, the channel having a length and a perimeter. The device structure may further include a dielectric layer along the channel. The device structure may also include a gate electrode on the dielectric layer. The device may also include a transfer medium at least partially covering the device structure. The device may further include a passivation layer at least partially covering the device structure.

BRIEF DESCRIPTION OF THE DRAWINGS

The invention will be better understood with reference to the detailed description when considered in conjunction with the non-limiting examples and the accompanying drawings, in which:

FIG. 1 shows a schematic of a method for forming a device according to various embodiments.

FIG. 2 shows a schematic having a cross sectional side view of a structure according to various embodiments.

FIGS. 3A to 3H show a method for forming a device according to various embodiments; wherein FIG. 3A shows a cross sectional side view of a channel formed on a substrate according to various embodiments; wherein FIG. 3B shows a cross sectional side view of a contact layer being formed at least partially on the substrate according to various embodiments; wherein FIG. 3C shows a cross sectional side view of a dielectric layer formed on the contact layer according to various embodiments; wherein FIG. 3D shows a cross sectional side view of a gate electrode formed on the dielectric layer according to various embodiments; wherein FIG. 3E shows a cross sectional side view of a transfer medium deposited such that the device structure may be at least be partially covered by the transfer medium; wherein FIG. 3F shows a cross sectional side view of a removable portion including the transfer medium, the contact layer and the device structure according to various embodiments; FIG. 3G shows a cross sectional side view of a removable portion showing the contact layer being etched away; and wherein FIG. 3H shows a cross sectional side view of the removable portion being passivated to form the device according to various embodiments.

FIGS. 4A to 4I show a method for forming a device according to various embodiments; wherein FIG. 4A shows a top front perspective view of a first channel and a second channel formed on a substrate according to various embodiments; wherein FIG. 4B shows a top front perspective view of a contact layer being formed at least partially on the substrate according to various embodiments; wherein FIG. 4C shows a top front perspective view of a dielectric layer formed on the contact layer according to various embodiments; wherein FIG. 4D shows a top front perspective view of a gate electrode formed on the dielectric layer according to various embodiments; wherein FIG. 4E shows a top front perspective view of an interconnect formed on or over the substrate according to various embodiments; wherein FIG. 4F shows a top front perspective view of a transfer medium deposited such that the device structure may be .at least be partially covered by the transfer medium according to various embodiments; wherein FIG. 4G shows a top front perspective view of a removable portion including the transfer medium, the contact layer and the device structure according to various embodiments; wherein FIG. 4H shows a cross sectional side view of a removable portion showing the contact layer being etched away according to various embodiments; and wherein FIG. 4I shows a cross sectional side view of the removable portion being passivated to form the device according to various embodiments.

FIG. 6 shows a plot of the drain to source current ($I_{DS}$) as a function of the potential difference between the gate and the source ($V_{GS}$) of a carbon nanotube thin film transistor (CNT-TFT) according to various embodiments.

FIG. 8A is a schematic showing circuit arrangement diagram of an NOR gate, circuit arrangement diagram of an OR gate, circuit arrangement diagram of an NAND gate and circuit arrangement diagram of an AND gate according to various embodiments.

FIGS. 9A to 9F show a method for forming a device according to various embodiments; wherein FIG. 9A shows a cross sectional side view of an intermediate structure formed on a substrate according to various embodiments; wherein FIG. 9B shows a cross sectional side view of a conductive via formed on the intermediate structure according to various embodiments shown in FIG. 9A; wherein FIG. 9C shows a cross sectional side view of an electrical structure formed on the intermediate structure according to various embodiments; wherein FIG. 9D shows a cross sectional side view of a removable portion being separated from the substrate according to various embodiments; wherein FIG. 9E shows a cross sectional side view of the removable portion with the contact layer being etched away according to various embodiments; and wherein FIG. 9F shows a cross sectional side view of the device according to various embodiments.

FIGS. 11A to 11G show a method for forming a device according to various embodiments; wherein FIG. 11A shows a cross sectional side view of an intermediate structure formed on a substrate according to various embodiments; wherein FIG. 11B shows a cross sectional side view of a further substrate being attached to the intermediate structure according to various embodiments in FIG. 11A; wherein FIG. 11C shows a cross sectional side view of a removable portion being separated from the substrate; wherein FIG. 11D shows a cross sectional side view of the removable portion with the contact layer being etched away according to various embodiments; wherein FIG. 11E shows a cross sectional side view of the removable portion being passivated according to various embodiments; wherein FIG. 11F shows a cross sectional side view of a light emitting diode (LED) anode being formed according to various embodiments; and wherein FIG. 11G shows a cross sectional side view of a device according to various embodiments.

FIGS. 13A to 13E show a schematic of a method for forming a device according to various embodiments; wherein FIG. 13A shows a contact layer at least partially on a substrate according to various embodiments; wherein FIG. 13B shows one or more solar material deposited at least partially on the contact layer according to various embodiments; wherein FIG. 13C shows the solar cell structures being formed according to various embodiments; wherein FIG. 13D shows a transfer medium being deposited such that the device structure is at least partially covered by the transfer medium according to various embodiments; and wherein FIG. 13E shows the removable portion being separated from the substrate according to various embodiments FIGS. 14A to 14F shows a method for forming a device according to various embodiments; wherein FIG. 14A shows a top corner perspective view of a substrate according to various embodiments; wherein FIG. 14B shows a top corner perspective view of a contact layer deposited on a substrate according to various embodiments; wherein FIG. 14C shows a top corner perspective view of the contact layer being patterned according to various embodiments; wherein FIG. 14D shows a top corner perspective view of a transfer medium being deposited on the contact layer; wherein FIG. 14E shows a top corner perspective view of the removable portion being separated from the substrate according to various embodiments; and wherein FIG. 14F shows a top corner perspective view of the device according to various embodiments.

DETAILED DESCRIPTION

Figure 3B:
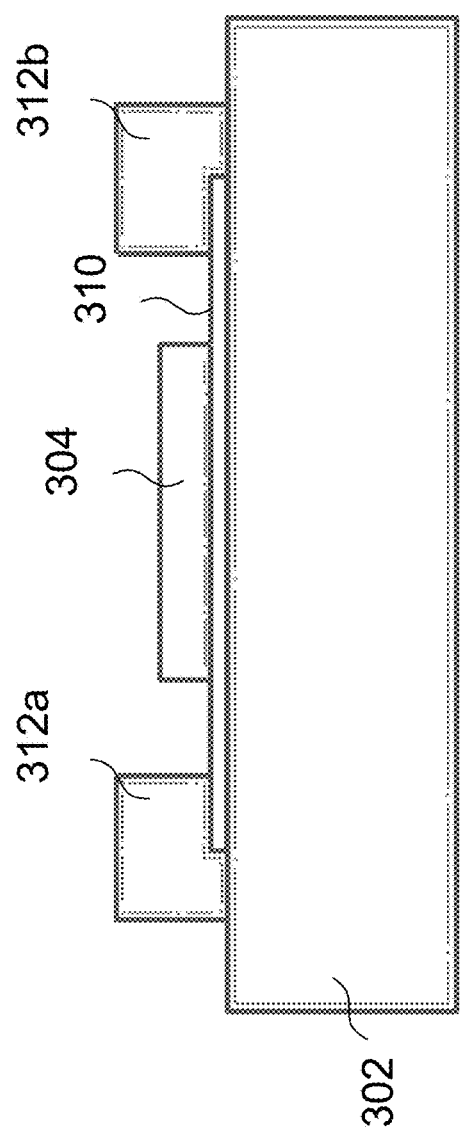

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

It should be understood that the terms "top", "bottom", "down", "side", "corner" etc., when used in the following description are used for convenience and to aid understanding of relative positions or directions, and not intended to limit the orientation of any device or structures or any part of any device or structure.

FIG. 1 shows a schematic 100 of a method for forming a device according to various embodiments. The method may include, in 102, forming a contact layer at least partially on a substrate. The method may also include, in 104, forming a device structure adhered to the contact layer. In addition, the method may include, in 106, depositing a transfer medium such that the device structure is at least partially covered by the transfer medium. The method may further include, in 108, solidifying the transfer medium. The method may also include, in 110, separating the contact layer, the device structure and the transfer medium from the substrate. The contact layer may have a greater adhesion to the device structure than to the substrate.

In other words, the method may include forming a contact layer on at least a portion of a substrate. The contact layer may serve as a platform for forming a device structure. The method may include depositing a transfer medium such that the transfer medium adheres to at least a portion of the device structure. The method may further include solidifying the transfer medium. The contact layer, the device structure and the transfer medium may form a removable portion. As the contact layer adheres better to the device structure compared to the substrate, the removable portion may be separated as an integral piece from the substrate.

In various embodiments, the contact layer may be configured to hold the device structure together. In various embodiments, depositing the transfer medium may include depositing the transfer medium such that the contact layer is also at least partially covered by the transfer medium. The contact layer may be further configured to hold the device structure together with the transfer medium. The contact layer may be configured to hold the device structure together with the transfer medium such that the contact layer, the device structure and the transfer medium may be separated as an integral piece from the substrate. Forming a contact layer at least partially on a substrate may include forming a contact layer adhered to the substrate.

In various embodiments, the device structure may include a nanomaterial such as nanotubes (e.g. carbon nanotubes), nanowires (e.g. silicon nanowires), nanopillars, nanosheets (e.g. graphene) and nanoparticles. Nanomaterials may have at least one external dimension smaller than about 100 nm, e.g. in a range from about 1 nm to about 100 nm. In various embodiments, nanomaterials may possess special properties, individually (e.g. individual carbon nanotubes etc.) and/or as an ensemble (e.g. as carbon nanotube thin films), stemming from their nanoscale dimensions.

The contact layer may be adhered to the device structure. The contact layer may be adhered to a portion of the device structure such as the nanomaterial. The nanomaterial may be adhered to the contact layer. In various embodiments, forming a device adhered to the contact layer may include forming a device such that the device structure is at least partially on the contact layer.

The nanomaterial may form a channel having a first end and a second end, the first end may be electrically coupled to a first electrode and the second end is electrically coupled to a second electrode. In other words, the device structure may include a first electrode and a second electrode. The second electrode may be arranged at a distance from the first electrode. The device structure may further include a nanomaterial between the first electrode and the second electrode. The nanomaterial may form a channel having a first end and a second end. The first end may be electrically coupled to the first electrode and the second end may be electrically coupled to the second electrode.

In various embodiments, the device structure may further include a dielectric layer on the contact layer. The dielectric layer may be arranged over the channel. The device structure may further include a gate electrode on the dielectric layer. In various embodiments, the gate electrode may turn the channel on or off. When the channel is turned on, current may flow between the first electrode and the second electrode upon application of a voltage between the first electrode and the second electrode. When the channel is turned off, no current may flow between the first electrode and the second electrode upon application of a voltage between the first electrode and the second electrode. The gate electrode may turn the channel on or off by application of a voltage which induces an electric field through the dielectric layer to the channel.

Forming the device structure may include forming a dielectric layer on the contact layer. Forming the device structure may further include forming a gate electrode layer on the dielectric layer.

The method may further include forming an electrically conductive via on the transfer medium. The method may include forming an electrically conductive via on the transfer medium such that the electrically conductive via is electrically coupled to the device structure.

The method may further include arranging an insulating element (such as a rubber sheet) on the transfer medium such that the insulating element is at least partially on a portion of the electrically conductive via. The method may further include arranging a metal electrode on the insulating element such that the metal electrode, the insulating element and the electrically conductive via forms an electrical structure. The electrical structure may be a resistive structure or a capacitive structure.

The metal electrode, the insulating element and the conductive via may form a resistive structure. By applying an external pressure, the conductance of the insulating element may change. The change in conductance may be detected by a measuring circuit. The measuring circuit may include a transistor.

Alternatively, the metal electrode may be separated from the electrically conductive via by the insulating element to form a capacitive structure. A voltage difference may be applied between the metal electrode and the electrically conductive via to provide a capacitance value. When pressure exerted on the insulating element is increased, the metal electrode may move closer to the electrically conductive via and the capacitance value may increase. When pressure exerted on the insulating element is decreased, the metal electrode may move further away from the electrically conductive via and the capacitance value may decrease.

The method may include attaching a further substrate to a first portion of the transfer medium. The first portion of the transfer medium may be opposite a second portion of the transfer medium adjacent to the substrate.

The method may also include depositing a passivation layer on the second portion of the transfer medium after separating the contact layer, the device and the transfer medium from the substrate. The method may also include forming a hole through the passivation layer. The method may further include forming a light emitting diode (LED) structure on the passivation layer. The LED structure may be an organic LED (OLED) structure. The LED structure many be electrically coupled with the device structure through the hole.

In various embodiments, the device structure may include a transistor such as a metal oxide field effect transistor (MOSFET) or a bipolar junction transistor (BJT). The device structure may additionally or alternatively include a circuit arrangement such as an integrated circuit. The circuit arrangement may include may include one or more transistors. The integrated circuit may be a logic integrated circuit, a memory integrated circuit or a power integrated circuit. The integrated circuit may be an application specific integrated circuit (ASIC) or a field programmable gate array (FPGA). As an alternative, the integrated circuit may be any other programmable logic circuit such as e.g. a programmable processor, e.g. a programmable microprocessor or programmable nanoprocessor. The device structure may include additional or alternatively include a capacitor, an inductor, a resistor or any other electrical or electronic components.

The device structure may include a solar cell or a photovoltaic cell.

The device structure may include metamaterial patterns. The metamaterial patterns may include periodic metamaterial patterns. The metamaterial patterns may include metallic patterns. The device structure may instead include a material with any patterns. In various embodiments, the contact layer may be patterned. Forming the device structure may include patterning the device structure according to the contact layer.

The contact layer may be patterned with periodic metamaterial patterns. Patterning the device structure according to the contact layer may include patterning the device structure according to the periodic metamaterial patterns on the contact layer.

In various embodiments, the method may further include removing the contact layer after separating the contact layer, the device structure and the transfer medium from the substrate. Removing the contact layer may include etching away the contact layer. The contact layer may be etched by chemical etching.

In various embodiments, the contact layer may include gold (Au) or palladium (Pd). In various embodiments, if the first electrode and the second electrode include palladium, the contact layer may include gold. Conversely, if the first electrode and the second electrode include gold, the contact layer may include palladium.

The transfer medium may include a solution based transfer medium such as polyamic acid (PAA). Solidifying the transfer medium may include converting the transfer medium from a first material to a second material (e.g. converting the polyamic acid to polyimide). In other words, the first material may be polyamic acid. The second material may be polyimide. The second material may be an etch resistant material. Solidifying the transfer medium may include baking (e.g. hot baking) and/or curing the transfer medium.

Solidifying the transfer medium may include partially baking and/or partially curing the transfer medium. Solidifying the transfer medium may include solidifying the transfer medium such that the transfer medium may bind with the device structure. Solidifying the transfer medium may also include solidifying the transfer medium such that the transfer medium may bind with the contact layer. Alternatively or additionally, solidifying the transfer medium may include solidifying the transfer medium such that the transfer medium may bind with the device structure. Solidifying the transfer medium may include thermal annealing. Thermal annealing may be carried out in a nitrogen ambient. Solidifying the transfer medium may include annealing the transfer medium at temperatures ranging from about 80° C. to about 300° C., e.g. from about 100° C. to about 150° C., e.g. from about 105 to about 115° C., e.g. about 110° C. Solidifying the transfer medium may include annealing the transfer medium for a duration from about 2 minutes to about 10 minutes, e.g. from about 3 minutes to about 5 minutes, e.g. about 4 minutes. The transfer medium may be annealed using a hot plate.

The transfer medium may be converted from a first material (e.g. polyamic acid) to a second material (e.g. polyimide) after separating the contact layer, the device structure and the transfer medium from the substrate. The transfer medium may be annealed at temperatures ranging from about 200° C. to about 400° C. e.g. about 200° C. The transfer medium may be annealed for a duration from about 1 hour to about 3 hours e.g. about 2 hours. The transfer medium may be annealed in low vacuum or $N_2$ environment. The device structure may be annealed with the transfer medium. The contact layer may also be annealed with the transfer medium. The second material may be an etch resistant material. For instance, polyimide may be of high chemical resistance to an etchant used for etching away the contact layer.

The substrate may be a hard substrate such as a semiconductor substrate (e.g. a silicon substrate, a gallium arsenide substrate, a silicon germanium substrate) or an insulator substrate (e.g. a quartz substrate etc.). The hard substrate (i.e. semiconductor substrate or insulator substrates) may be configured to withstand high temperatures, such as temperatures up to 1000° C. Advantageously, this allows processing and/or synthesis of nanomaterials such as carbon nanotubes, which may include temperature of up to about 1000° C.

In various embodiments, depositing the transfer medium such that the device structure is at least partially covered by the transfer medium may include depositing the transfer medium such that the device structure is encapsulated by the transfer medium. In other words, the device structure being at least partially covered by the transfer medium may include the device structure being encapsulated by the transfer medium.

Depositing the transfer medium may include depositing the transfer medium such that the transfer medium deposited may have a thickness less than about 200 µm, e.g. between about 1 µm and about 150 µm, e.g. between about 1.4 µm and about 100 µm.

In various embodiments, separating the contact layer, the device structure and the transfer medium from the substrate includes separating the contact layer, the device structure and the transfer medium from the substrate in a single step. In other words, the contact layer, the device structure and the transfer medium may form an integral removable portion. The integral removable portion may be separated from the substrate. In various embodiments, the method may include forming an integral removable portion on a substrate. Forming an integral removable portion may include forming a device structure at least partially on a contact layer. Forming an integral removable portion may also include depositing a transfer medium such that the device structure is at least partially covered by the transfer medium. Forming an integral removable portion may further include solidifying the transfer medium. The contact layer may be at least partially in the substrate. The contact layer may have a greater adhesion to the device structure than to the substrate. The method may also include separating the integral removable portion from the substrate.

FIG. 2 shows a schematic 200 having a cross sectional side view of a structure according to various embodiments. The structure may include a substrate 202. The structure may further include a contact layer 204 at least partially on the substrate 202. The structure may also include a device structure 206 adhered to the contact layer 204. In addition, the structure may include a transfer medium 208 at least partially covering the device structure 206. The contact layer 204 may have a greater adhesion to the device structure 206 than to the substrate 202.

In other words, the structure may include a contact layer 204 on at least a portion of a substrate 202. The contact layer 204 may serve as a platform for a device structure 206. The structure may further include a transfer medium 208. The transfer medium 208 may adhere to at least a portion of the device structure 206. The contact layer 204 may have a greater adhesion to the device structure 206 than to the substrate 202.

In various embodiments, the contact layer 204 may be configured to hold the device structure 206 together. In various embodiments, the transfer medium 208 may also be at least partially covering the contact layer 204. The contact layer 204 may be further configured to hold the device structure 206 together with the transfer medium 208. The contact layer may be configured to hold the device structure 206 together with the transfer medium 208 such that the contact layer 204, the device structure 206 and the transfer medium 208 may be separated as an integral piece from the substrate 202.

In various embodiments, the device structure 206 may include a nanomaterial such as nanotubes (e.g. carbon nanotubes), nanowires (e.g. silicon nanowires), nanopillars, nanosheets (e.g. graphene) and nanoparticles. Nanomaterials may have at least one external dimension smaller than about 100 nm, e.g. in a range from about 1 nm to about 100 nm. In various embodiments, nanomaterials may possess, individually (e.g. individual carbon nanotubes etc.) and/or as an ensemble (e.g. as carbon nanotube thin films), special properties stemming from their nanoscale dimensions.

The contact layer 204 may be adhered to the device structure 206. The contact layer 204 may be adhered to a portion of the device structure 206 such as the nanomaterial. The nanomaterial may be adhered to the contact layer 204. In various embodiments, a device structure 206 adhered to the contact layer 204 may include the device structure at least partially on the contact layer 204.

The nanomaterial may form a channel having a first end and a second end, the first end may be electrically coupled to a first electrode and the second end is electrically coupled to a second electrode. In other words, the device structure 206 may include a first electrode and a second electrode. The second electrode may be arranged at a distance from the first electrode. The device structure may further include a nanomaterial between the first electrode and the second electrode. The nanomaterial may form a channel having a first end and a second end. The first end may be electrically coupled to the first electrode and the second end may be electrically coupled to the second electrode.

In various embodiments, the device structure 206 may further include a dielectric layer on the contact layer 204. The dielectric layer may be arranged over the channel. The device structure may further include a gate electrode on the dielectric layer. In various embodiments, the gate electrode may turn the channel on or off. When the channel is turned on, current may flow between the first electrode and the second electrode upon application of a voltage between the first electrode and the second electrode. When the channel is turned off, no current may flow between the first electrode and the second electrode upon application of a voltage between the first electrode and the second electrode.

In various embodiments, the structure may include a device structure 206 adhered to the contact layer 204.

The structure may further include an electrically conductive via on the transfer medium. The electrically conductive via may be electrically coupled to the device structure 206.

The structure may further include an insulating element (such as a rubber sheet) arranged on the transfer medium 208 such that the insulating element is at least partially on a portion of the electrically conductive via. The structure may further include a metal electrode arranged on the insulating element such that the metal electrode and the electrically conductive via form an electrical structure. The electrical structure may be a resistive structure or a capacitive structure.

The metal electrode, the insulating element and the conductive via may form a resistive structure. By applying an external pressure, the conductance of the insulating element may change. The change in conductance may be detected by a measuring circuit. The measuring circuit may include a transistor.

Alternatively, the electrical structure may be a capacitive structure. A voltage difference may be applied between the metal electrode and the electrically conductive via to provide a capacitance value. When pressure exerted on the insulating element is increased, the metal electrode may move closer to the electrically conductive via and the capacitance value may increase. When pressure exerted on the insulating element is decreased, the metal electrode may move further away from the electrically conductive via and the capacitance value may decrease.

The structure may include a further substrate attached to a first portion of the transfer medium 208. The first portion of the transfer medium 208 may be opposite a second portion of the transfer medium 208 adjacent to the substrate 202. The second portion of the transfer medium 208 may be attached or adhered to the substrate 202.

In various embodiments, the device structure 206 may include a transistor such as a metal oxide field effect transistor (MOSFET) or a bipolar junction transistor (BJT). The device structure 206 may additionally or alternatively include a circuit arrangement such as an integrated circuit. The circuit arrangement may include one or more transistors. The integrated circuit may be a logic integrated circuit, a memory integrated circuit or a power integrated circuit. The integrated circuit may be an application specific integrated circuit (ASIC) or a field programmable gate array (FPGA). As an alternative, the integrated circuit may be any other programmable logic circuit such as e.g. a programmable processor, e.g. a programmable microprocessor or programmable nanoprocessor. The device structure 206 may include additional or alternatively include a capacitor, an inductor, a resistor or any other electrical or electronic components.

The device structure 206 may include a solar cell or a photovoltaic cell.

The device structure 206 may include metamaterial patterns such as metallic patterns. The metamaterial patterns may include periodic metamaterial patterns. In various embodiments, the contact layer 204 may be patterned. The device structure 206 may include metamaterial patterns patterned according to the contact layer 204.

The contact layer 204 may be patterned with periodic metamaterial patterns. The device structure 206 may include periodic metamaterial patterns patterned according to the contact layer 204.

In various embodiments, the contact layer 204 may include gold (Au) or palladium (Pd). In various embodiments, if the first electrode and the second electrode include palladium, the contact layer 204 may include gold. Conversely, if the first electrode and the second electrode include gold, the contact layer 204 may include palladium.

The transfer medium 208 may include a first material, for instance, a solution based transfer medium such as polyamic acid (PAA). The transfer medium 208 may be configured to be converted from a first material (e.g. PAA) to a second material. The transfer medium 208 may be configured to be converted to the second material upon solidification. For instance, a transfer medium 208 may be configured to be converted from a first material such as PAA to a second material such as polyimide upon solidification. The second material may be an etch resistant material. Solidification may be achieved using thermal annealing, baking (e.g. hot baking) and/or curing the transfer medium.

Solidification may also be achieved by partially thermal annealing, partially baking and/or partially curing the transfer medium. The transfer medium may be baked such that polyamic acid is solidified. Solidifying the transfer medium may include solidifying the transfer medium such that the transfer medium may bind with the device structure. Solidifying the transfer medium may also include solidifying the transfer medium such that the transfer medium may bind with the contact layer. Thermal annealing may be carried out in a nitrogen ambient.

The substrate 202 may be a hard substrate such as a semiconductor substrate (e.g. a silicon substrate, a gallium arsenide substrate, a silicon germanium substrate, etc) or an insulator substrate (e.g, a quartz substrate etc.). The hard substrate may withstand high temperatures, such as temperatures up to 1000° C.

In various embodiments, the transfer medium 208 at least partially covering the device structure 206 may include the transfer medium 208 encapsulating the device structure 206. The transfer medium 208 at least covering the device structure 206 and the contact layer 204 may include the transfer medium 208 encapsulating the device structure 206 and the contact layer 204.

The transfer medium may have a thickness less than about 200 μm, e.g. between about 1 μm and about 150 μm, e.g. between about 1.4 μm and about 100 μm.

In various embodiments, the contact layer 204, the device structure 206 and the transfer medium 208 may form an integral removable portion. The integral removable portion may be formed upon solidification of the transfer medium 208. The integral removable portion may be configured to be separated from the substrate. In other words, the structure may include an integral removable portion on a substrate 202. The integral removable portion may include a contact layer 204, a device structure 206 at least partially on the contact layer 204 and a transfer medium 208 at least covering the device structure 206. The contact layer 204 may be at least partially in the substrate 202. The contact layer 204 may have a greater adhesion to the device structure than to the substrate 202.

FIGS. 3A to 3H show a method for forming a device according to various embodiments. The device may be a transistor such as a metal oxide field effect transistor (MOSFET). FIG. 3A shows a schematic 300a having a cross sectional side view of a channel 310 formed on a substrate 302 according to various embodiments. The channel 310 may include a thin film including a nanomaterial. For instance, the channel 310 may include a carbon nanotube thin film (CNT-TF) including carbon nanotubes (CNTs). The channel 310 may have a first end and a second end. A first electrode 312a may be formed on the substrate 302 such that the first end of the channel 310 is electrically coupled with the first electrode. A second electrode 312b may be formed on the substrate 302 such that the second end of the channel 310 is electrically coupled with the second electrode. In other words, the nanomaterial may form a channel 310 having a first end and a second end. The first end may be electrically coupled to a first electrode 312a and the second end may be electrically coupled to a second electrode 312b.

The method may include depositing the thin film on the substrate 302. The thin film may be deposited on the substrate using a suitable means such as growing the thin film via chemical vapour deposition. The channel 310 may include a random network of nanomaterials such as CNTs. The channel 310 may be semiconducting.

The method may further include forming a first electrode 312a and a second electrode 312b on the substrate 302. The first electrode may be a source electrode and the second electrode may be a drain electrode. In various alternate embodiments, the first electrode may be a drain electrode and the second electrode may be a source electrode. The first electrode and the second electrode may include a conductive material such as an appropriate metal. The first electrode (and/or the second electrode) may form low resistance contact with the nanomaterial of the channel. The first electrode (and/or second electrode) may be configured such that the first electrode (and/or second electrode) is easily detached from the substrate 302. The first electrode (and/or second electrode) may have low adhesion to the substrate 302.

The substrate 302 may be a hard substrate. The substrate 302 may be a semiconducting substrate such as a silicon substrate, a germanium substrate, a quartz substrate etc. Interconnects may be formed on the substrate 302. The interconnects may be electrically coupled to the first electrode 312a or the second electrode 312b.

FIG. 3B shows a schematic 300b having a cross sectional side view of a contact layer 304 being formed at least partially on the substrate 302 according to various embodiments. The method may include forming a contact layer 304 at least partially on a substrate 302. The nanomaterial may be adhered to the contact layer 304. At least a portion of the channel 310 may be between the contact layer 304 and the substrate 302. At least a portion of the channel 310 may be between the contact layer 304 and the substrate 302 such that the portion of the channel 310 is encapsulated by the contact layer 304 and the substrate 302. At least a portion of the contact layer 304 may be at least partially on the substrate 302. The method may include depositing a photoresist on the substrate 302. The photoresist may cover the channel 310 as well as the first electrode 312a and the second electrode 312b. The method may further include a photolithographic process. The method may further include removing a portion of the photoresist to form a trench. The trench may expose a portion of the channel 310. A suitable contact material may be deposited into the trench to form the contact layer 304. The contact layer 304 may have a greater adhesion to the device structure such as the channel 310 or nanomaterial (of the channel 310) than to the substrate 302. The contact layer 304 may include gold (Au) or palladium (Pd). In various embodiments, if the first electrode 312a and the second electrode 312b include palladium, the contact layer 304 may include gold. Conversely, if the first electrode 312a and the second electrode 312b include gold, the contact layer 304 may include palladium.

Figure 3C:
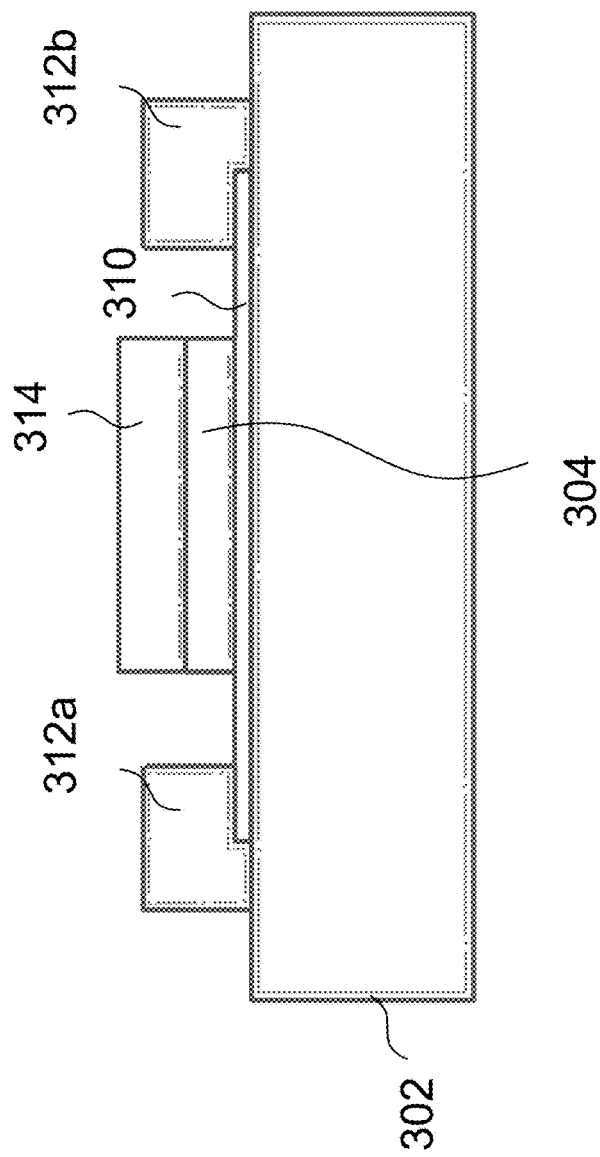

FIG. 3C shows a schematic 300c having a cross sectional side view of a dielectric layer 314 formed on the contact layer 304 according to various embodiments. Forming the device structure may include forming the dielectric layer 314 on the contact layer 304. The method may further include depositing a suitable insulating material to the trench to form the dielectric layer 314. The dielectric layer 314 may include metal oxides such as aluminum oxide (AlO), hafnium oxide (HfO) or other oxides.

FIG. 3D shows a schematic 300d having a cross sectional side view of a gate electrode 316 formed on the dielectric layer 314 according to various embodiments. Forming the device structure may include forming the gate electrode 316 on the dielectric layer 314. The method may include depositing a suitable conductive material to the trench to form the gate electrode 316. In various embodiments, the deposition of the suitable contact material for forming the contact layer 304, the deposition of the suitable insulating material for forming the dielectric layer 314 and/or the deposition of the suitable conductive material for the gate electrode 316 may be carried out using a suitable deposition technique such as electron beam evaporation, sputtering, chemical vapour deposition or electrochemical means. The method may include removing the photoresist after forming the gate electrode 316.

In various embodiments, the method may include forming a device structure at least partially on the contact layer 304. The device structure may include the first electrode 312a, the second electrode 312b, the gate electrode 316, the channel 310 and the dielectric layer 314. The device structure may be responsible for operation of the device. As shown in FIG. 3D, the device structure may be or may include a transistor. The device structure may be partially on the contact layer 304. For instance, the dielectric layer 314 may be on the contact layer.

In various embodiments, the device structure may be adhered to the contact layer 304. The device structure may include a nanomaterial. The nanomaterial may be adhered to the contact layer 304.

Figure 3E:
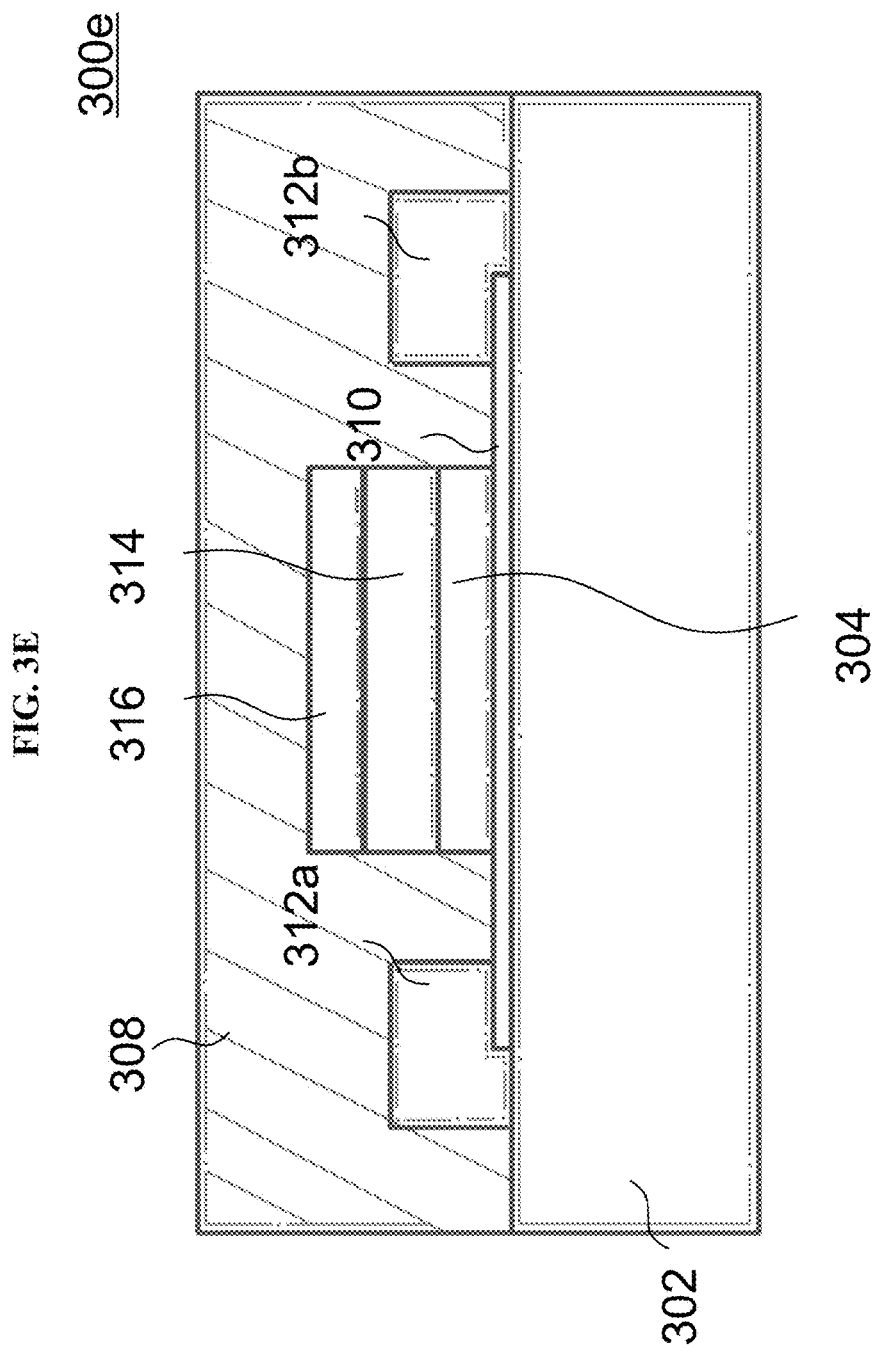

FIG. 3E shows a schematic 300e having a cross sectional side view of a transfer medium 308 deposited such that the device structure may be at least be partially covered by the transfer medium 308. The transfer medium 308 may include a first material such as polyamic acid (PAA). The transfer medium 308 may include a solution based transfer medium. The method may include depositing the transfer medium 308 such that the device structure is at least partially covered by the transfer medium. In various embodiments, depositing the transfer medium 308 such that the device structure is encapsulated by the transfer medium 308. Depositing the transfer medium 308 may include spin coating the transfer medium 308 on the device structure. The method may further include solidifying the transfer medium 308. Solidifying the transfer medium 308 may include solidifying the transfer medium 308 such that the transfer medium 308 may bind with the contact layer 304 and/or the device structure. Solidifying the transfer medium 308 may include hot baking the transfer medium 308. In various embodiments, solidifying the transfer medium 308 may cause the transfer medium 308, the contact layer 304 and the device structure to form a removable portion. In other words, the removable portion may be configured such that the portion may be removable from the substrate 302 as a single integral piece. The removable portion (i.e. the transfer medium 308, the contact layer 304 and the device structure) may be peeled off as a whole from the substrate 302.

FIG. 3F shows a schematic 300f having a cross sectional side view of a removable portion including the transfer medium 308, the contact layer 304 and the device structure according to various embodiments. The method may include separating the removable portion (including the contact layer 304, the device structure and the transfer medium) from the substrate 302. Separating the contact layer 304, the device structure and the transfer medium 308 may include separating the contact layer 304, the device structure and the transfer medium 308 from the substrate 302 in one step. As the contact layer 304 has a greater adhesion to the device structure than to the substrate 302, the removable portion may be easily separated from the substrate. The contacts 312a, 312b may have greater adhesion to the rest of the device structure than to the substrate 302. The transfer medium 308 may have greater adhesion to the device structure than to the substrate 302.

The method may further include converting the transfer medium 308 from a first material to a second material. The method may further include converting the transfer medium 308 from a first material to a second material after separating the contact layer 304, the device structure and the transfer medium from the substrate 302. In the case in which the first material is polyamic acid, the second material may be polyimide PI). Converting the transfer medium 308 from a first material to a second material may include a thermal imidization process. Converting the transfer medium 308 from a first material to a further second may include thermal annealing. The transfer medium 308 may be thermally annealed in a nitrogen ambient.

FIG. 3G shows a schematic 300g having a cross sectional side view of a removable portion showing the contact layer 304 being etched away. One or more of the first electrode 312a, the second electrode 312b, the gate electrode 316, the channel 310, the interconnects, the transfer medium 308 and the dielectric layer 314 may be configured to be resistant to the etchant used for etching away the contact layer 304. The etchant may be a vapour based etchant.

When the channel 310 includes a CNT-TF, the surface coverage of CNTs on the contact layer 304 may be low as the density of the CNT-TF is quite low and the diameters of individual CNTs are small (from about 1 nm to about 2 nm). When the removable portion is positioned within the etchant, the CNTs may remain unattacked while the contact layer 304 may be etched.

FIG. 3H shows a schematic 300h having a cross sectional side view of the removable portion being passivated to form the device according to various embodiments. The method may further include passivating a part of the removable portion (including the transfer medium 308 and/or the device structure) with a passivation layer 318. The part of the removable portion may include the channel 310 including the CNT-TFTs. In various embodiments, the removable portion may be passivated to obtain n-type CNT-TFTs. Various embodiments may result in wafer scale flexible circuit arrangements/devices being achieved with nearly 100% yield.

The device may include a device structure. The device may further include a transfer medium 308 at least partially covering the device structure. The device may further include a passivation layer 318 at least partially covering the device structure. The passivation layer 318 may include silicon nitride ($Si_3N_4$). The device structure may include the first electrode 312a, the second electrode 312b, the gate electrode 316, the channel 310 and the dielectric layer 314. The channel 310 may have a first end and a second end. The channel 310 may have a length and a perimeter. The length may extend from the first end to the second end. The area enclosed by the perimeter of the channel 310 may be substantially perpendicular to the length of the channel 310. The channel 310 may be between the first electrode 312a and the second electrode 312b. The dielectric layer 314 may be along the channel 310. The gate electrode 316 may be on the dielectric layer 314. The channel 310 may be separated from the gate electrode 316 by the dielectric layer 314. In various embodiments, the passivation layer 318 may cover the entire perimeter of the channel 310 on at least a portion along the length of the channel 310. In other words, the channel may have a portion along the length of the channel 310 which is completely surrounded by the passivation layer 318.

Figure 4A:
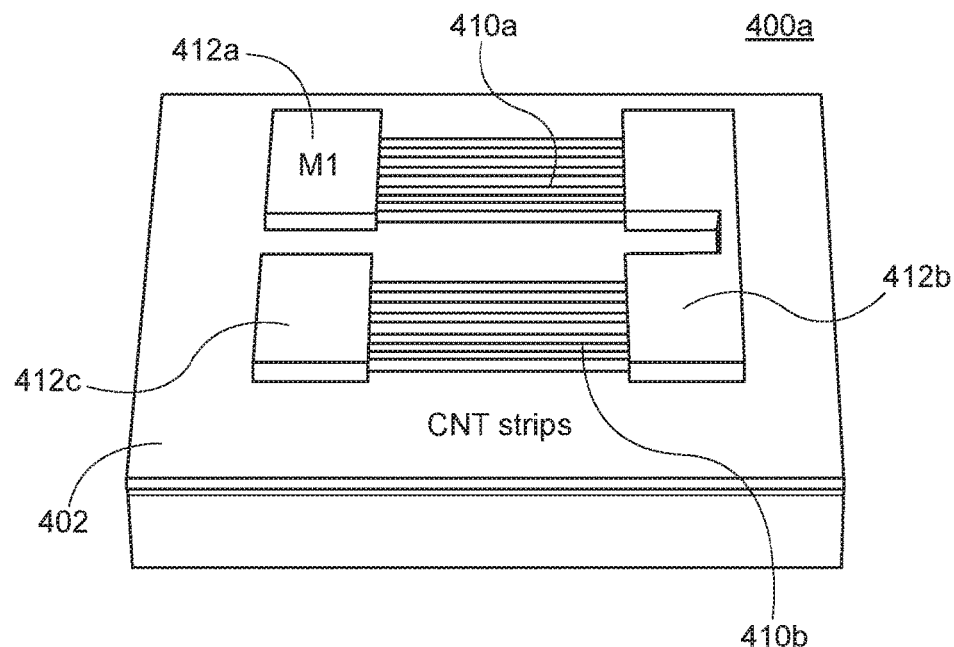

FIGS. 4A to 4I show a method for forming a device according to various embodiments. In various embodiments, the device may be a flexible inverter. The flexible inverter may include a first transistor and a second transistor. The device may be a circuit arrangement. FIG. 4A shows a schematic 400a having a top front perspective view of a first channel 410a and a second channel 410b formed on a substrate 402 according to various embodiments. The first channel 410a and the second channel 410b may include thin films including a nanomaterial. For instance, the first channel 410a and the second channel 410b may include carbon nanotube thin films (CNT-TFs) including carbon nanotubes (CNTs). The first channel 410a may have a first end and a second end. A first electrode 412a may be formed on the substrate 402 such that the first end of the first channel 410a is electrically coupled with the first electrode 412a. A second electrode 412b may be formed on the substrate 402 such that the second end of the first channel 410a is electrically coupled with the second electrode 412b. The second channel 410b may have a first end and a second end. A third electrode 412c may be formed on the substrate 402 such that the first end of the second channel 410b is electrically coupled with the third electrode 412c. The second end of the second channel 410b may be electrically coupled to the second electrode 412b. In other words, the first channel 410a and the second channel 410b may share a common second electrode 412b.

The method may include depositing the thin films on the substrate 402. The thin film may be deposited on the substrate 402 using a suitable means such as growing the thin film via chemical vapour deposition. The first channel 410a and/or the second channel 410b may include a random network of nanomaterials such as CNTs. In various embodiments, the CNTs may also be patterned or aligned in parallel to one another to increase the on/off current rations. The electrodes 412a, 412b, 412c may include palladium (Pd). Palladium (Pd) may have ohmic contact to the CNTs and may be easily released from the substrate 402.

The method may further include forming a first electrode 412a, a second electrode 412b and a third electrode 412c on the substrate 402. The first electrode 412a may be a source electrode of a first transistor. The second electrode 412b may be a drain electrode of the first transistor and a second transistor. The third electrode 412c may be a source electrode of the second transistor. In various alternate embodiments, the first electrode 412a may be a drain electrode of the first transistor. The second electrode 412b may be a source electrode of the first transistor and the second transistor. The third electrode 412c may be a drain electrode of the second transistor.

The substrate 402 may be a hard substrate. The substrate 402 may be a semiconducting substrate such as a silicon substrate, a germanium substrate, a quartz substrate etc.

Figure 4B:
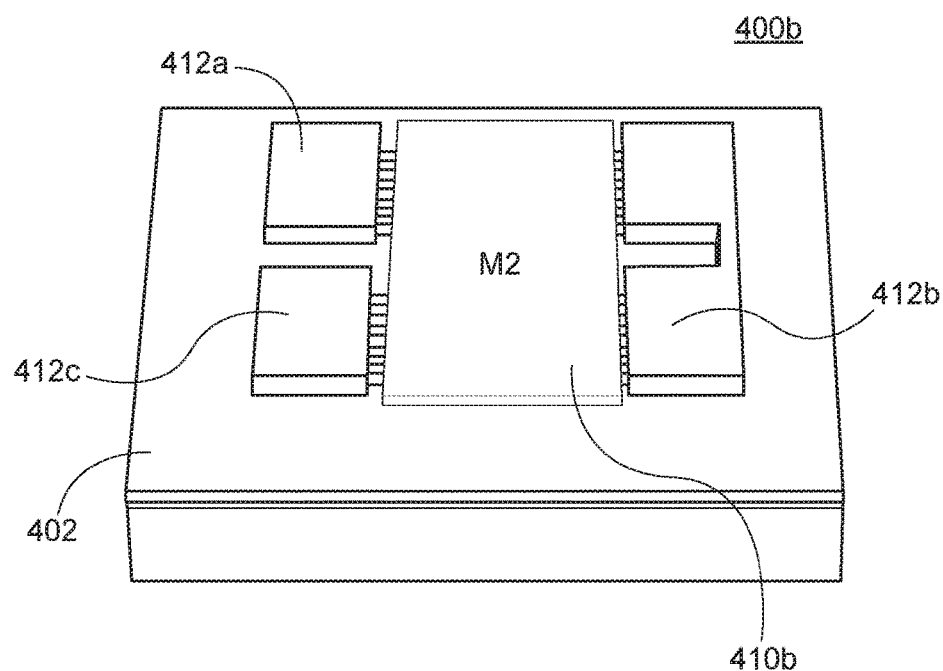

FIG. 4B shows a schematic 400b having a top front perspective view of a contact layer 404 being formed at least partially on the substrate 402 according to various embodiments. The method may include forming a contact layer 404 at least partially on a substrate 402. The nanomaterial may be adhered to the contact layer 404. At least a portion of the first channel 410a and/or the second channel 410b may be between the contact layer 404 and the substrate 402. At least portions of the first channel 410a and/or the second channel 410b may be between the contact layer 404 and the substrate 402 such that the portions of the first channel 410a and/or the second channel 410b are encapsulated by the contact layer 404 and the substrate 402. At least a portion of the contact layer 404 may be on the substrate 402. The method may include a liftoff process. The method may include depositing a photoresist on the substrate 402. The photoresist may cover the first channel 410a and/or the second channel 410b as well as the first electrode 412a, the second electrode 412b and the third electrode 412c. The method may further include a photolithographic process. The method may further include removing a portion of the photoresist to form a trench. The trench may expose a portion of the first channel 410a and/or the second channel 410b. A suitable contact material such as gold (Au) may be deposited into the trench to form the contact layer 404. The contact layer 404 may have a greater adhesion to the device structure such as the first channel 410a and/or the second channel 410b or nanomaterial (of the channel 410a and/or the second channel 410b) than to the substrate 402.

Figure 4C:
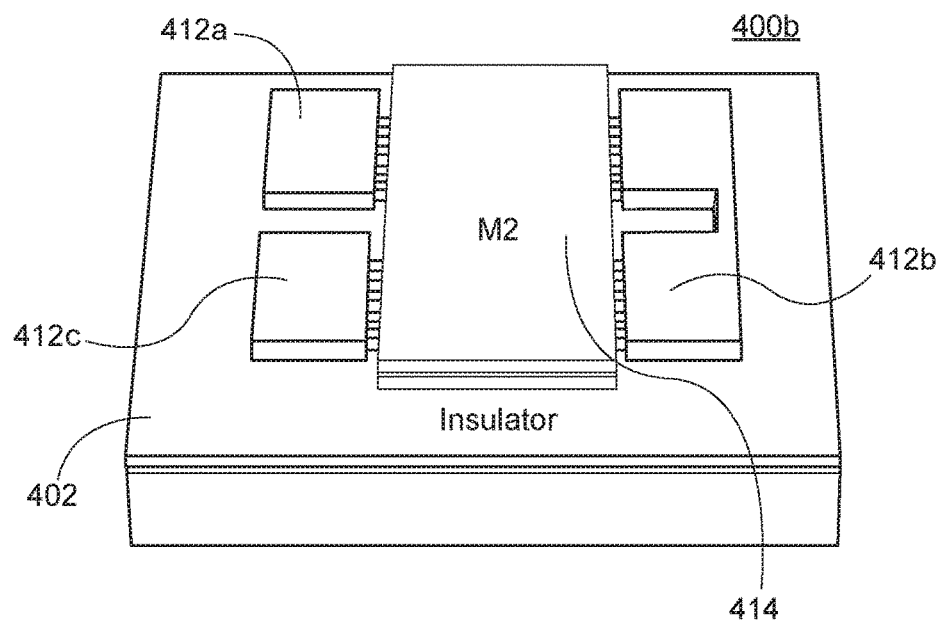

FIG. 4C shows a schematic 400c having a top front perspective view of a dielectric layer 414 formed on the contact layer 404 according to various embodiments. Forming the device structure may include forming the dielectric layer 414 on the contact layer 404. The method may further include depositing a suitable insulating material to the trench to form the dielectric layer 414. The dielectric layer 414 may include metal oxides such as aluminum oxide (AlO), hafnium oxide (HfO) or other oxides.

Figure 4D:
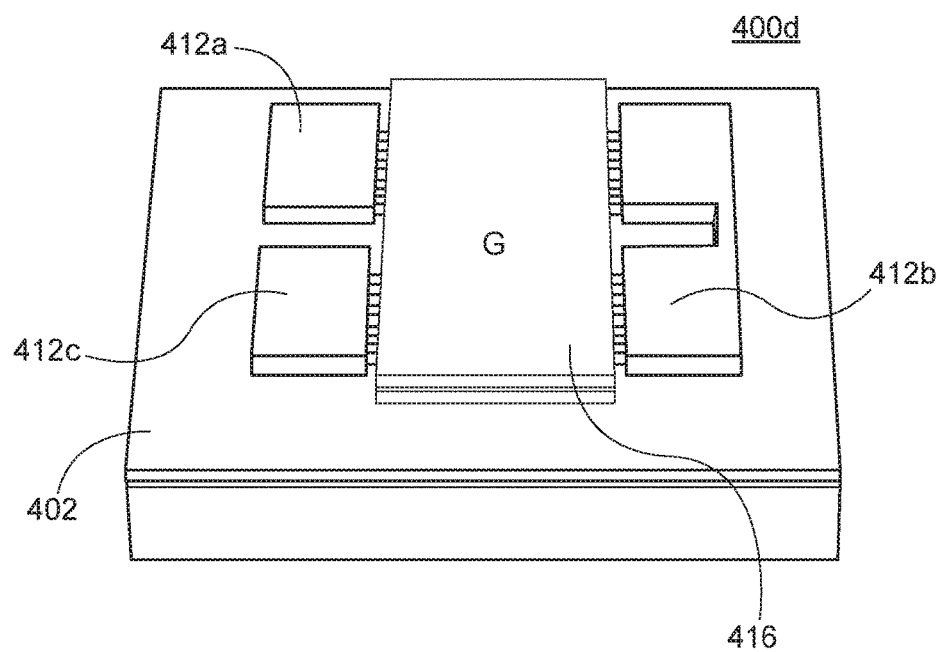

FIG. 4D shows a schematic 400d having a top front perspective view of a gate electrode 416 formed on the dielectric layer 414 according to various embodiments. Forming the device structure may include forming the gate electrode 416 on the dielectric layer 414. The method may include depositing a suitable conductive material (e.g. Pd or any other electrically conductive material) to the trench to form the gate electrode 416. In various embodiments, the deposition of the suitable contact material for forming the contact layer 404, the deposition of the suitable insulating material for forming the dielectric layer 414 and/or the deposition of the suitable conductive material for the gate electrode 416 may be carried out using a suitable deposition technique such as electron beam evaporation, sputtering, chemical vapour deposition or electrochemical means. The method may include removing the photoresist after forming the gate electrode 416. In various alternative embodiments, the method may include an etching process. The method may include depositing the material for contact layer 404 (i.e. the suitable material), the material for dielectric layer 414 (i.e. the suitable insulating material) and the material for gate electrode 416 (i.e. the suitable conductive material)

followed by etching such as chemical etching to define the contact layer 404, the dielectric layer 414 and the gate electrode. The contact layer 404, the dielectric layer 414 and the gate electrode may be defined in a single etching process.

In various embodiments, the method may include forming a device structure at least partially on the contact layer 404. The device structure may include the first electrode 412a, the second electrode 412b, the third electrode 412c, the gate electrode 416, the first channel 410a, the second channel 410b and the dielectric layer 414. The device structure may be responsible for operation of the device. The device structure may include a nanomaterial. The nanomaterial may be adhered to the contact layer 404. As shown in FIG. 4D, the device structure may be or may include a flexible inverter. The device structure may be partially on the contact layer 404. For instance, the dielectric layer 414 may be on the contact layer.

In various embodiments, the device structure may be adhered to the contact layer 404

Figure 4E:
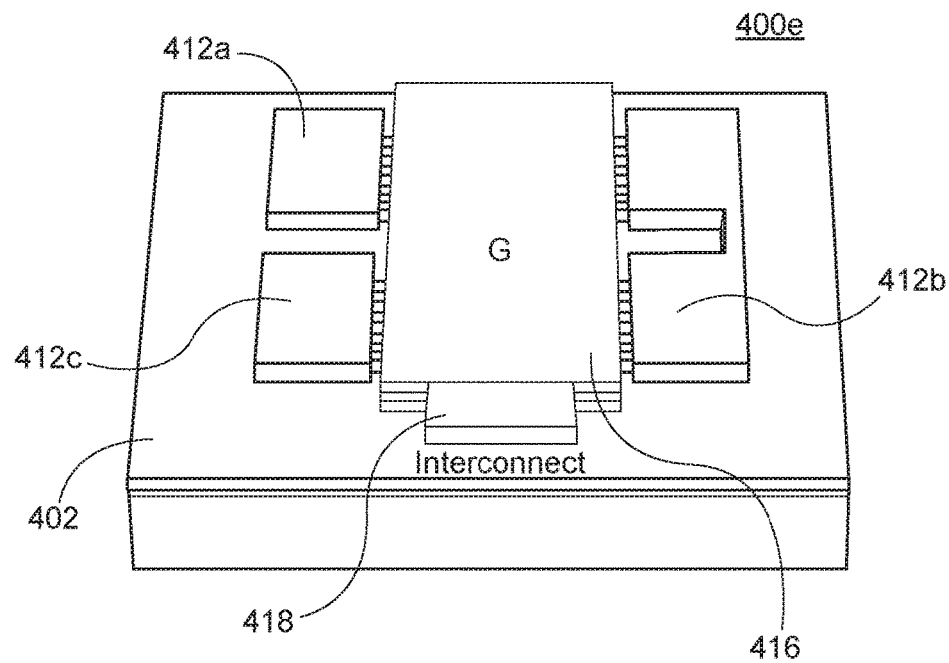

FIG. 4E shows a schematic 400e having a top front perspective view of an interconnect 418 formed on or over the substrate 402 according to various embodiments. The interconnect 418 may electrically couple the gate electrode 416. Subsequent interconnects may electrically couple the first electrode 412a, the second electrode 412b and/or the third electrode 412c.

Figure 4F:
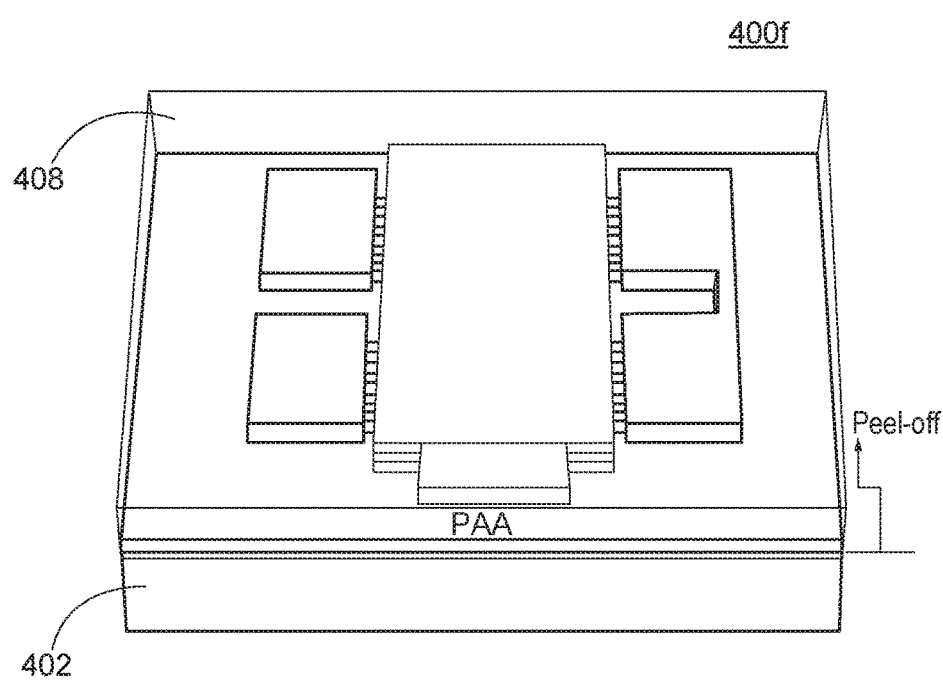

FIG. 4F shows a schematic 400f having a top front perspective view of a transfer medium 408 deposited such that the device structure may be at least be partially covered by the transfer medium 408 according to various embodiments. The transfer medium 408 may be a first material such as polyamic acid (PAA). The transfer medium 408 may include a solution based transfer medium. The method may include depositing the transfer medium 408 such that the device structure is at least partially covered by the transfer medium. In various embodiments, depositing the transfer medium 408 such that the device structure is at least partially covered by the transfer medium 408 includes depositing the transfer medium 408 such that the device structure is encapsulated by the transfer medium 408. Depositing the transfer medium 408 may include spin coating the transfer medium 408 on the device structure. The method may further include solidifying the transfer medium 408. Solidifying the transfer medium 408 may include solidifying the transfer medium 408 such that the transfer medium 408 may bind with the contact layer 404 and/or the device structure. Solidifying the transfer medium 408 may include hot baking the transfer medium 408. Solidifying may include curing the transfer medium 408 at an elevated temperature (for instance, about 110° C.) and for a time duration (for instance, about 4 minutes). Curing may include curing on a hot plate. In various embodiments, solidifying the transfer medium 408 may cause the transfer medium 408, the contact layer 404 and the device structure to form a removable portion. In other words, the removable portion may be configured such that the portion may be removable from the substrate 402 as a single integral piece. The removable portion (i.e. the solidified transfer medium 408, the contact layer 404 and the device structure) may be peeled off as a whole from the substrate 402.

Figure 4G:
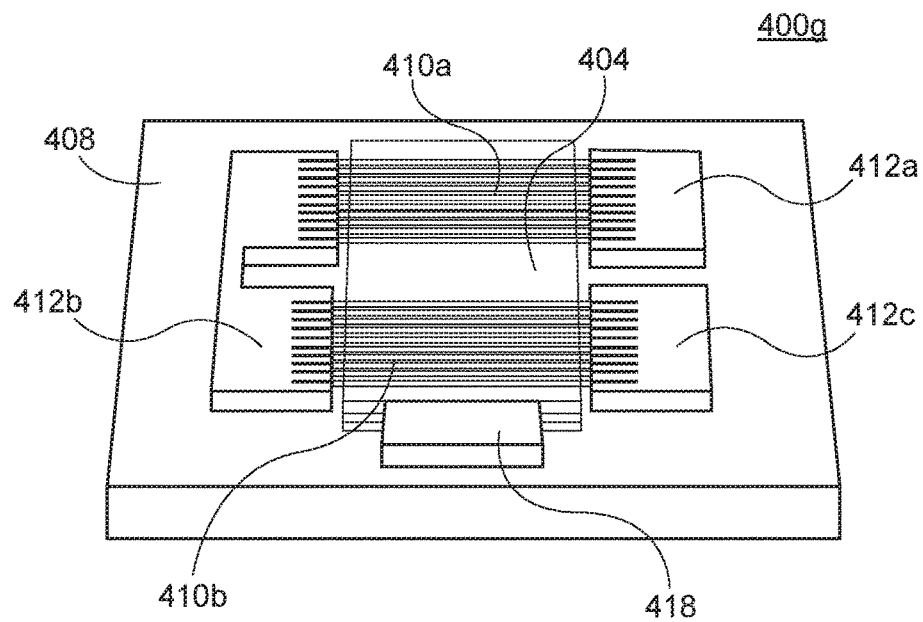

FIG. 4G shows a schematic 400g having a top front perspective view of a removable portion including the transfer medium 408, the contact layer 404 and the device structure according to various embodiments. The method may include separating the contact layer 404, the device structure and the transfer medium 408 from the substrate 402. The contact layer 404, the device structure and the transfer medium 408 may be separated from the substrate 402 in one step. As the contact layer 404 has a greater adhesion to the device structure than to the substrate 402, the removable portion may be easily separated from the substrate. The contacts 412a, 412b and/or the transfer medium 408 may have greater adhesion to (the rest of) the device structure than to the substrate 402.

The method may further include converting the transfer medium 408 from a first material to a second material. In the case in which the first material is polyamic acid, the second material may be polyimide PI. Converting the transfer medium 408 from a first material to a second material may include a thermal imidization process. Converting the transfer medium 408 from a first material to a second material may include thermal annealing at an elevated temperature (for instance about 300° C.) and for a time duration (for instance, about 2 hours). The transfer medium 408 may be thermally annealed in a nitrogen ambient.

Figure 4H:
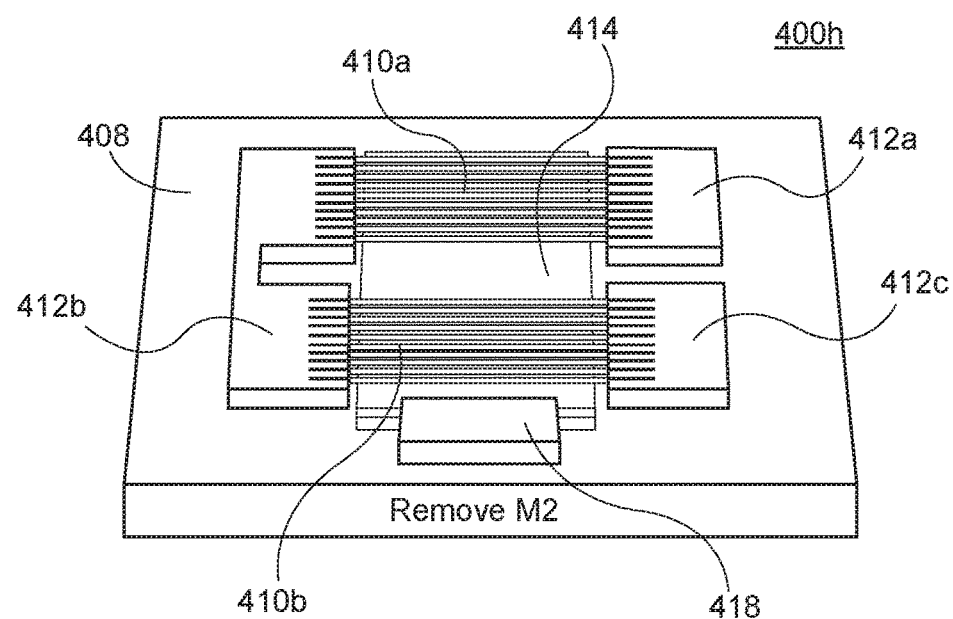

FIG. 4H shows a schematic 400h having a cross sectional side view of a removable portion showing the contact layer 404 being etched away according to various embodiments. One or more of the first electrode 412a, the second electrode 412b, the third electrode 412c, the gate electrode 416, the first channel 410a, the second channel 410b, the interconnect 418, the transfer medium 408 and the dielectric layer 414 may be configured to be resistant to the etchant used for etching away the contact layer 404. The etchant may be a vapour based etchant. Various embodiments may provide that the transfer medium 408 be converted from a first material to a second material, the second material configured to be resistant to the etchant used for etching away the contact layer. The etchant may be Au-5. The contact layer 404 may include gold (Au).

When the first channel 410a and/or the second channel 410b includes a CNT-TF, the surface coverage of CNTs on the contact layer 404 may be low as the density of the CNT-TF is quite low and the diameters of individual CNTs are small (from about 1 nm to about 2 nm). When the removable portion is positioned within the etchant, the CNTs may remain unattacked while the contact layer 404 may be etched.

Figure 4I:
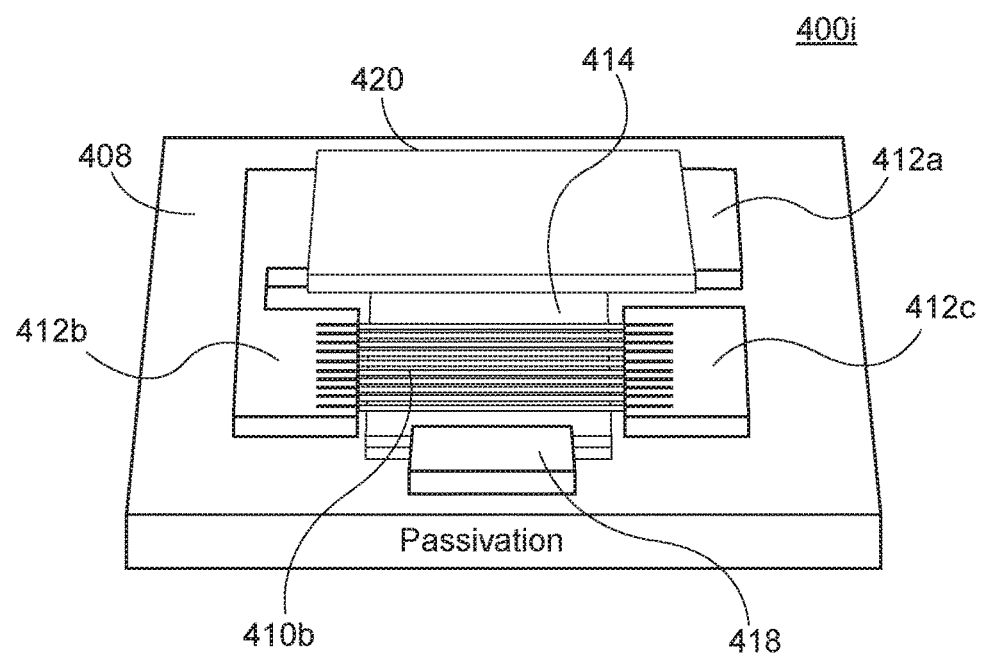

FIG. 4I shows a schematic 400i having a cross sectional side view of the removable portion being passivated to form the device according to various embodiments. The method may further include passivating a part of the removable portion (including the transfer medium 408 and/or the device structure) with a passivation layer 420. The part of the removable portion may include the first channel 410a including the CNT-TFTs. In various embodiments, the first channel 410a may be passivated to obtain n-type CNT-TFTs. Exposure of the second channel 410b to air may result in p-type CNT. The second channel 410b may be exposed to air to obtain p-type CNT-TFTs.

In various embodiments, the method may include exposing the first channel 410a and the second channel 410b to air. The method may further include passivating the first channel 410a, for instance by coating silicon nitride on the first channel 410a. Coating may be carried out using a suitable deposition technique such as plasma enhanced chemical vapour deposition (PECVD) at an elevated temperature (e.g. about 110° C.). The silicon nitride coated may be about 100 nm. The method may further include annealing the first channel 410a prior to passivating the first channel 410a at an elevated temperature (e.g. about 200° C.) for a time duration (e.g. about 1 hour). Annealing may be carried out in a nitrogen ambient. The device formed may be a flexible inverter having a p-type CNT-TFT and an n-type CNT-TFT.

The device may include a device structure. The device may further include a transfer medium 408 at least partially covering the device structure. The device may further include a passivation layer 418 at least partially covering the device structure. The passivation layer 418 may include silicon nitride ($Si_3N_4$). The device structure may include the first electrode 412a, the second electrode 412b, the third electrode 412c, the gate electrode 416, the first channel 410a, the second channel 410b and the dielectric layer 414. The first channel 410a may have a first end and a second end. The second channel 410b may have a first end and a second end. Each of the first channel 410a and the second channel 410b may have a length and a perimeter. The length may extend from the first end to the second end. The area enclosed by the perimeter of the first channel 410a may be substantially perpendicular to the length of the first channel 410a. The area enclosed by the perimeter of the first channel 410b may be substantially perpendicular to the length of the first channel 410b. The first channel 410a may be between the first electrode 412a and the second electrode 412b. The second channel 410b may be between the second electrode and the third electrode 412c. The dielectric layer 414 may be along the first channel 410a and/or second channel 410b. The gate electrode 416 may be on the dielectric layer 414. The first channel 410a and/or second channel 410b may be separated from the gate electrode 416 by the dielectric layer 414. In various embodiments, the passivation layer 420 may cover the entire perimeter of the first channel 410a on at least a portion along the length of the first channel 410a. In other words, the first channel 410a may have a portion along the length of the first channel 410a which is completely surrounded by the passivation layer 420. In various embodiments, the device may be a flexible inverter having a p-type CNT-TFT and an n-type CNT-TFT. The passivation layer 420 may cover the n-type CNT-TFT.

Figure 5A:
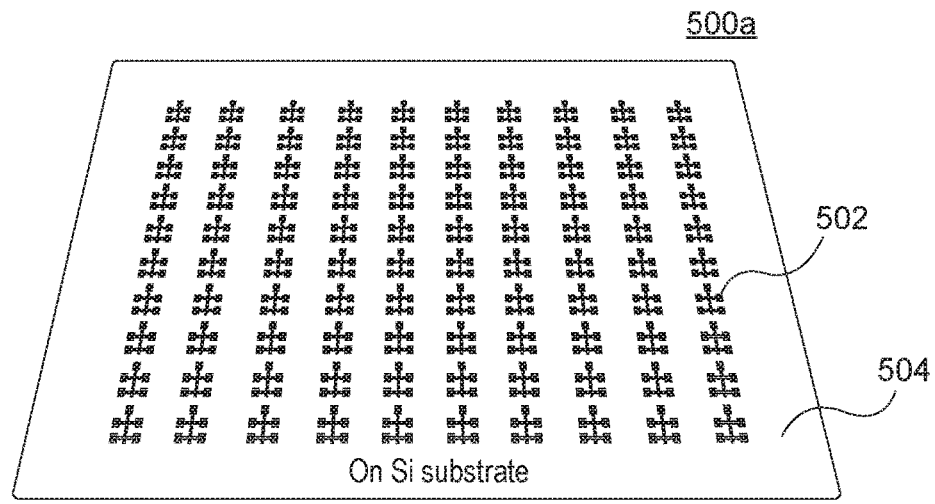
FIG. 5A shows a photo of a device structure formed over a substrate according to various embodiments.
Figure 5B:
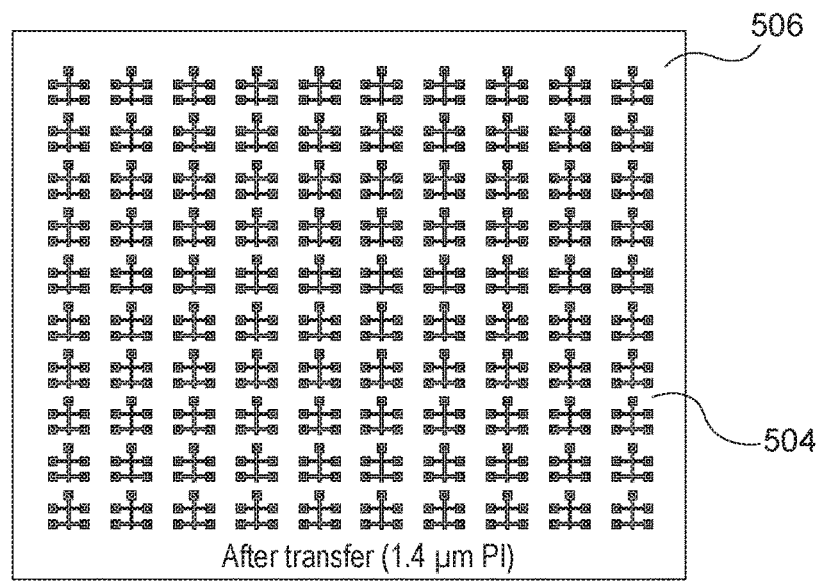
FIG. 5B shows a photo of the device structure (together with underlying contact layer) at least partially covered by a transfer medium to form a removable portion according to various embodiments.
Figure 5C:
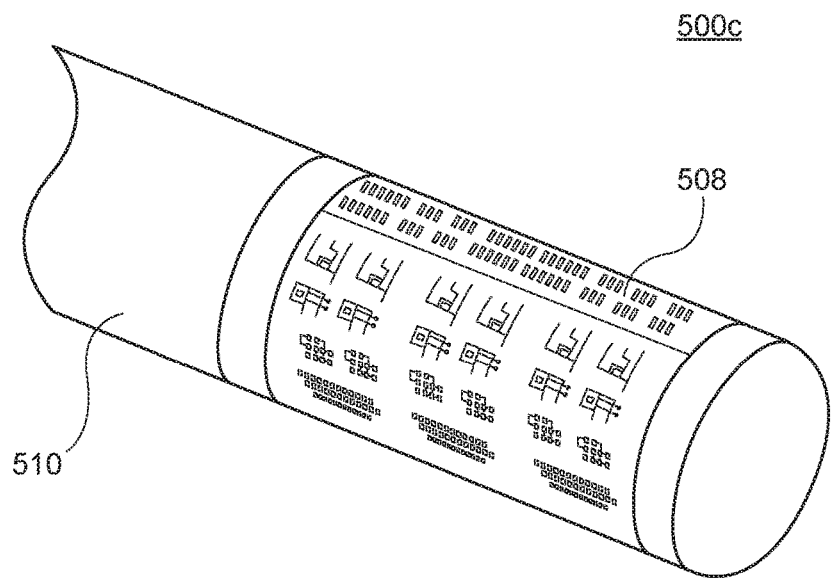
FIG. 5C shows a photo of a device according to various embodiments on a cylindrical tube.
Figure 5D:
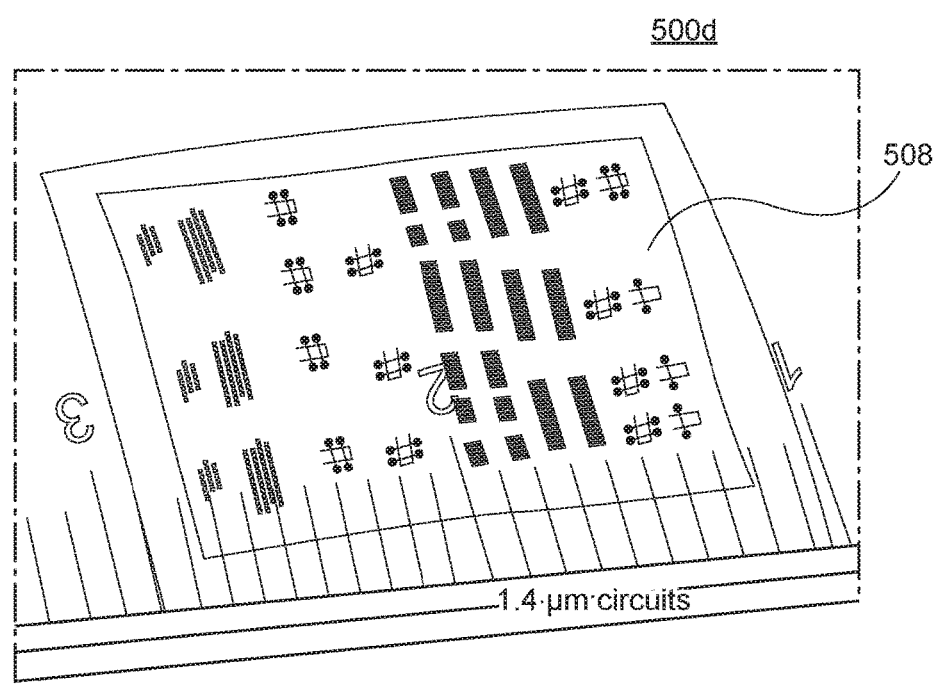
FIG. 5D and FIG. 5E show a photo of the device according to various embodiments in FIG. 5C when unrolled.
Figure 5E:
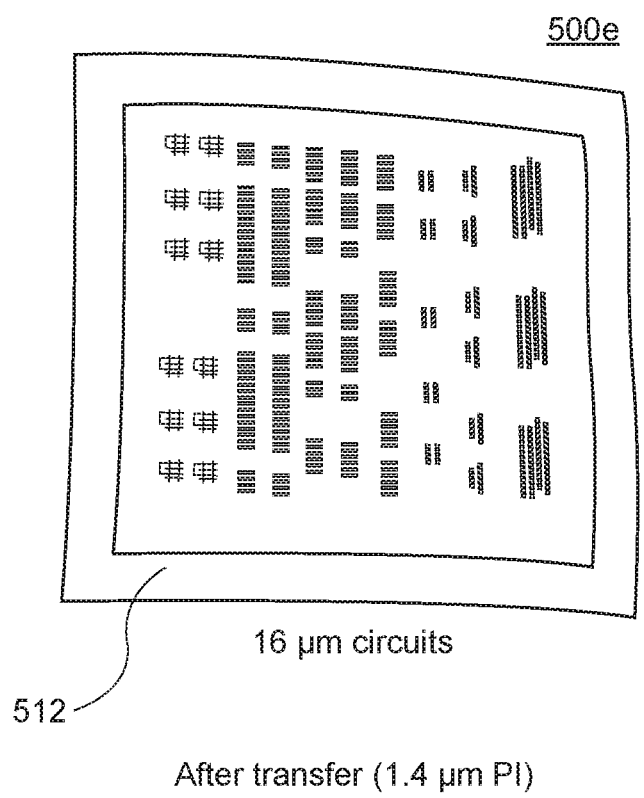

Various embodiments may provide a device including one or more of NOR, NAND, OR and AND logic gates. FIG. 5A shows a photo 500a of a device structure 502 formed over a substrate 504 according to various embodiments. FIG. 5B shows a photo 500b of the device structure 502 (together with underlying contact layer) at least partially covered by a transfer medium 506 to form a removable portion according to various embodiments. The removable portion may be formed after covering the device structure 502 (together with underlying contact layer) in FIG. 5A with the transfer medium 506 and peeling off the removable portion including the device structure 502, the contact layer and the transfer medium 506 from the substrate 502 in FIG. 5A. FIG. 5C shows a photo 500c of a device 508 according to various embodiments on a cylindrical tube 510. The device 508 may be formed by etching away the contact layer from the removable portion in FIG. 5B. FIG. 5D shows a photo 500d of the device 508 according to various embodiments in FIG. 5C when unrolled. The device 508 may include a circuit arrangement. The device 508 may be 1.4 μm thick. FIG. 5E shows a photo 500e of another device 512. The device 512 maybe 16 μm thick. The thickness of the devices may be the thickness of the encapsulation layer of the devices.

FIG. 6 shows a plot 600 of the drain to source current ($I_{DS}$) as a function of the potential difference between the gate and the source ($V_{GS}$) of a CNT-TFT according to various embodiments. Lines 602, 604, 606, 608 show the $I_{DS}$-$V_{GS}$ characteristics of a p-type CNT-TFT when the potential difference between the drain and source ($V_{DS}$) is 0.05V, 0.1V, 0.3V and 0.5V respectively. Lines 612, 614, 616, 618 show the $I_{DS}$-$V_{GS}$ characteristics of an n-type CNT-TFT when the potential difference between the drain and source ($V_{DS}$) is 0.05V, 0.1V, 0.3V and 0.5V respectively. The n-type and p-type of devices have comparable on and off conductances. The carrier mobility may be as high as about 80 $cm^2V^{-1}s^{-1}$, with a typical value of about 70 $cm^2V^{-1}s^{-1}$. The subthreshold slopes may be as low as about 130 $mVdec^{-1}$, with a typical value of about 200 $mVdec^{-1}$. The operating gate voltage may be less than 4V. The on/off ratios may be larger than $10^4$. The TFTs may exhibit a superior performance compared to conventional organic transistors, which have a mobility of about 1.6 to about 4.2 $cm^2V^{-1}s^{-1}$ and on/off ratios of about 4 to 5 digits. The TFTs may also exhibit better performance than amorphous silicon field effect transistors (FETs), which have a mobility less than 1 $cm^2V^{-1}s^{-1}$. The TFTs may have comparable performance to p-channel polycrystalline silicon thin film transistors, which may have a mobility of about 74 to about 108 $cm^2V^{-1}s^{-1}$ as well as a channel length of about 10 μm.

Figure 7A:
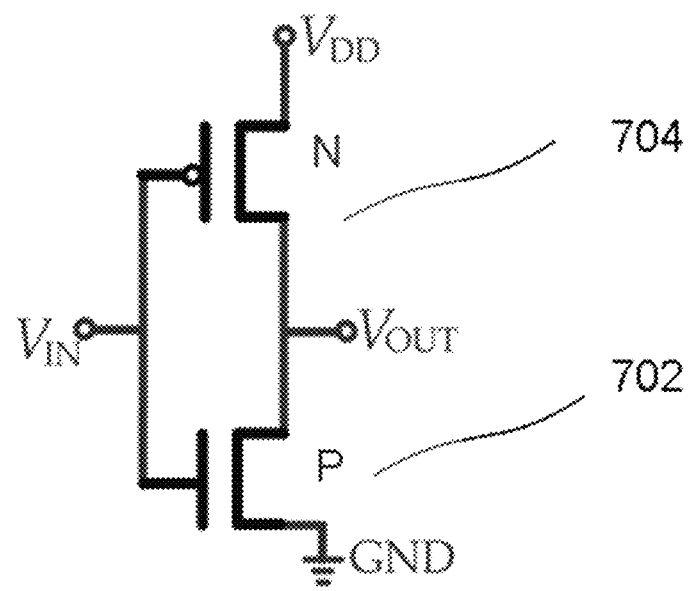
FIG. 7A shows a circuit arrangement diagram of an inverter constructed from an n-type CNT-TFT and a p-type CNT-TFT according to various embodiments.
Figure 7B:
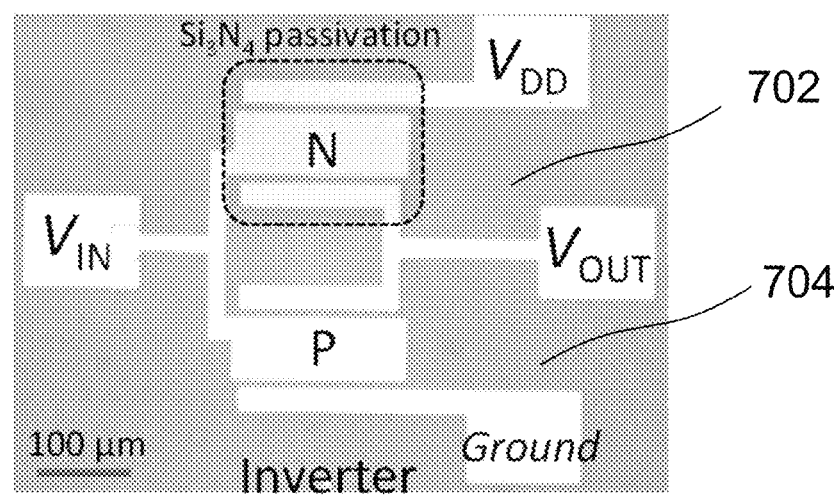
FIG. 7B shows an optical micrograph of the inverter according to various embodiments shown in FIG. 7A.
Figure 7C:
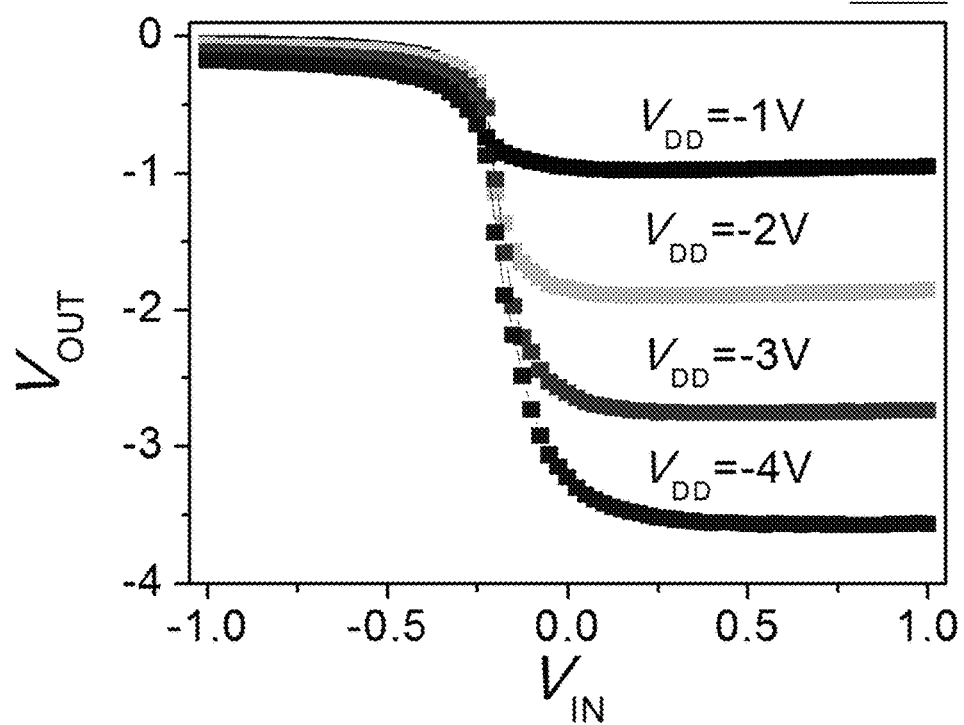
FIG. 7C is a graph showing the input output characteristic of the inverter according to various embodiments shown in FIG. 7A and FIG. 7B.
Figure 7D:
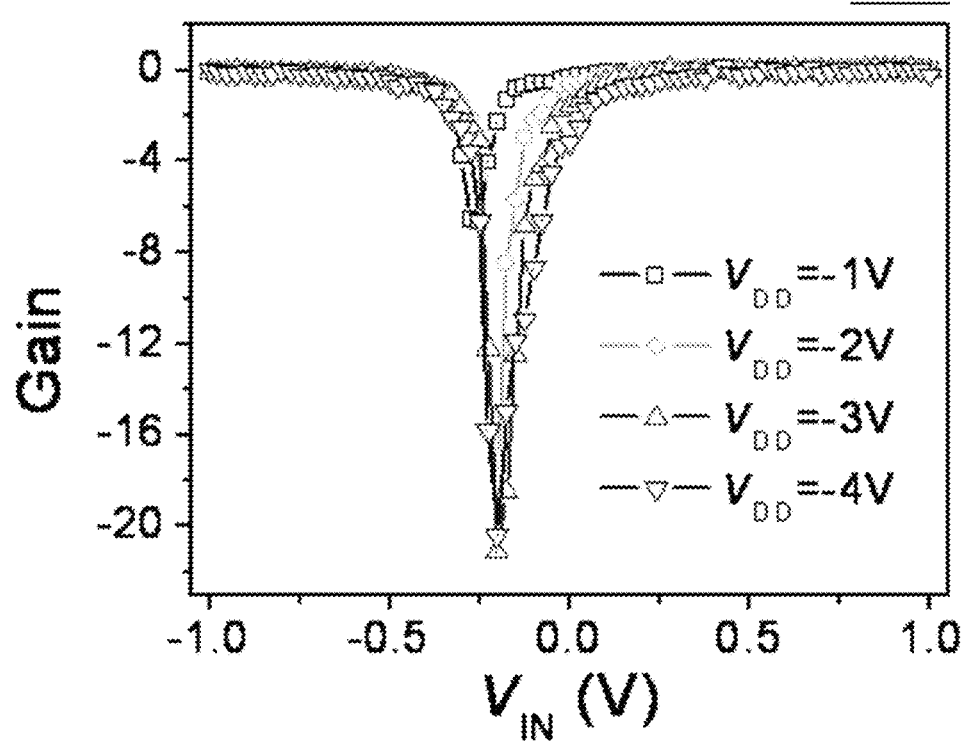
FIG. 7D is a graph showing the gain characteristics of the inverter according to various embodiments shown in FIG. 7A and FIG. 7B.

FIG. 7A shows a circuit arrangement diagram 700a of an inverter constructed from a p-type bottom gated CNT-TFT 702 and a n-type bottom gated CNT-TFT 704 according to various embodiments. FIG. 7B shows an optical micrograph 700b of the inverter according to various embodiments shown in FIG. 7A. The inverter includes an p-type bottom gated CNT-TFT 702 and a n-type bottom gated CNT-TFT 704 according to various embodiments. FIG. 7C is a graph 700c showing the input output characteristic of the inverter according to various embodiments shown in FIG. 7A and FIG. 7B. FIG. 7D is a graph 700d showing the gain characteristics of the inverter according to various embodiments shown in FIG. 7A and FIG. 7B. The inverter exhibits well-defined static voltage transfer characteristics and a maximum voltage gain of 22 at a supply voltage ($V_{DD}$) of about −3 V. The two logic states of "1" and "0" shown in the output characteristic are about $V_{DD}$ and about 0 V, respectively, suggesting that one of the two CNT-TFTs is fully 'on' and the other is fully 'off' in each logic cycle. Thus, only a very small current passes through the inverter. In other words, this inverter functions with very small static power dissipation. The inverter shows good noise immunity with a transition-region width of <0.5 V, and a high logic swing which enables it to drive the subsequent logic gates without losing logic integrity.

Figure 8B:
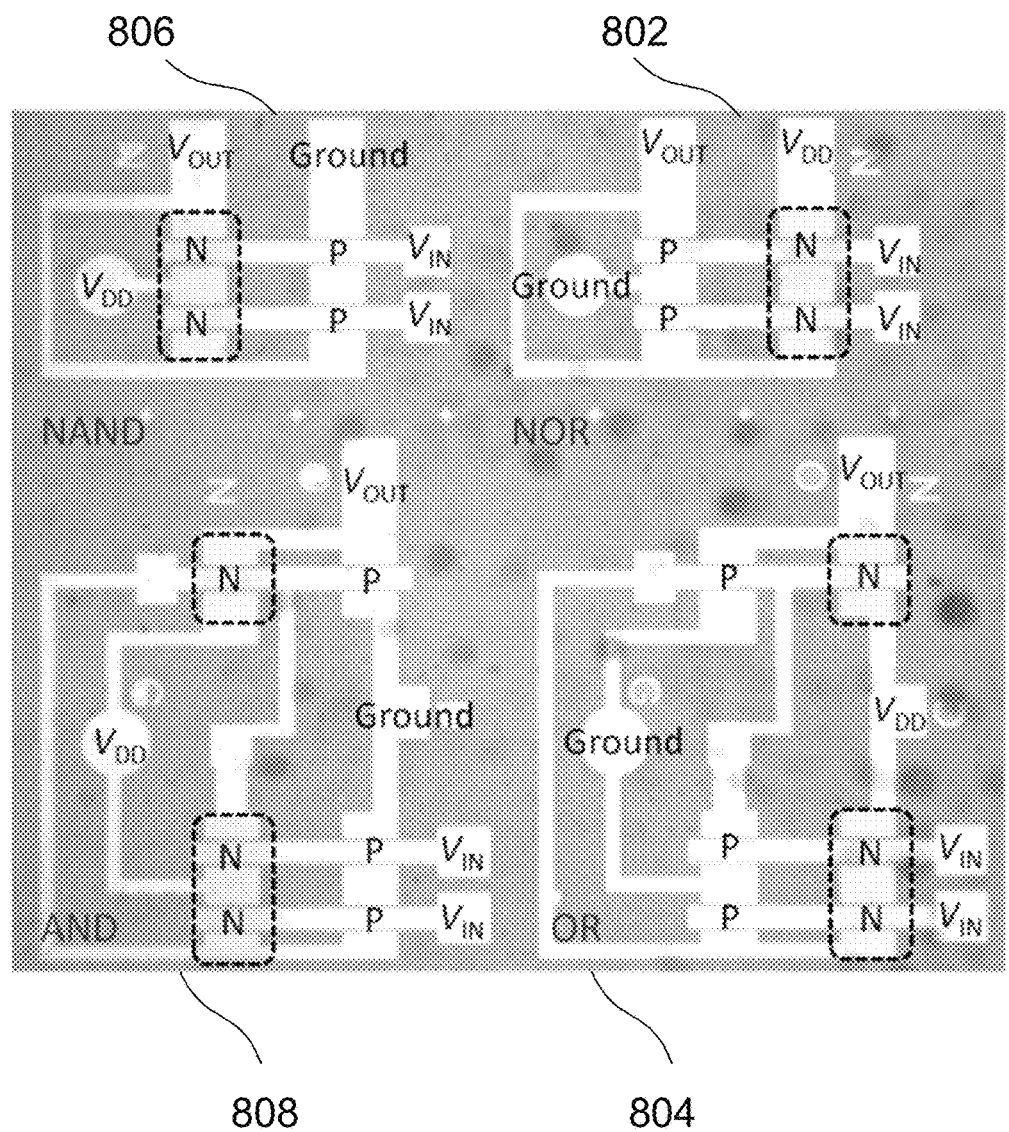
FIG. 8B shows an optical micrograph of the NOR gate, the OR gate, the NAND gate and the AND gate according to various embodiments shown in FIG. 8A.

FIG. 8A is a schematic 800a showing circuit arrangement diagram of an NOR gate 802, circuit arrangement diagram of an OR gate 804, circuit arrangement diagram of an NAND gate 806 and circuit arrangement diagram of an AND gate 808 according to various embodiments. FIG. 8B shows an optical micrograph 800b of the NOR gate 802, the OR gate 804, the NAND gate 806 and the AND gate 808 according to various embodiments shown in FIG. 8A.

The NOR gate 802 may be obtained by coupling two p-TFTs (p-type TFTs) in parallel and two n-TFTs (n-type TFTS) in series. The OR gate 804 may be obtained by coupling the output of the NOR gate 802 to the input of an inverter. The OR gate 804 may include six CNT TFTs. Correspondingly, the NAND gate 806 may be obtained by coupling two n-TFTs in parallel and two p-TFTs in series. The AND gate 808 may be obtained by coupling the output of the NAND gate 806 to the input of an inverter. The AND gate 808 may include six CNT TFTs.

The n-type and p-type CNT-TFTS may be arranged along two parallel partitions so that the passivation layer may be selectively deposited onto one of the partitions. The NOR gate 802 may be changed to the NAND gate 806, vice versa, by swapping the n-TFTs with p-TFTs and swapping the p-TFTs with n-TFTs. Similarly, the OR gate 804 may be changed to the AND gate 808, vice versa, by swapping the n-TFTs with p-TFTs and swapping the p-TFTs with n-TFTs.

Figure 8C:
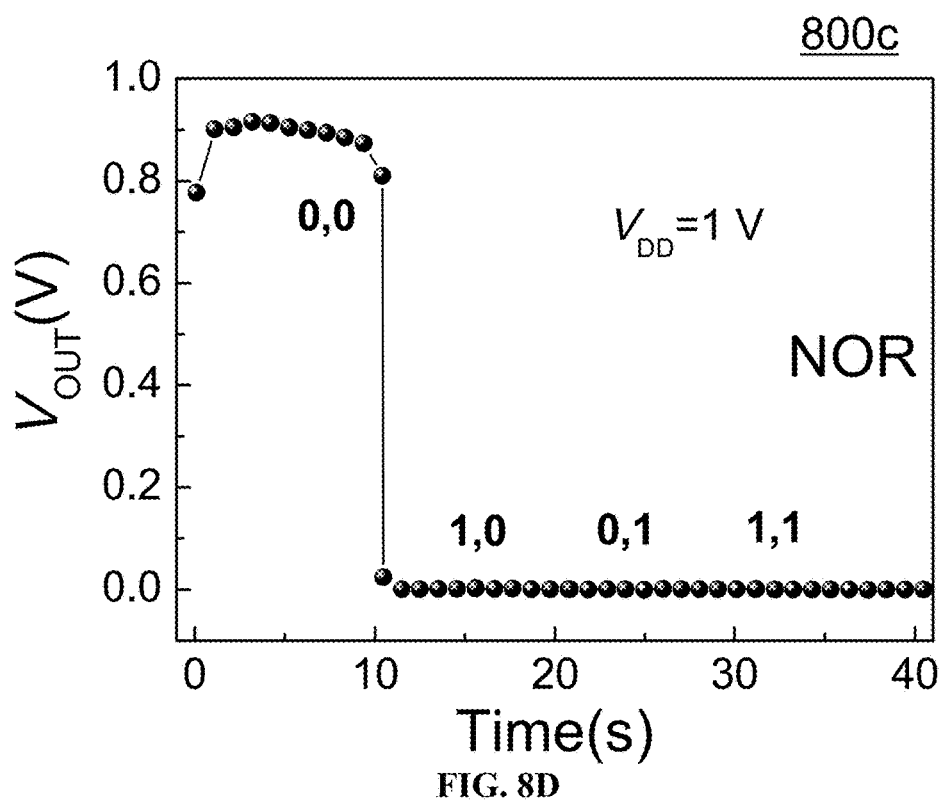
FIG. 8C is a graph showing the output characteristics of a device including an NOR gate according to various embodiments.
Figure 8D:
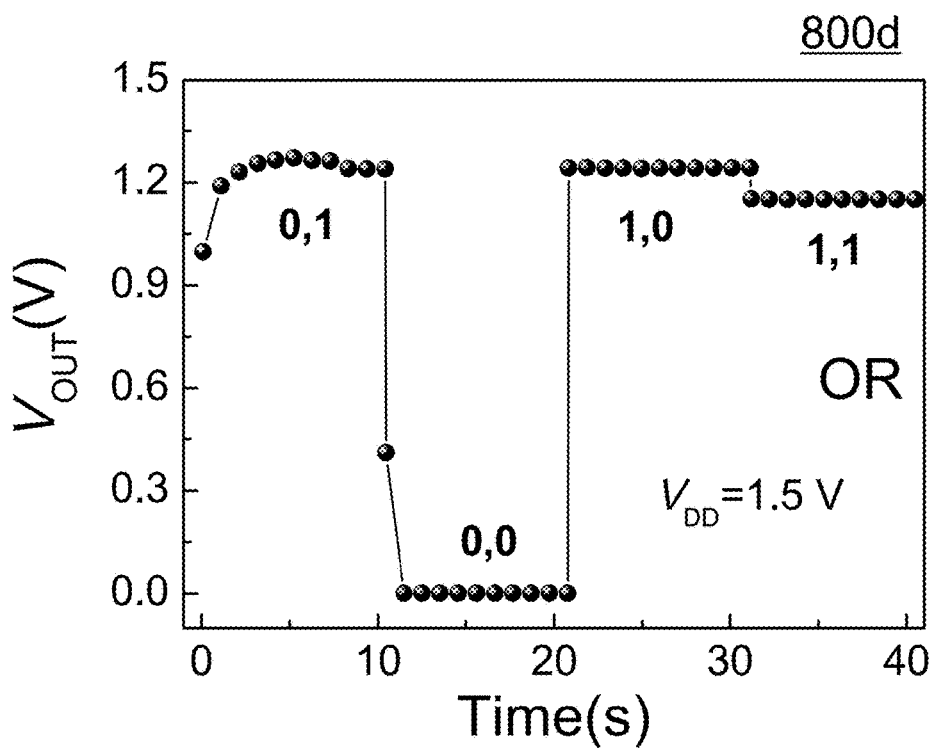
FIG. 8D is a graph showing the output characteristics of a device including an OR gate according to various embodiments.
Figure 8E:
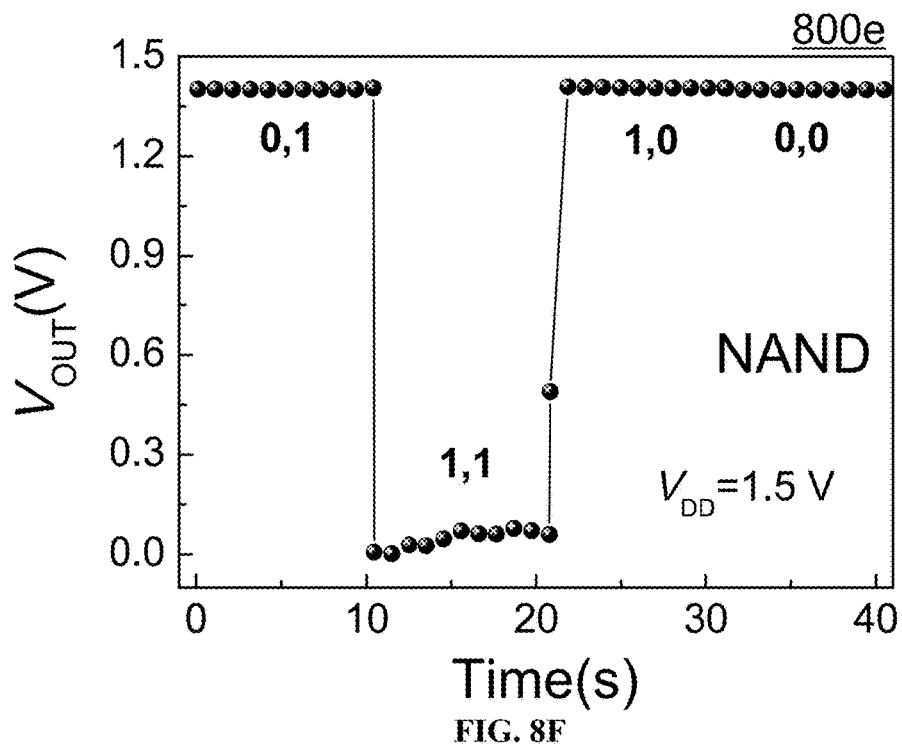
FIG. 8E is a graph showing the output characteristics of a device including an NAND gate according to various embodiments.
Figure 8F:
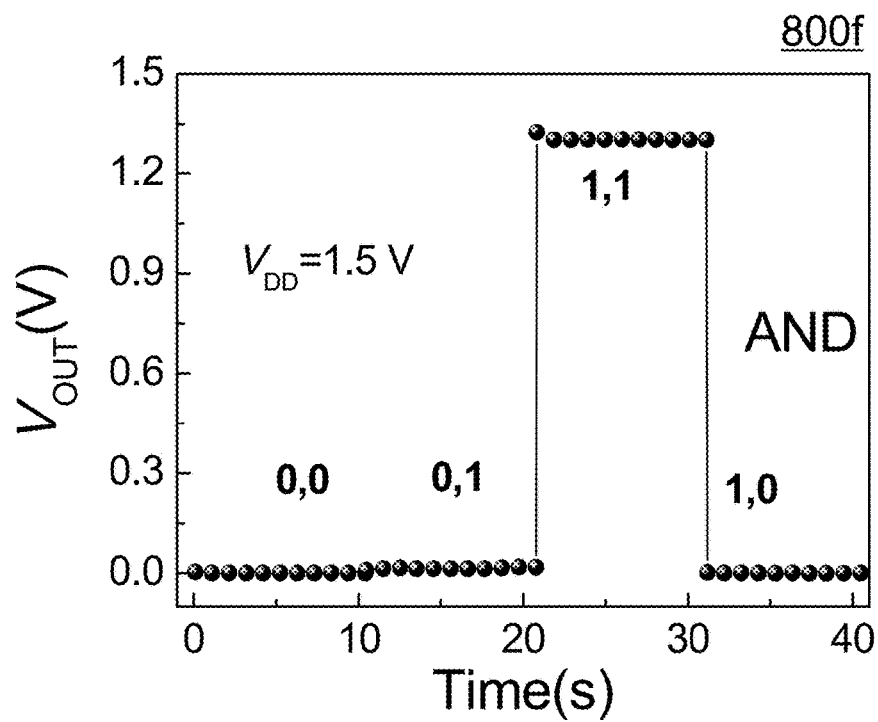
FIG. 8F is a graph showing the output characteristics of a device including an AND gate according to various embodiments.

FIG. 8C is a graph 800c showing the output characteristics of a device including an NOR gate according to various embodiments. FIG. 8D is a graph 800d showing the output characteristics of a device including an OR gate according to various embodiments. FIG. 8E is a graph 800e showing the output characteristics of a device including an NAND gate according to various embodiments. FIG. 8F is a graph 800f showing the output characteristics of a device including an AND gate according to various embodiments.

Input voltages of about 2V may represent logic state 1 while input voltages of about −2V may represent logic state 0. For the NOR gate, an output voltage of about 0V (logic 0 state) is obtained when one or both inputs are applied with voltages of about 2V. An output voltage of about 0.91 V (logic 1 state) is obtained, when inputs are applied with voltages of about −2V.

Figure 9A:
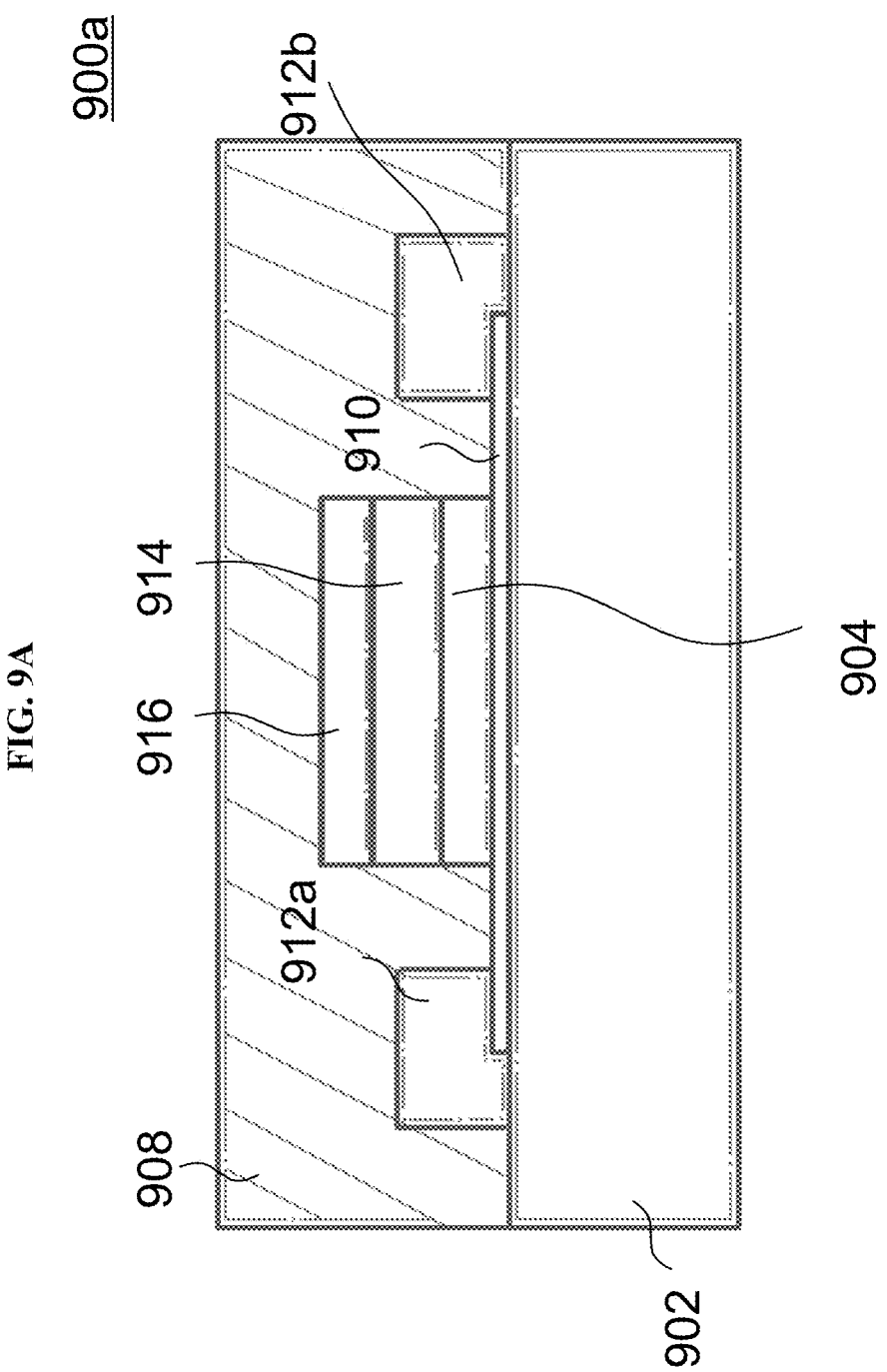

FIGS. 9A to 9F show a method for forming a device according to various embodiments. The device may be a sensor such as a pressure sensor. The device may alternatively be a sensor array such as a pressure sensor array. FIG. 9A shows a schematic 900a having a cross sectional side view of an intermediate structure formed on a substrate 902 according to various embodiments. The intermediate structure may include a contact layer 904 formed at least partially on the substrate 902. The intermediate structure may further include a device structure at least partially on the contact layer 904. The device structure may include a transistor such as a MOSFET. The device structure may include a channel 910. The channel 910 may include a thin film including a nanomaterial. For instance, the channel 910 may include a carbon nanotube thin film (CNT-TF) including carbon nanotubes (CNTs). In various alternate embodiments, the channel 910 may include silicon nanowire thin film including silicon nanowires. The channel 910 may have a first end and a second end. A first electrode 912a may be formed on the substrate 902 such that the first end of the channel 910 is electrically coupled with the first electrode. A second electrode 912b may be formed on the substrate 902 such that the second end of the channel 910 is electrically coupled with the second electrode. In other words, the nanomaterial may form a channel 910 having a first end and a second end. The first end may be electrically coupled to a first electrode 912a and the second end may be electrically coupled to a second electrode 912b.

The device structure may further include a dielectric layer 914 on the contact layer 904. The device structure may further include a gate electrode layer 916 on the dielectric layer 914. The intermediate structure may also include a transfer medium 908 at least covering the device structure. The method may include solidifying the transfer medium 908 from a first material (e.g. polyamic acid) to a second material (e.g. polyimide). Methods to form the structure shown in FIG. 9A may include methods illustrated in FIGS. 3A to 3E.

Figure 9B:
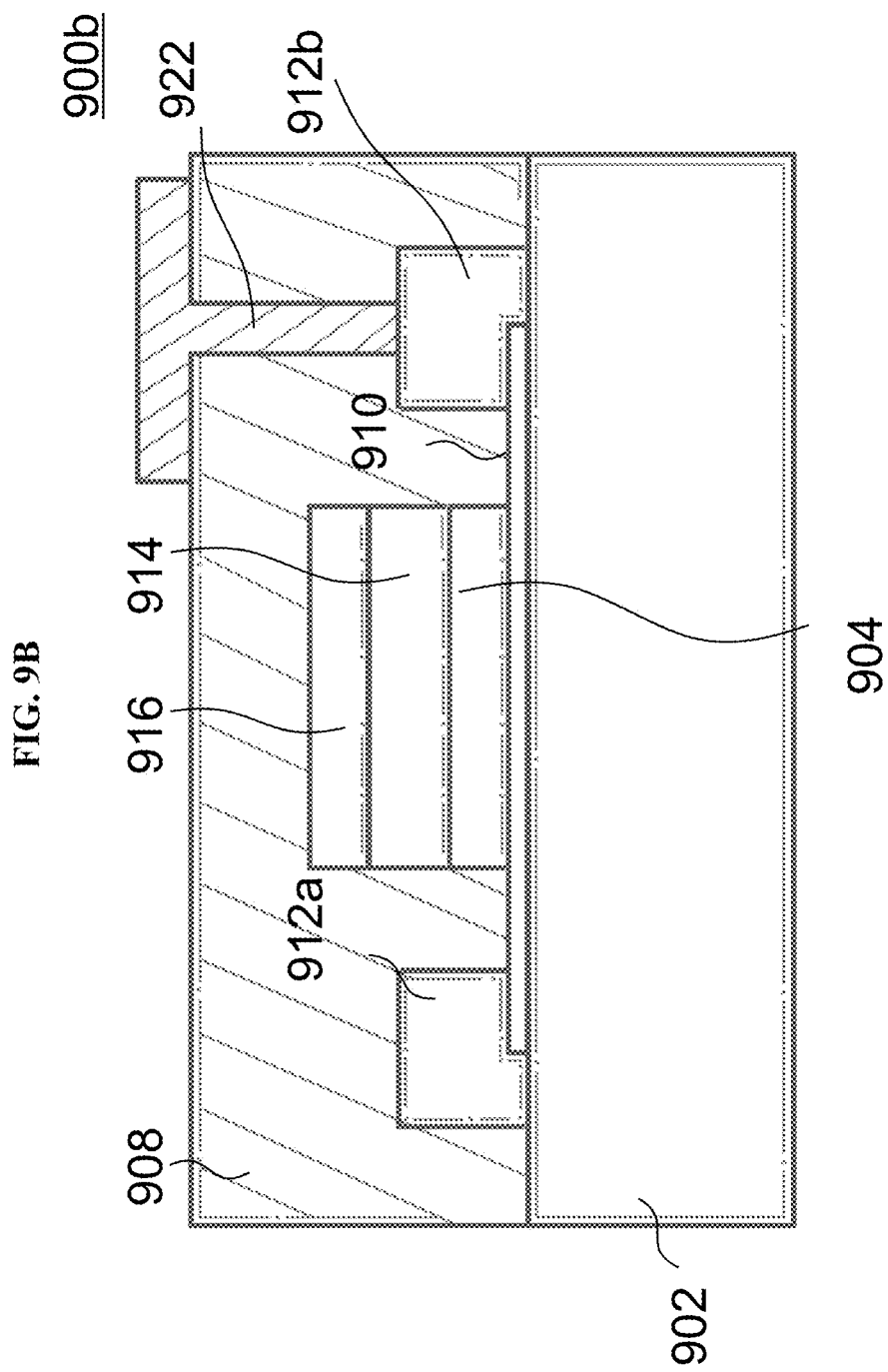

FIG. 9B shows a schematic 900b having a cross sectional side view of a conductive via 922 formed on the intermediate structure according to various embodiments shown in FIG. 9A. The method may include forming an electrically conductive via 922 on the transfer medium 908 to electrically couple to the device structure. The electrically conductive via 922 may be formed after solidifying the transfer medium 908. The electrically conductive via 922 may be formed to electrically couple to a part of the device structure such as the second electrode 912b shown in FIG. 9B. In various other embodiments, the electrically conductive via 922 may be formed to electrically couple to the first electrode 912a. Forming the electrically conductive via 922 on the transfer medium may include forming a hole on the transfer medium. Forming a hole may include etching such as oxygen plasma etching. The hole may expose the device structure or the portion of the device structure such as the first electrode 912a or the second electrode 912b. Forming the electrically conductive via 922 on the transfer medium may further include depositing a suitable conductive material such as a metal in the hole. The suitable conductive material may extend beyond the hole onto a surface of the transfer medium 908. In other words, the electrically conductive via 922 may include a conductive plate, the conductive plate formed by the extension of the conductive material deposited in the hole onto the surface of the transfer medium 908.

Figure 9C:
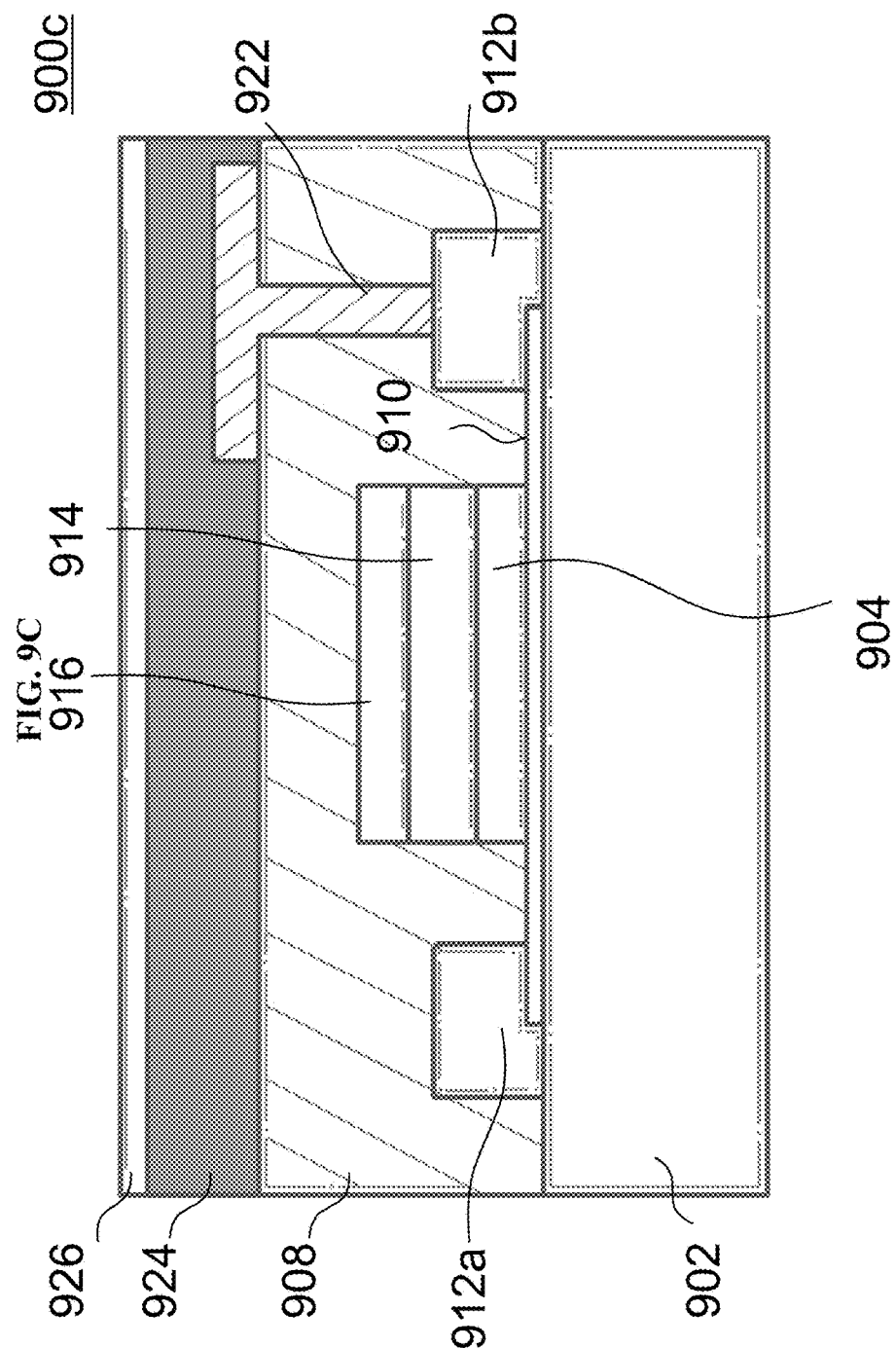

FIG. 9C shows a schematic 900c having a cross sectional side view of an electrical structure formed on the intermediate structure according to various embodiments. The method may include arranging an insulating element 924 (e.g. a pressure sensitive rubber sheet) such that the insulating element 924 is at least partially on a portion of the electrically conductive via 922 (e.g. the conductive plate formed by the extension of the conductive material deposited in the hole onto the surface of the transfer medium 908). The insulating element 924 may be laminated at least partially on the portion of the conductive via 922. The method may further include arranging a metal electrode 926 (e.g. a metallic foil) on the insulating material 924 such that the metal electrode 926 and the electrically conductive via 922 forms an electrical structure. The electrical structure may be a resistive structure or a capacitive structure.

Figure 9D:
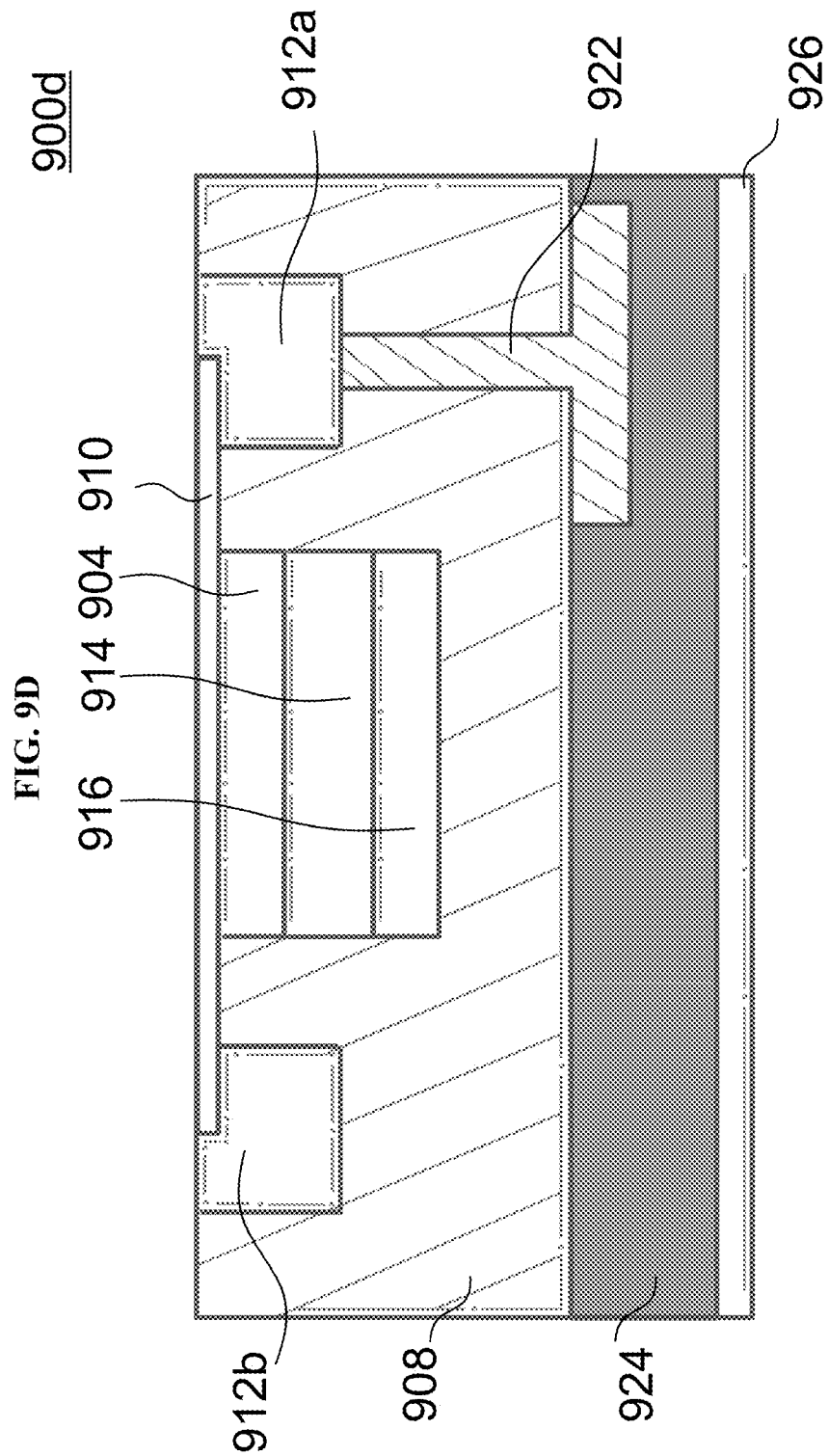

FIG. 9D shows a schematic 900c having a cross sectional side view of a removable portion being separated from the substrate 902 according to various embodiments. The removable portion may include the contact layer 904, the device structure and the transfer medium 908. The device structure may include the transistor as shown in FIG. 9A. The device structure may further include the electrical structure (including the metal electrode, the insulating element 924 and the electrically conductive via 922). The method may include separating the removable portion from the substrate 902. In other words, the method may include separating the contact layer 904, the device structure and the transfer medium 908 from the substrate 902. The contact layer 904, the device structure and the transfer medium 908 may be separated as one integral piece from the substrate 902. The removable portion may be arranged (e.g. pasted) on a supporting substrate. The removable portion may be arranged on the supporting substrate such that the contact layer is on a side of the removable portion facing away from the supporting substrate.

Figure 9E:
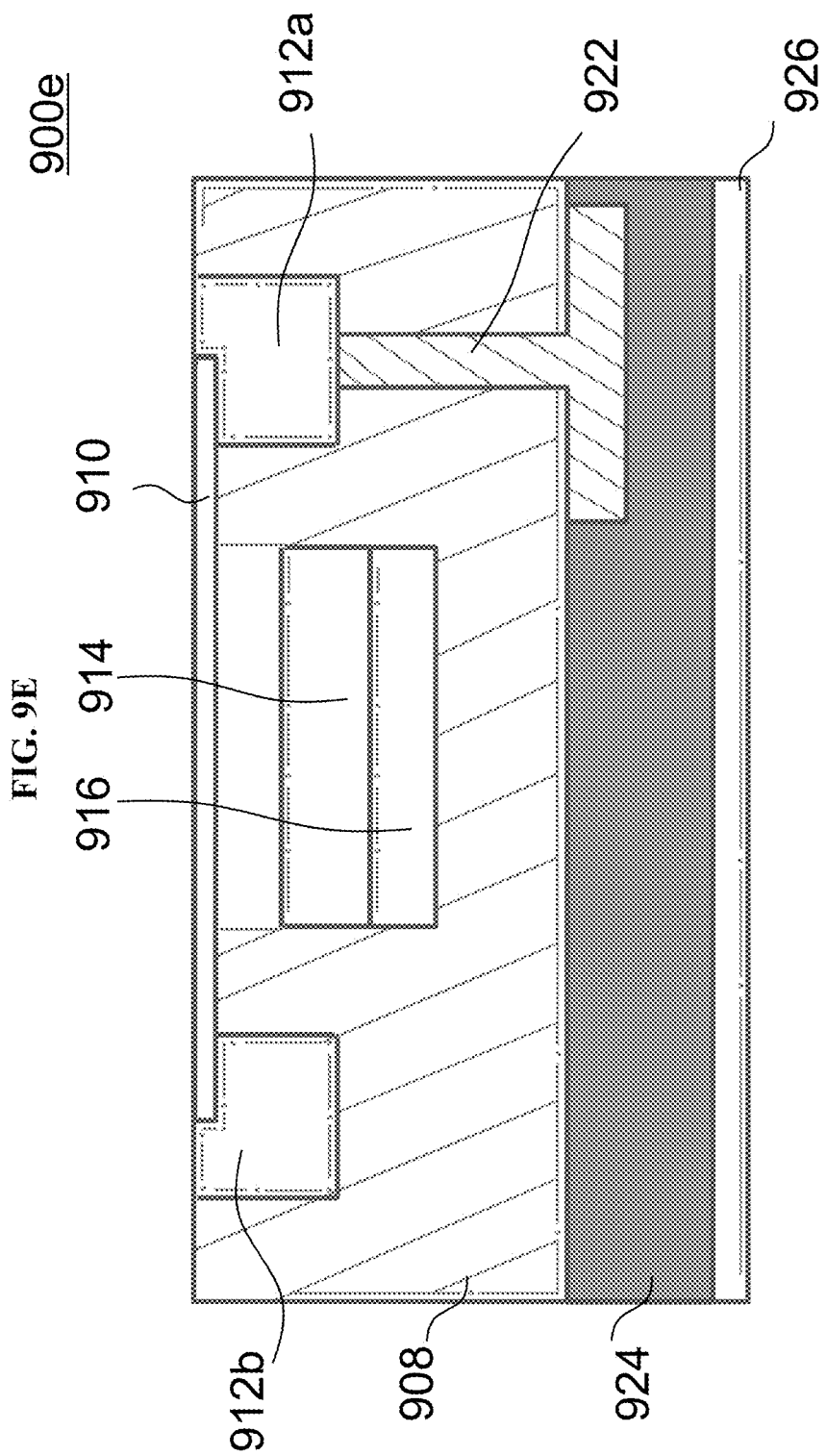

FIG. 9E shows a schematic 900e having a cross sectional side view of the removable portion with the contact layer 904 being etched away according to various embodiments. The contact layer may be etched away by a suitable etchant (e.g. a vapour based etchant). The device structure may be configured such that the at least a portion of the device structure is resistant to the etchant. The transfer medium 908 may be configured such that the transfer medium 908 is resistant to the etchant.

Figure 9F:
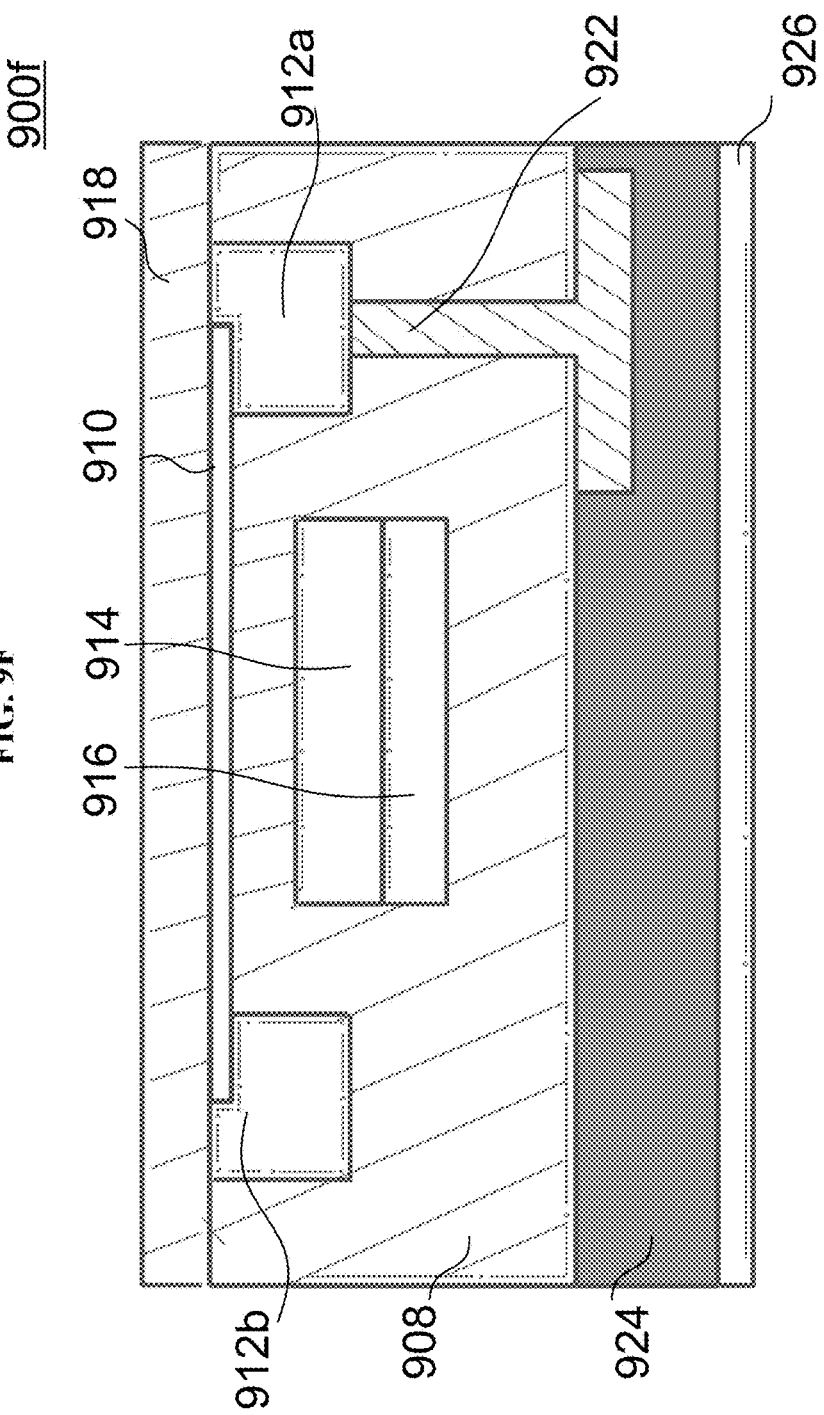

FIG. 9F shows a schematic 900f having a cross sectional side view of the device according to various embodiments. The method may further include passivating a part of the removable portion (including the transfer medium 908 and/or the device structure) with a passivation layer 918. The part of the removable portion may include the channel 910 including the CNT-TFTs. The device may be adhered to an object for detection of pressure distribution.

The device may include a device structure. The device may also include a transfer medium 908 at least partially covering the device structure. The device may further include a passivation layer 918 at least partially covering the device structure. The passivation layer 918 may include silicon nitride ($Si_3N_4$). The device structure may include the first electrode 912a, the second electrode 912b, the gate electrode 916, the channel 910 and the dielectric layer 914. The channel 910 may have a first end and a second end. The channel 910 may have a length and a perimeter. The length may extend from the first end to the second end. The area enclosed by the perimeter of the channel 910 may be substantially perpendicular to the length of the channel 910. The channel 910 may be between the first electrode 912a and the second electrode 912b. The dielectric layer 914 may be along the channel 910. The gate electrode 916 may be on the dielectric layer 914. The channel 910 may be separated from the gate electrode 916 by the dielectric layer 914. In various embodiments, the passivation layer 918 may cover the entire perimeter of the channel on at least a portion along the length of the channel 910. In other words, the channel 910 may have a portion along the length of the channel 910 which is completely surrounded by the passivation layer 918. The device structure may further include an electrically conductive via 922 electrically coupled to a part of the device structure such as the second electrode 912b. The device structure may further include an insulating element 924 at least partially on or coupled to the electrically conductive via 922. The device structure may also include a metal electrode 926 on or coupled to the insulating element 924. In other words, the device may include an electrical structure (including the metal electrode 926, the insulating element 924 and the electrically conductive via 922) coupled to a part of the device structure such as the second electrode 912b.

Figure 10A:
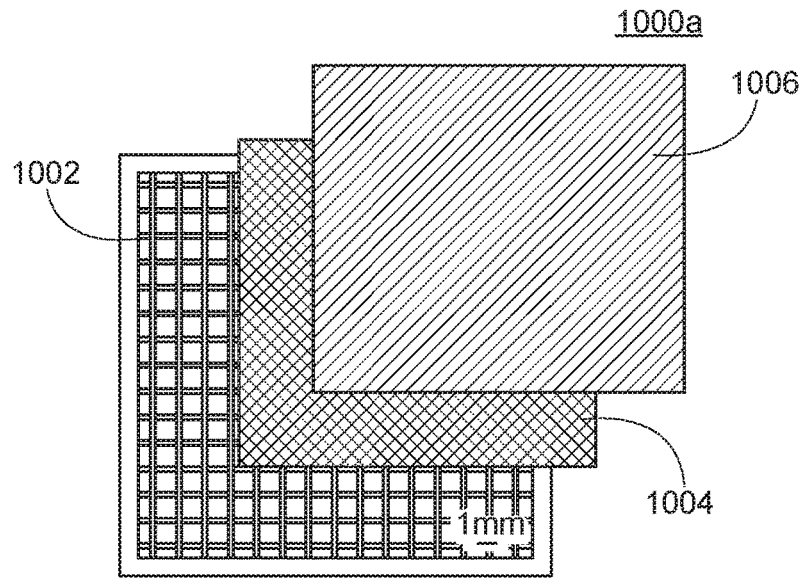
FIG. 10A shows a schematic showing the planar view of a first sheet, a second sheet including the insulating element and a third sheet including the metal electrode according to various embodiments.
Figure 10B:
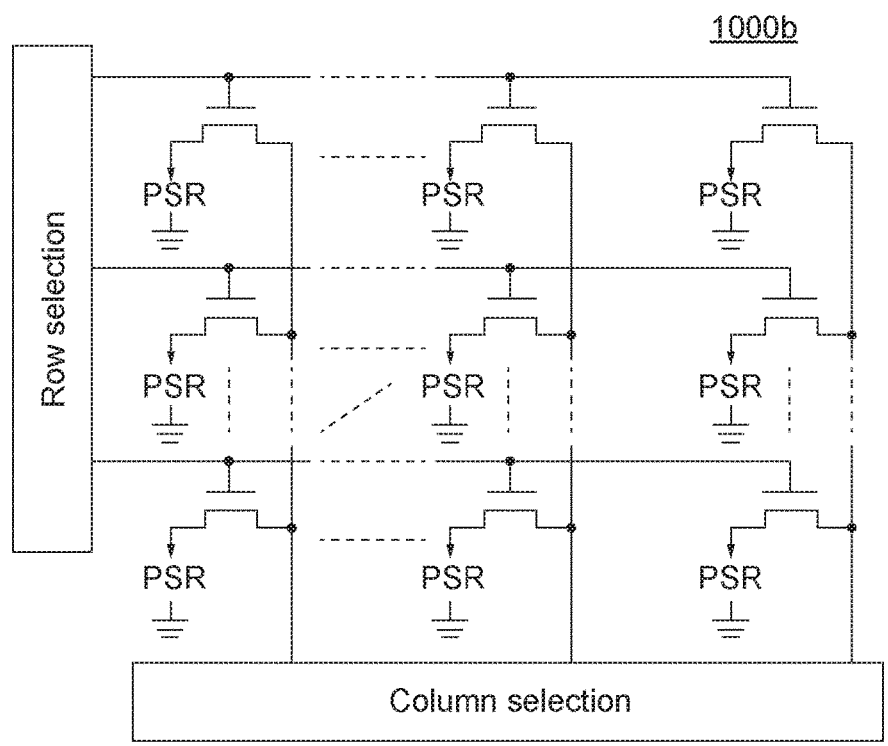
FIG. 10B shows a circuit arrangement according to various embodiments.
Figure 10C:
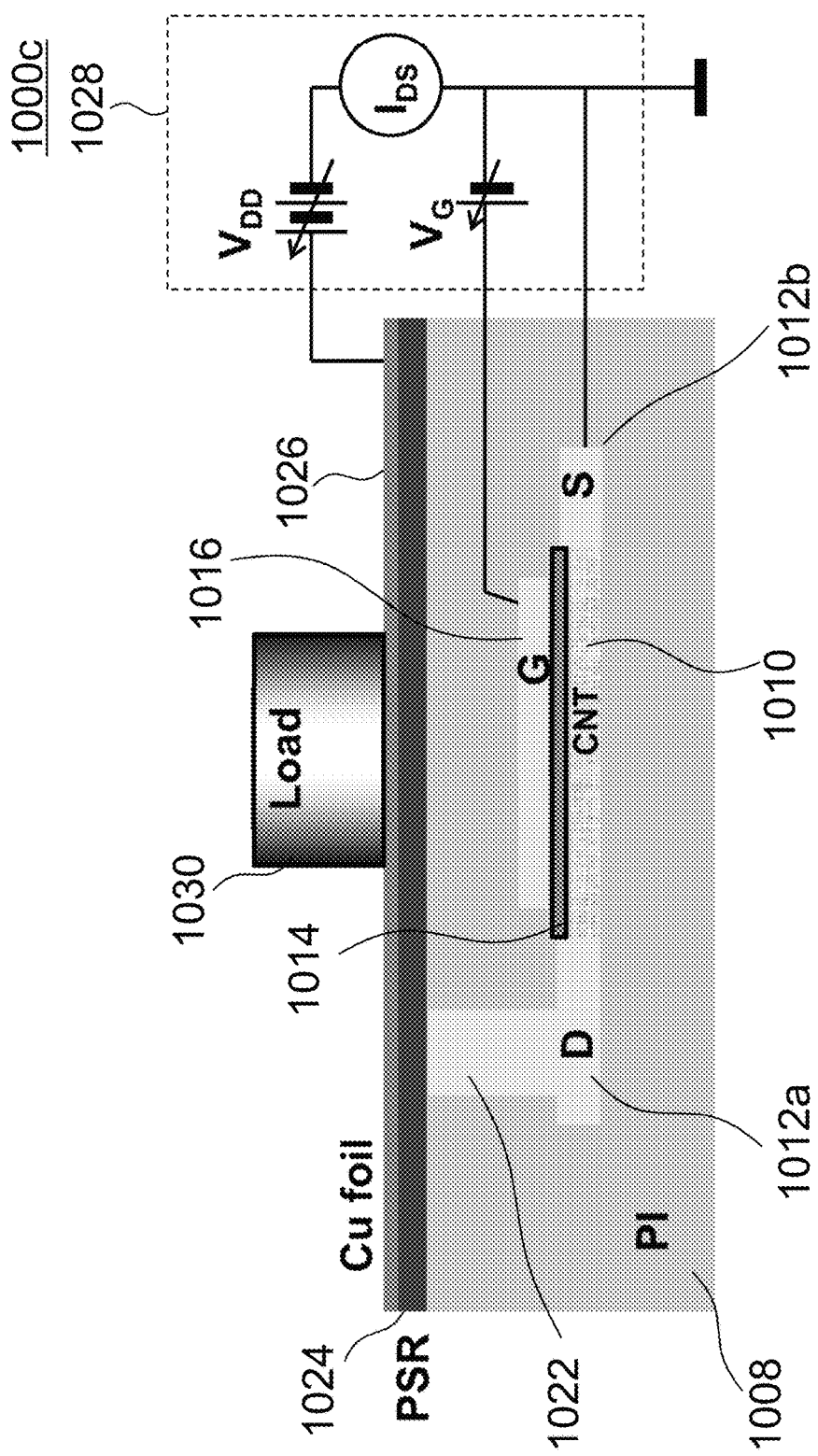
FIG. 10C shows a schematic having a cross sectional side view of one cell of the device according to various embodiments.

FIG. 10A shows a schematic 1000a showing the planar view of a first sheet 1002, a second sheet 1004 including the insulating element and a third sheet 1006 including the metal electrode according to various embodiments. The first sheet 1002 may include an array of transistors (for instance 256 transistors arranged in a 16 by 16 array or 625 transistors arranged in a 25 by 25 array). The second sheet 1004 may include a pressure sensitive rubber (PSR) sheet. In various embodiments, the device may include an array of transistors, an insulating element on the array of transistors and a metal electrode on the insulating element. FIG. 10B shows a circuit arrangement 1000b according to various embodiments. The array may include a plurality of cells. Each cell may include one transistor. Each cell may be addressed by row selection circuitry and column selection circuitry. FIG. 10C shows a schematic 1000c having a cross sectional side view of one cell of the device according to various embodiments. The transistor may be a thin film transistor. The transistor may include a first electrode 1012a and a second electrode 1012b. The transistor may further include a channel 1010 having a first end and a second end. The channel 1010 may include CNTs. The first end may be electrically coupled to the first electrode 1012a and the second end may be electrically coupled to the second electrode 1012b. A dielectric layer 1014 may be on the channel 1010. A gate electrode 1016 may be on the dielectric layer 1014. A transfer medium 1008 may at least partially cover the channel 1010, the dielectric layer 1014, the gate electrode 1016, the first electrode 1012a and the second electrode 1012b. The transfer medium 1008 may include polyimide.

The first electrode 1012a may be a drain electrode. The second electrode 1012b may be a source electrode. A conductive via 1022 may electrically couple the first electrode 1012a to an insulating element 1024, e.g. a PSR. The conductive via 1022, the insulating element 1024 and the metal electrode 1026 may form a resistive element. The application of an external pressure will cause the conductance of the insulating element 1024 to vary. The external pressure may be applied by a load 1030. A sensing/biasing circuit arrangement 1028 may be electrically coupled to the transistor. The circuit arrangement 1028 may bias the gate electrode with a voltage $V_G$ to turn the transistor on (ON state). The second electrode 1012b (i.e. the source electrode) may be electrically connected to ground. The circuit arrangement 1028 may further supply a potential difference of $V_{DD}$ between the transistor and the resistive element. The source-drain current, $I_{DS}$, passing through the first electrode 1012a, the second electrode 1012b and the channel 1010 of the transistor as well as the insulating element 1024 may be measured. As the conductance of the insulating element 1024 is varied, corresponding changes of $I_{DS}$ may reflect the external pressure applied. The array, having a plurality of cells, may be configured to detect a pressure distribution. The pressure distribution may be obtained by addressing the word (row) and bit (column) lines of the array using the row selection circuitry and column selection circuitry.

Figure 10D:
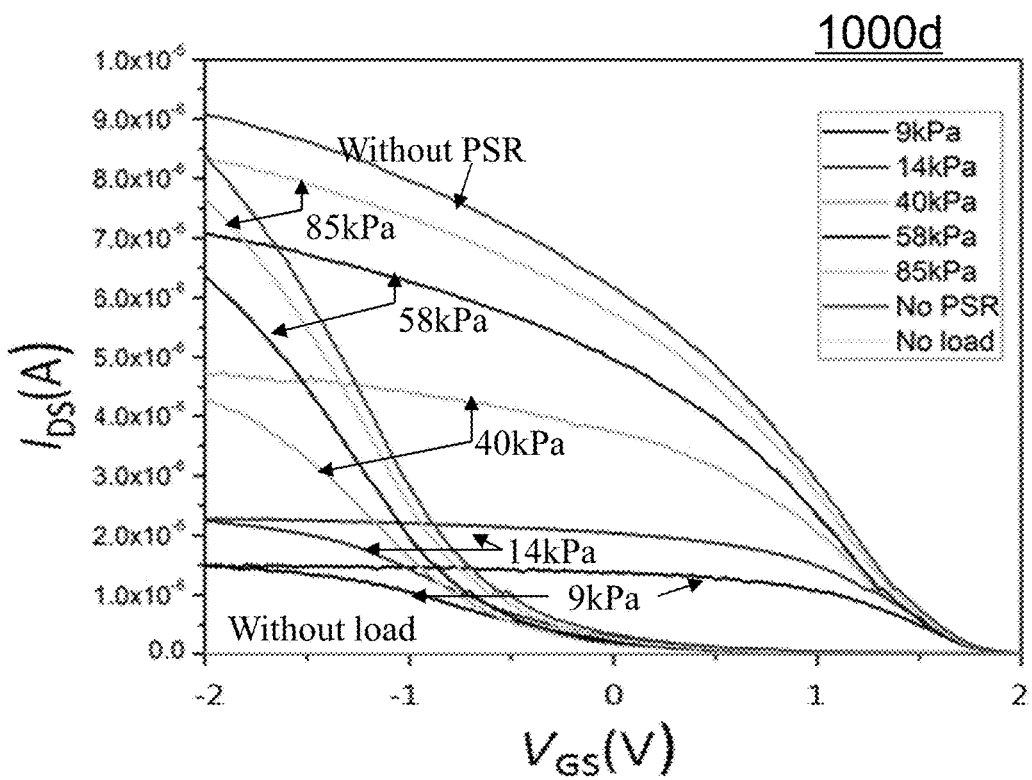
FIG. 10D is a graph showing the source-drain current ($I_{DS}$) and gate voltage characteristics ($V_{GS}$) of a device according to various embodiments under different external pressures.
Figure 10E:
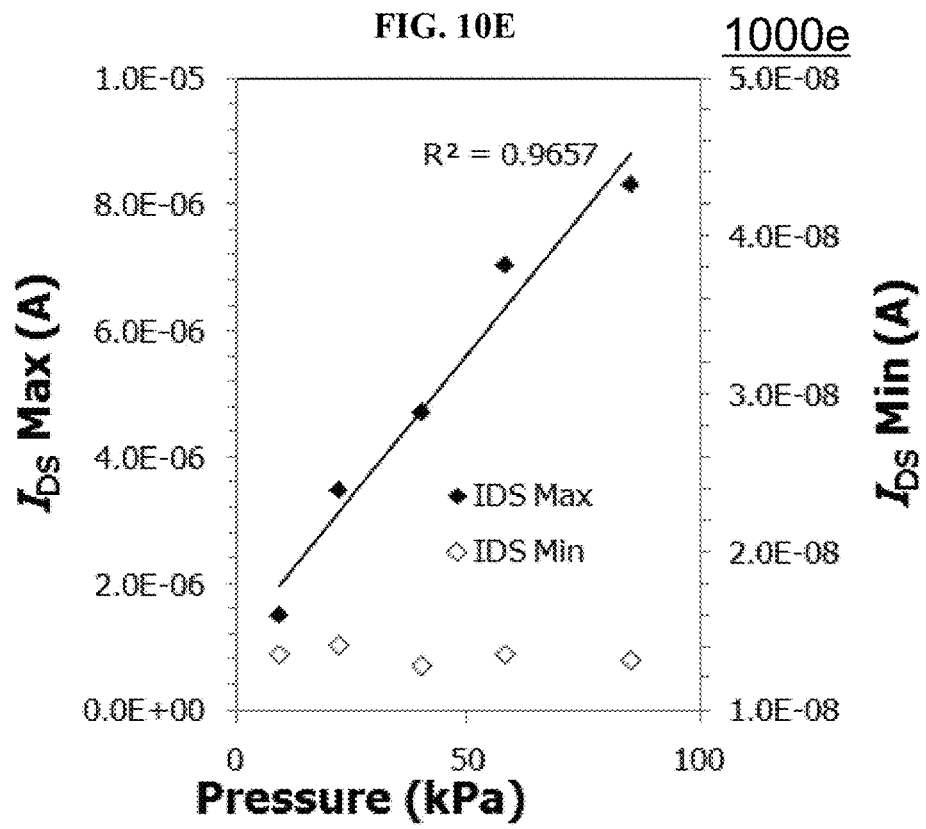
FIG. 10E shows the maximum and minimum source-drain current ($I_{DS}$) as a function of pressure with $V_{GS}$ fixed at about −2V and $V_{DS}$ fixed at about 1V.

FIG. 10D is a graph 1000d showing the source-drain current ($I_{DS}$) and gate voltage characteristics ($V_{GS}$) of a device according to various embodiments under different external pressures. FIG. 10E is a graph 1000e showing the maximum and minimum source-drain current ($I_{DS}$) as a function of pressure with $V_{GS}$ fixed at about −2V and $V_{DS}$ fixed at about 1V. The device may exhibit high sensitivity to an applied pressure ranging from about 0 kPa to about 100 kPa. The ON state current of the device may show a linear pressure dependency for an applied pressure ranging from about 0 kPa to about 100 kPa.

Various embodiments may allow for optically transparent, mechanically flexible displays. Various embodiments may provide attractive solutions for display technologies and portable electronics. Various embodiments may provide a transparent, flexible driver matrix circuit arrangement for light emitting diodes (LEDs) such as organic light emitting diodes (OLEDs). The driver matrix circuit arrangement may possess high drive currents, transparency, flexibility and/or fast switching.

Figure 11C:
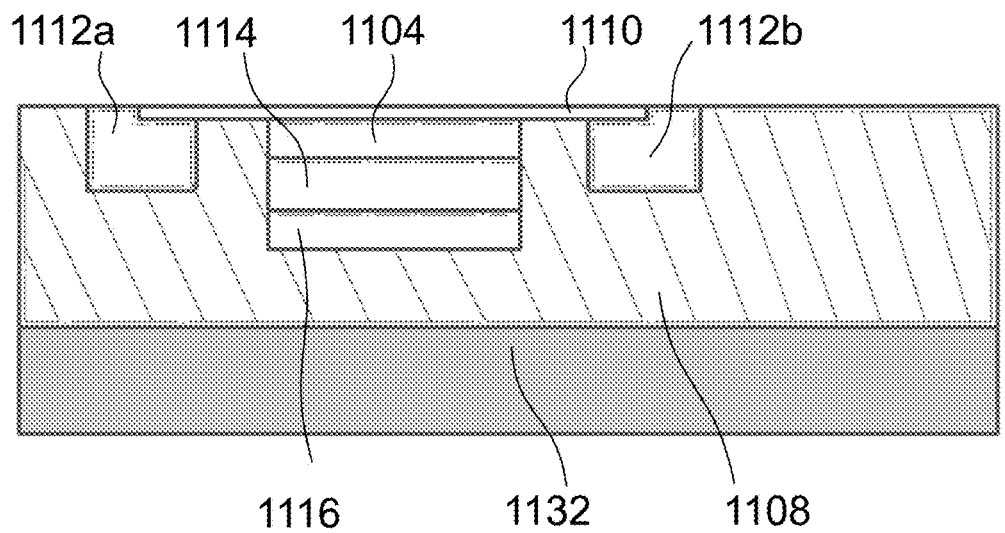

FIGS. 11A to 11G show a method for forming a device according to various embodiments. The device may be a circuit arrangement, e.g. a driving circuit arrangement for a LED such as an OLED. The device may include a transistor electrically coupled to an LED such as an OLED. FIG. 11A shows a schematic 1100a having a cross sectional side view of an intermediate structure formed on a substrate 1102 according to various embodiments. The intermediate structure may include a contact layer 1104 formed at least partially on the substrate 1102. The intermediate structure may further include a device structure at least partially on the contact layer 1104. The device structure may include a transistor such as an MOSFET. The device structure may include a channel 1110. The channel 1110 may include a thin film including a nanomaterial. For instance, the channel 1110 may include a carbon nanotube thin film (CNT-TF) including carbon nanotubes (CNTs). The channel 1110 may have a first end and a second end. A first electrode 1112a may be formed on the substrate 1102 such that the first end of the channel 1110 is electrically coupled with the first electrode. A second electrode 1112b may be formed on the substrate 1102 such that the second end of the channel 1110 is electrically coupled with the second electrode. In other words, the nanomaterial may form a channel 1110 having a first end and a second end. The first end may be electrically coupled to a first electrode 1112a and the second end may be electrically coupled to a second electrode 1112b.

The device structure may further include a dielectric layer 1114 on the contact layer 1104. The device structure may further include a gate electrode layer 1116 on the dielectric layer 1114. The intermediate structure may also include a transfer medium 1108 at least covering the device structure. The method may include solidifying the transfer medium 1108 from a first material (e.g. polyamic acid) to a second material (e.g. polyimide). Methods to form the structure shown in FIG. 11A may include methods illustrated in FIGS. 3A to 3E.

FIG. 11B shows a schematic 1100b having a cross sectional side view of a further substrate 1132 being attached to the intermediate structure according to various embodiments in FIG. 11A. The transfer medium 1108 may have a first portion along a first main surface of the transfer medium 1108 and a second portion along a second main surface of the transfer medium 1108. The first main surface and the second main surface may be on opposing sides of the transfer medium 1108. The transfer medium 1108 may be on or attached to the substrate 1102 via the second portion. In other words, the second portion of the transfer medium 1108 may be facing the substrate 1102 or adjacent the substrate 1102. The method may include attaching a further substrate 1132 to the first portion of the transfer medium 1108. The first portion of the transfer medium 1108 may be opposite the second portion of the transfer medium 1108 adjacent to the substrate 1102. The further substrate may include polydimethylsiloxane (PDMS). The further substrate 1132 may be laminated to the transfer medium 1108.

FIG. 11C shows a schematic 1100c having a cross sectional side view of a removable portion being separated from the substrate 1102. The removable portion may include the contact layer 1104, the device structure and the transfer medium 1108. The removable portion may further include the further substrate 1132. The device structure may include the transistor as shown in FIG. 11A. The method may include separating the removable portion from the substrate 1102. In other words, the method may include separating the contact layer 1104, the device structure, the further substrate 1132 and the transfer medium 1108 from the substrate 1102. The contact layer 1104, the device structure, the further substrate 1132 and the transfer medium 1108 may be separated as one integral piece from the substrate 1102.

Figure 11D:
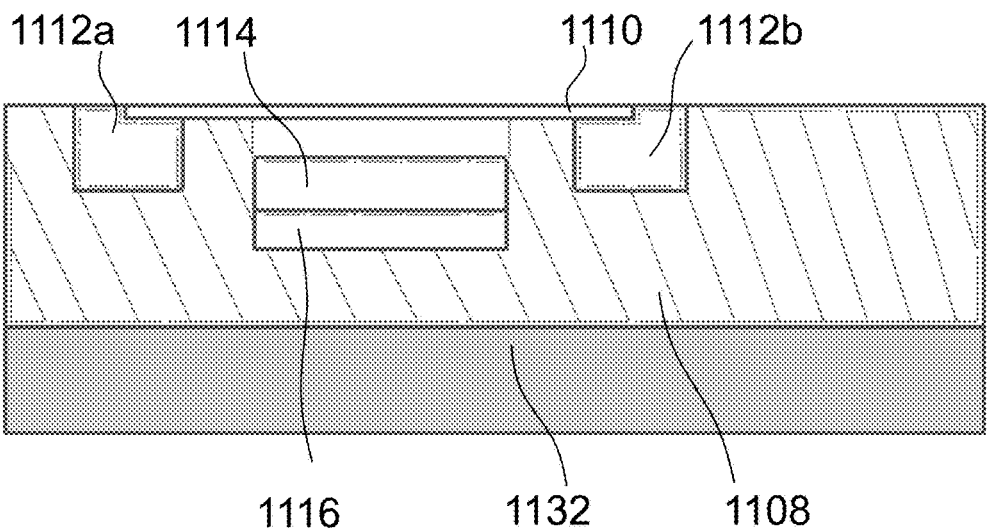

FIG. 11D shows a schematic 1100d having a cross sectional side view of the removable portion with the contact layer 1104 being etched away according to various embodiments. The contact layer 1104 may be etched away by a suitable etchant (e.g. a vapour based etchant). The device structure may be configured such that the at least a portion of the device structure is resistant to the etchant. The transfer medium 1108 may be configured such that the transfer medium 1108 is resistant to the etchant. The further substrate 1132 may be configured such that the further substrate 1132 is resistant to the etchant.

Figure 11E:
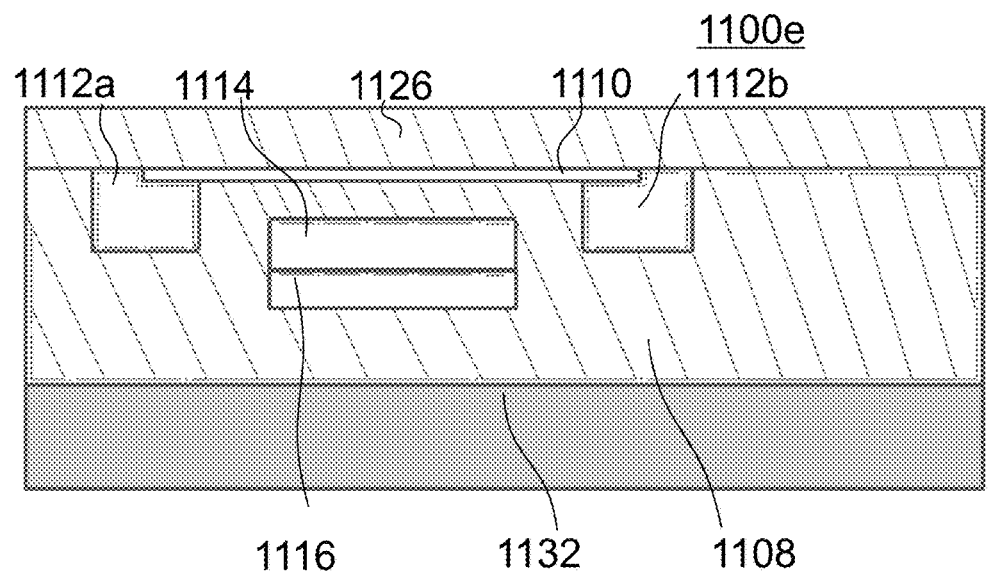

FIG. 11E shows a schematic 1100e having a cross sectional side view of the removable portion being passivated according to various embodiments. The method may further include passivating a part of the removable portion with a passivation layer 1126. The part of the removable portion may include at least a portion of the device structure such as the channel 1110. The passivation layer may include polyimide. Passivation may include depositing (e.g. by spin-coating) a material such as PAA onto the part of the removable portion. In other words, the method may further include depositing a passivation layer 1126 on the second portion of the transfer material 1108 after separating the contact layer 1104, the device structure and the transfer medium 1108 from the substrate 1102. The material may be converted to a further material such as polyimide after annealing. Annealing may be done in a nitrogen ambient.

Figure 11F:
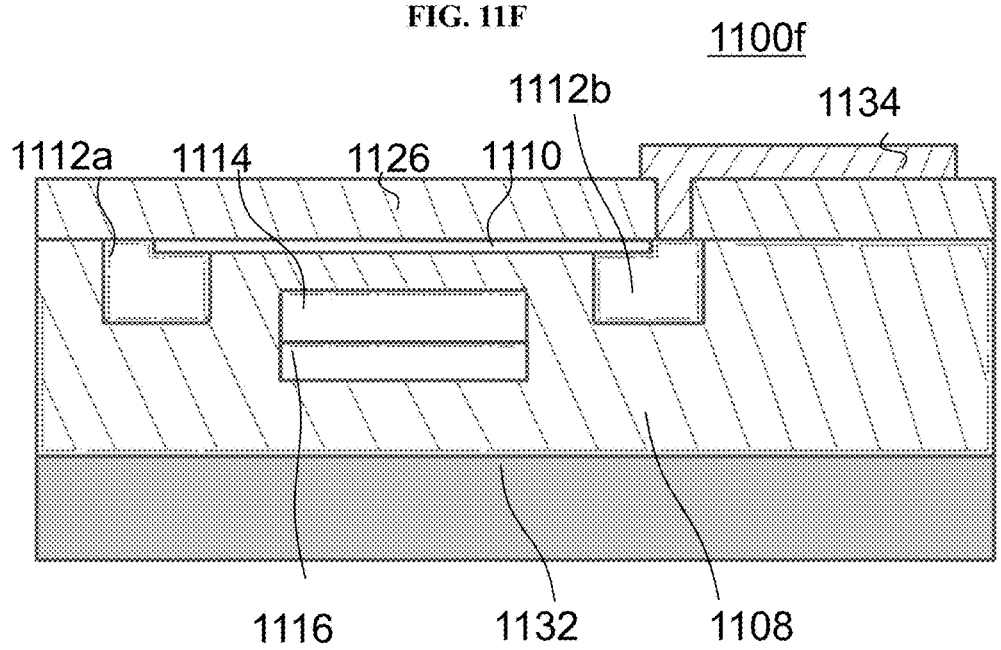

FIG. 11F shows a schematic 1100f having a cross sectional side view of a light emitting diode (LED) anode 1134 being formed according to various embodiments. The LED anode 1134 may be an OLED anode. The method may include forming a hole such as a via hole on the passivation layer. Forming the hole may include etching such as oxygen plasma etching. The method may further include forming a light emitting diode (LED) on the passivation layer 1126. The LED may be electrically coupled with the device structure through the hole. Forming the LED may include forming the LED anode on the passivation layer 1126 such that the LED anode is electrically coupled with the device structure through the hole. Forming the LED anode on the passivation layer 1126 may include using a mask such as a hard mask to define the LED anode 1134. A suitable first metal may be deposited in the hole and on a portion of the passivation layer 1126 defined by the mask to from the LED anode 1134.

Figure 11G:
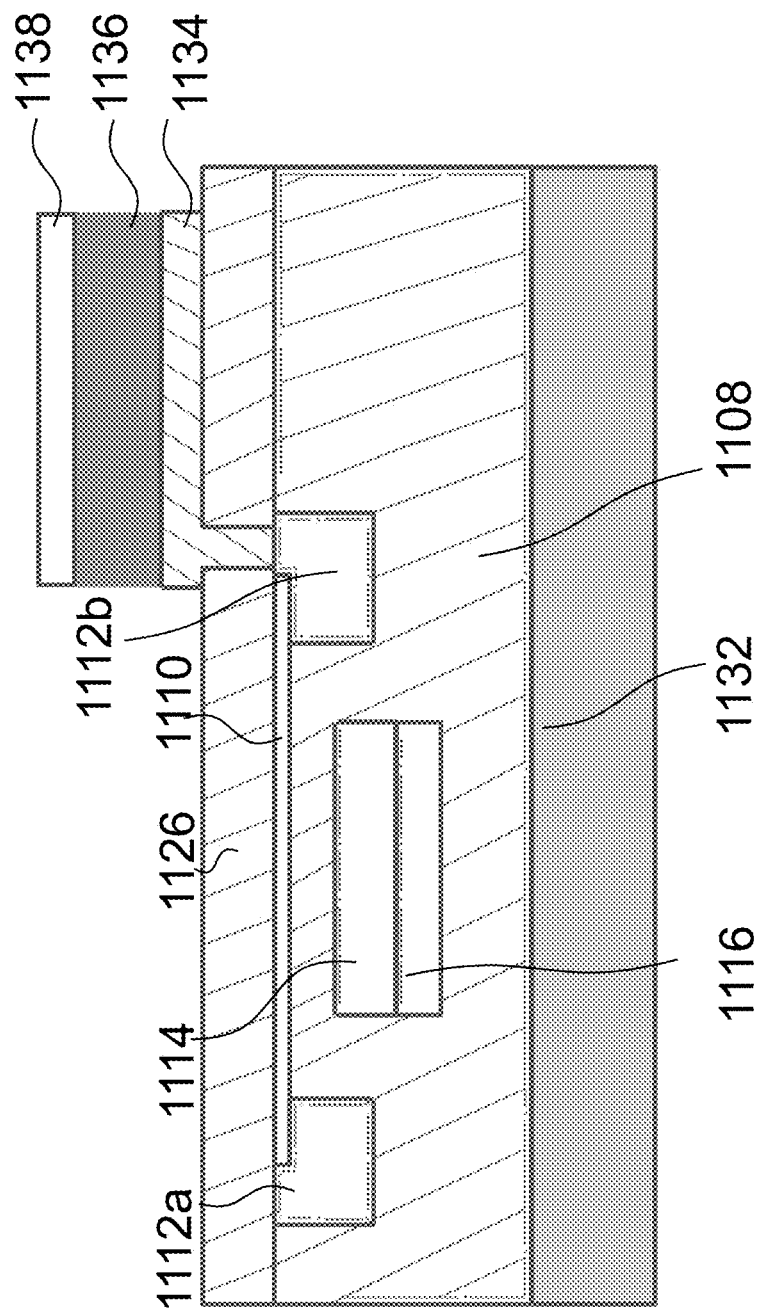

FIG. 11G shows a schematic 1100g having a cross sectional side view of a device according to various embodiments. The method may further include depositing the active material on the LED anode 1134 to form the active material layer 1136. The method may further include forming the LED cathode 1138 on the active material layer 1136. A suitable second metal may be deposited on the active material layer 1136 to form the LED cathode 1138. The active material layer 1136 and/or the LED cathode 1138 may be defined by the mask used to define the LED anode 1134. The device may include a transistor such as a drive transistor electrically coupled with a LED such as OLED. The drive transistor may be a CNT-TFT.

The device may include a device structure. The device may further include a transfer medium 1108 at least partially covering the device structure. The device may further include a passivation layer 1126 at least partially covering the device structure. The passivation layer 1126 may include silicon nitride ($Si_3N_4$). The device structure may include the first electrode 1112a, the second electrode 1112b, the gate electrode 1116, the channel 1110 and the dielectric layer 1114. The channel 1110 may have a first end and a second end. The channel 1110 may have a length and a perimeter. The length may extend from the first end to the second end. The area enclosed by the perimeter of the channel 1110 nay be substantially perpendicular to the length of the channel 1110. The channel 1110 may be between the first electrode 1112a and the second electrode 1112b. The dielectric layer 1114 may be along the channel 1110. The gate electrode 1116 may be on the dielectric layer 1114. The channel 1110 may be separated from the gate electrode 316 by the dielectric layer 1114. In various embodiments, the passivation layer 1126 may cover the entire perimeter of the channel on at least a portion along the length of the channel 1110. In other words, the channel 1110 may have a portion along the length of the channel 1110 which is completely surrounded by the passivation layer 1126. The device may further include a .LED coupled to a part of the device structure such as the second electrode 1112b. The LED may include an active material layer 1136 between the LED cathode 1138 and the LED anode 1134.

Figure 12A:
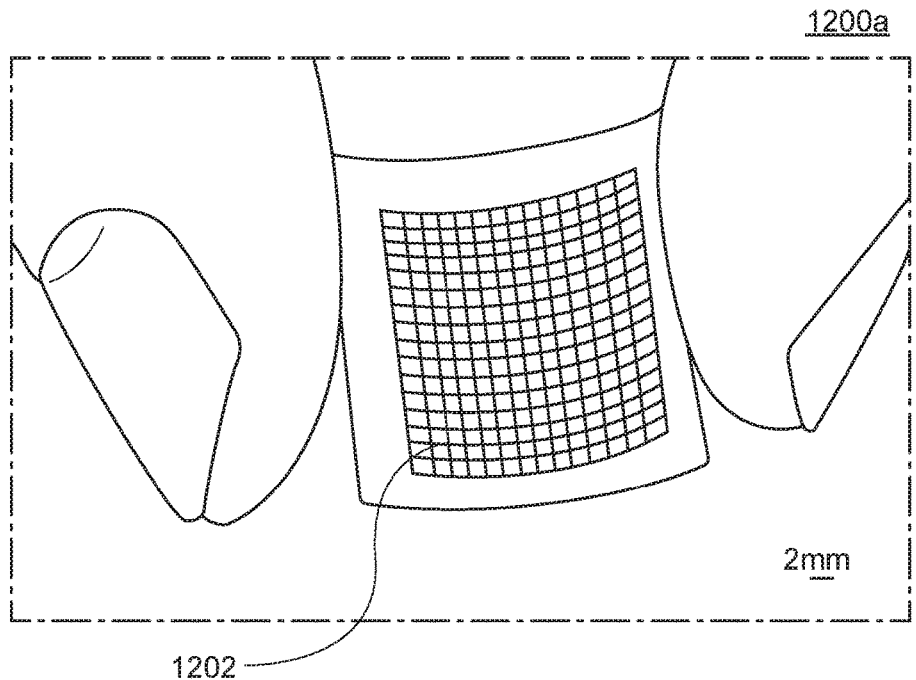
FIG. 12A shows a photo of an array including a plurality of cells according to various embodiments.
Figure 12B:
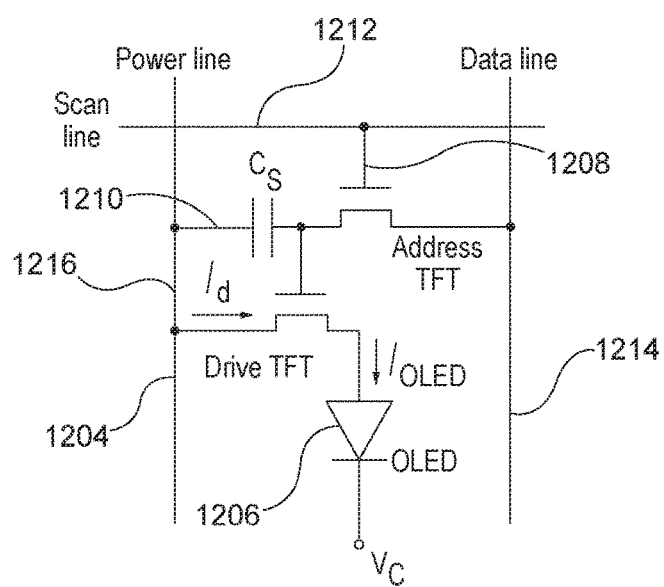
FIG. 12B shows a schematic of one cell according to various embodiments.

FIG. 12A shows a photo 1200a of an array 1202 including a plurality of cells according to various embodiments. Each cell may include a device as shown in FIG. 11G. Each cell may include a transistor (e.g. a TFT) electrically coupled to a LED e.g. an OLED. The transistor may include a drive TFT. FIG. 12B shows a schematic 1200b of one cell according to various embodiments. The cell may include a transistor 1204 electrically coupled to a LED 1206 e.g. an OLED. The transistor 1204 may include a drive transistor. The cell may further include an addressing transistor (e.g. a TFT) 1208 and a capacitor 1210. The addressing transistor 1208 may switch on the cell based on the scan line 1212 and the data line 1214. When the cell is switched on, the drive transistor 1204 is turned on. Current is then supplied from the power line 1216 to the LED 1206 through the drive transistor 1204. The capacitor 1210 acts as a storage capacitor.

Figure 13:
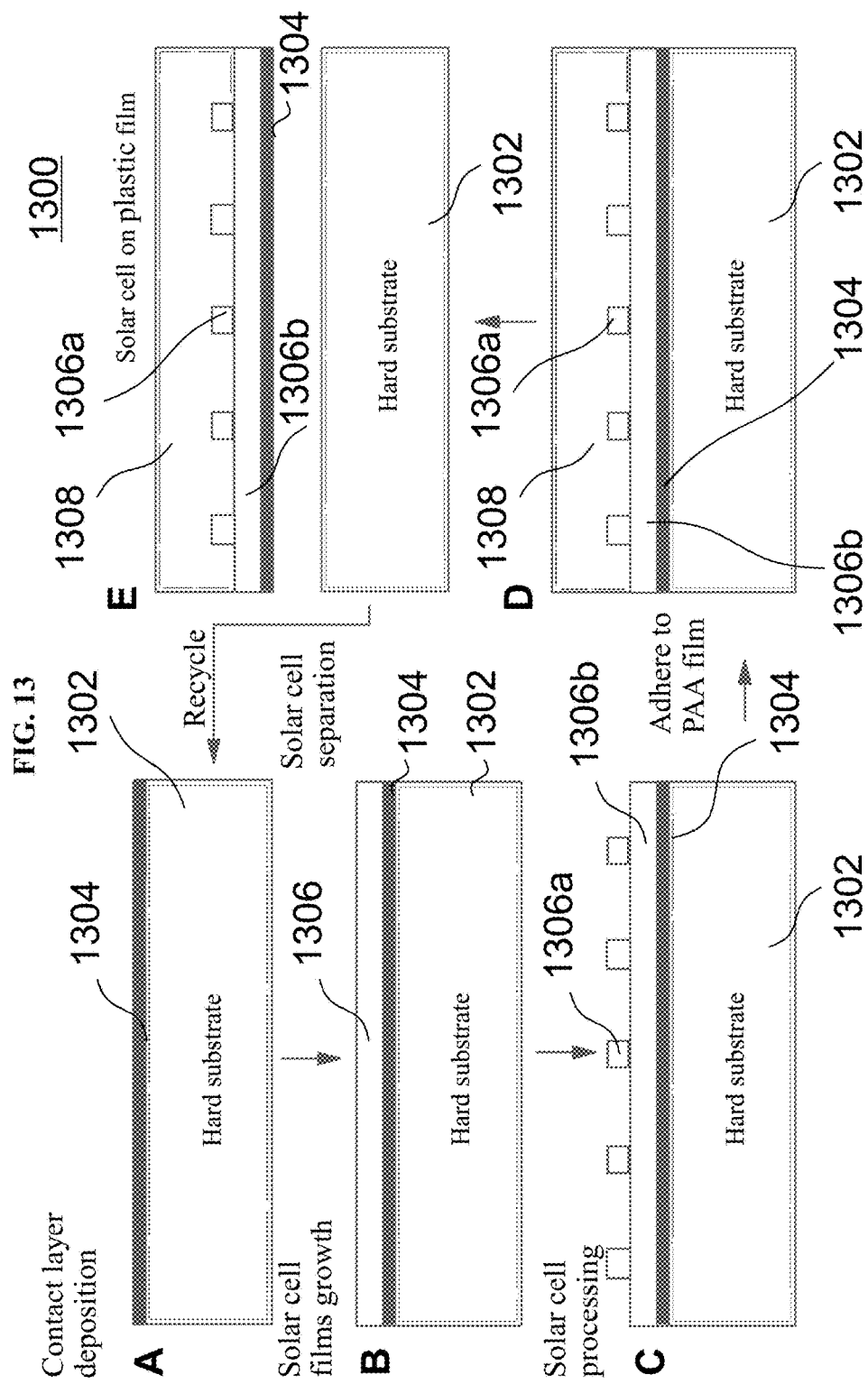

FIGS. 13A to 13E show a schematic 1300 of a method for forming a device according to various embodiments. The device may be a solar cell or a photovoltaic cell. FIG. 13A shows a contact layer 1304 at least partially on a substrate 1302 according to various embodiments. The method may include forming the contact layer 1304 at least partially on the substrate 1302. The contact layer 1304 may be coated onto the substrate 1302. FIG. 13B shows one or more solar material 1306 deposited at least partially on the contact layer 1304 according to various embodiments. The deposited solar material(s) may be processed to form solar cell structures 1306a. The solar material(s) may include one or more of n doped silicon (n-Si), undoped silicon (native Si) and p doped silicon (p-Si). Deposition may include chemical vapour deposition (CVD). If there is more than one material, the solar cell materials may be deposited in sequence. FIG. 13C shows the solar cell structures being formed according to various embodiments. The solar cell structures 1306a may be formed on a support layer 1306b. A device structure, including the solar cell structures 1306a and the support layer 1306b, may be at least partially on the contact layer 1304. The support layer 1306b may include metallization for electrical coupling with the solar cell structures 1306a. The support layer 1306b may include back contact electrodes. The back contact electrodes may include aluminum. Processing the solar material may include a photolithography process. Processing the solar material may include etching. The method may include forming a device structure at least partially on the contact layer 1304. FIG. 13D shows a transfer medium 1308 being deposited such that the device structure is at least partially covered by the transfer medium 1308 according to various embodiments. The method may include depositing the transfer medium 1308 such that the device structure is at least partially covered by the transfer medium 1308. The method may include solidifying the transfer medium 1308. Solidifying the transfer medium 1308 may include curing the transfer medium 1308. Solidifying the transfer medium 1308 may include converting the transfer medium 1308 from a first material (e.g. PAA) to a second material (e.g. polyimide). The contact layer 1304, the device structure and the transfer medium 1308 may form a removable portion. FIG. 13E shows the removable portion being separated from the substrate 1302 according to various embodiments. The removable portion may be separated from the substrate 1302 as one integral piece. The removable portion may form the device. The device may include a contact layer 1304. The device may include a device structure at least partially on the contact layer 1304. The device structure may include solar cell structures 1306a on a support layer 1306b. The device may further include a transfer medium 1308 at least partially covering the device structure. The contact layer 1304 may be removed after separating the contact layer 1304, the device structure and the transfer medium 1308 from the substrate 1302. The substrate 1302 may be recycled. In other words, the substrate 1302 may be reused to form a subsequent device.

Various embodiments may provide a method to fabricate flexible solar cells. Various embodiments may allow for solar cells that are low-cost, lightweight, and/or suited for customized integrated solutions.

Figure 14A:
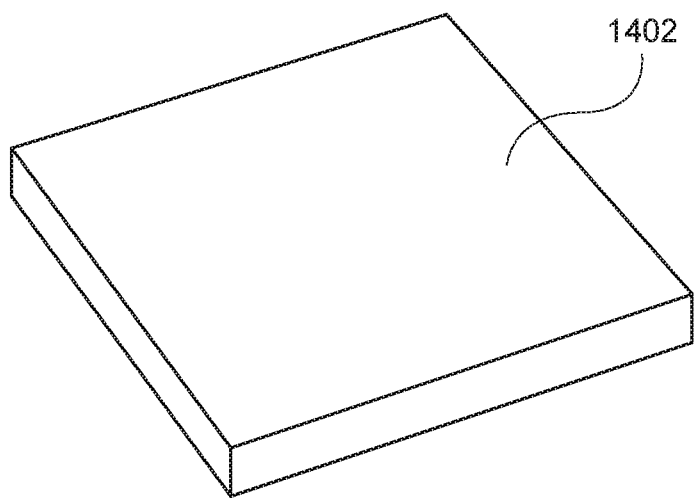
Figure 14B:
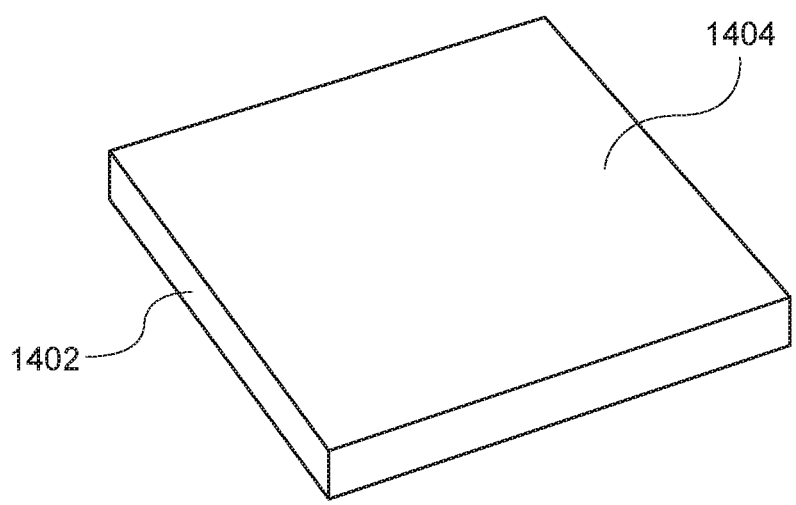

FIGS. 14A to 14F shows a method for forming a device according to various embodiments. The device may be a material having patterns such as metamaterial patterns. The metamaterial patterns may be or may include metallic patterns. The metamaterial patterns may be or may include periodic metamaterial patterns. FIG. 14A shows a schematic 1400a having a top corner perspective view of a substrate 1402 according to various embodiments. The substrate 1402 may be a semiconductor substrate. The substrate 1402 may be a hard substrate. FIG. 14B shows a schematic 1400b having a top corner perspective view of a contact layer 1404 deposited on a substrate 1402 according to various embodiments. The method may include forming a contact layer 1404 at least partially on a substrate 1402.

Figure 14C:
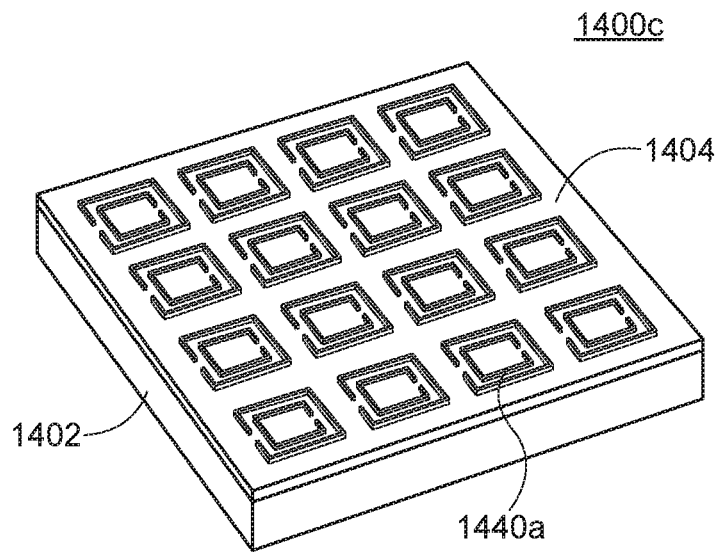

FIG. 14C shows a schematic 1400c having a top corner perspective view of the contact layer 1404 being patterned according to various embodiments. The method may include patterning the contact layer 1404. The contact layer 1404 may be patterned with metamaterial patterns 1440a e.g. periodic metamaterial patterns.

Figure 14D:
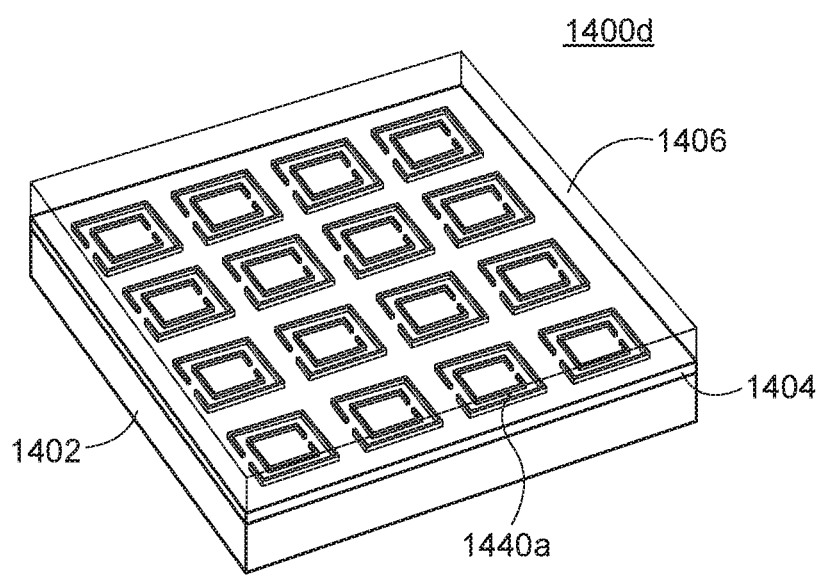

FIG. 14D shows a schematic 1400d having a top corner perspective view of a transfer medium 1406 being deposited on the contact layer 1404. A portion of the transfer medium 1406 coming into contact with the contact layer 1404 may be formed into a device structure. The device structure may at least be partially on the contact layer 1404. Forming the device structure may include patterning the device structure according to the contact layer 1404. The device structure may include the metamaterial patterns 1440b. The metamaterial patterns 1440b formed on the transfer medium 1406 (i.e. the metamaterial patterns 1440b may be at least be partially covered by the transfer medium 1406) may correspond to the metamaterial patterns 1440a on the contact layer 1404. In other words, the metamaterial patterns 1440a on the contact layer 1404 may be transferred to the transfer medium to form metamaterial patterns 1440b. Forming the device structure at least partially on the contact layer 1404 and depositing the transfer medium 1406 such that the device structure may be at least partially covered by the transfer medium 1406 may be carried out simultaneously. The transfer medium 1406 may be deposited at least partially on the contact layer 1404 such that the device structure is formed at the interface of the deposited transfer medium with the contact layer 1404. The device structure may at least partially covered by the transfer medium 1406. Patterning the device structure according to the contact layer may include patterning the device structure according to the periodic metamaterial patterns on the contact layer 1404. The method may include solidifying the transfer medium. Solidifying the transfer medium 1406 may include converting the transfer medium 1406 from a first material (e.g. polyamic acid) to a second material (e.g. polyimide). A removable portion including the contact layer 1406, the device structure and the transfer medium 1406 may be formed. The contact layer 1406 may have greater adhesion to the device structure or the transfer medium 1406 than to the substrate 1402.

Figure 14E:
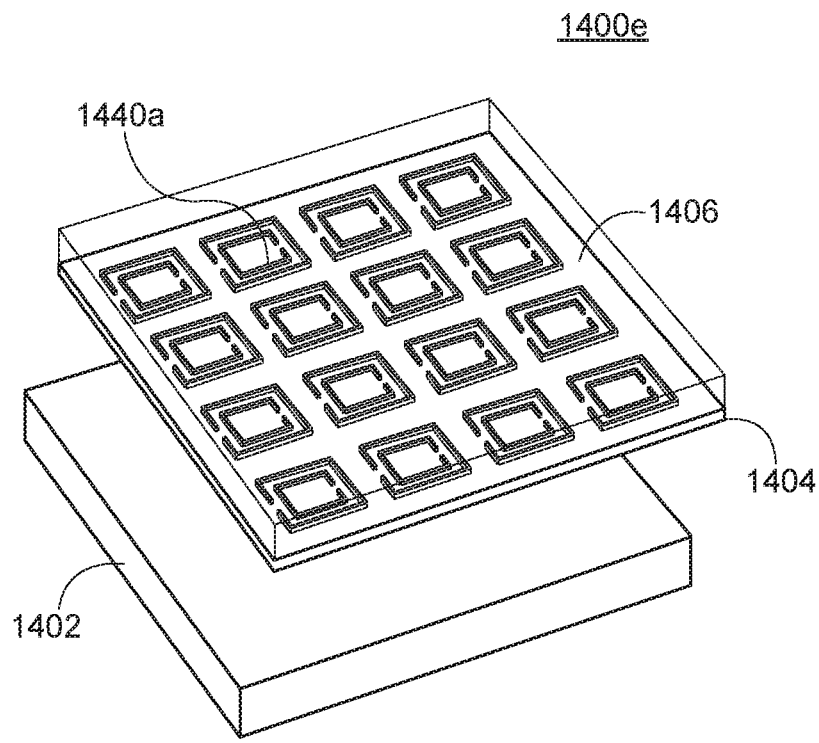

FIG. 14E is a schematic 1400e showing a top corner perspective view of the removable portion being separated from the substrate 1402 according to various embodiments. The removable portion may be separated from the substrate 1402 as one integral piece. The method may further include removing the contact layer 1406 after separating the removable portion (i.e. the contact layer 1406, the device structure and the transfer medium 1406) from the substrate 1402.

Figure 14F:
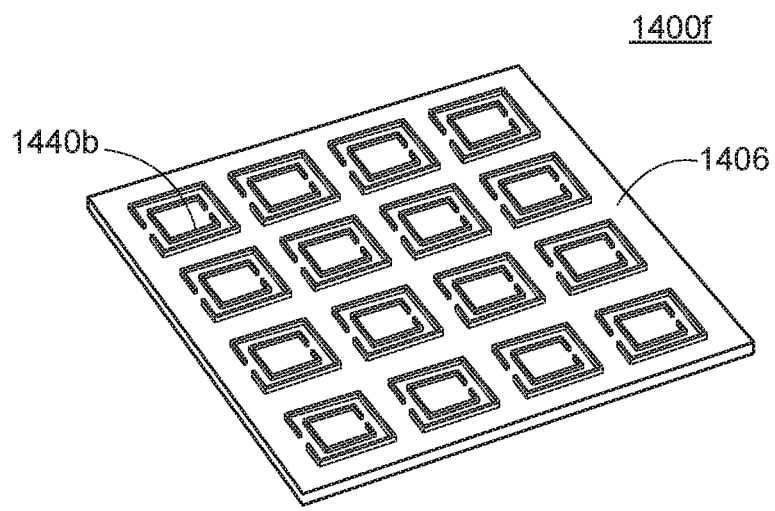

FIG. 14F is a schematic 1400f showing a top corner perspective view of the device according to various embodiments. The device may include a device structure including metamaterial patterns 1440b, the device structure on a transfer medium 1406. In other words, the device may include a device structure (having metamaterial patterns 1440b) and a transfer medium 1406 at least partially covering the device structure.

It may not be easy to fabricate the metamaterial patterns directly on a plastic substrate due to the small feature size of the metamaterial patterns (may be down to several tens of nanometers). Further, plastic is electrically non-conducting, which makes it unfavourable for electron beam lithography to form features. Various embodiments may seek to avoid the problems associated with forming metamaterial directly on a plastic substrate.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A method for forming a device, the method comprising:
forming a first electrode on a substrate;
forming a second electrode on the substrate;
forming a contact layer at least partially on a substrate;
forming a device structure comprising a nanomaterial, the first electrode and the second electrode, the nanomaterial adhered to the contact layer such that the nanomaterial forms a channel having a first end and a second end, wherein the first end is electrically coupled to the first electrode and the second end is electrically coupled to the second electrode, wherein a first portion of the contact layer is on the substrate and at least a portion of the channel is between a second portion of the contact layer and the substrate;
depositing a transfer medium such that the device structure is covered by the transfer medium;
solidifying the transfer medium; and
peeling off the contact layer, the device structure and the transfer medium from the substrate;
wherein the contact layer has a greater adhesion to the device structure than to the substrate; and
removing the contact layer after peeling off the contact layer, the device structure and the transfer medium from the substrate.

2. The method according to claim 1,
wherein separating the contact layer, the device structure and the transfer medium from the substrate comprises separating the contact layer, the device structure and the transfer medium from the substrate in one step.

3. The method according to claim 1,
wherein forming the device structure comprises forming a dielectric layer on the contact layer.

4. The method according to claim 3,
wherein forming the device structure comprises forming a gate electrode layer on the dielectric layer.

5. The method according to claim 1, the method further comprising:
forming an electrically conductive via on the transfer medium such that the electrically conductive via is electrically coupled to the device structure.

6. The method according to claim 5, the method further comprising:
arranging an insulating element on the transfer medium such that the insulating element is at least partially on a portion of the electrically conductive via;
arranging a metal electrode on the insulating element such that the metal electrode, the insulating element and the electrically conductive via forms an electrical structure.

7. The method according to claim 1, the method further comprising:
attaching a further substrate to a first portion of the transfer medium, the first portion of the transfer medium opposite a second portion of the transfer medium adjacent to the substrate.

8. The method according to claim 7, the method further comprising:
depositing a passivation layer on the second portion of the transfer medium after separating the contact layer, the device and the transfer medium from the substrate.

9. The method according to claim 8, the method further comprising:
forming a hole through the passivation layer; and
forming a light emitting diode structure on the passivation layer, the light emitting diode structure electrically coupled with the device structure through the hole.

10. The method according to claim 1,
wherein the device structure comprises a transistor.

11. The method according to claim 1,
wherein the device structure comprises a circuit arrangement.

12. The method according to claim 1,
wherein the contact layer comprises gold.

13. The method according to claim 1,
wherein the contact layer comprises palladium.

14. The method according to claim 1,
wherein the transfer medium comprises a solution based transfer medium.

15. The method according to claim 14,
wherein the solution based transfer medium comprises polyamic acid.

16. The method according to claim 15,
wherein solidifying the transfer medium comprises converting the polyamic acid to polyimide.

17. The method according to claim 1,
wherein the substrate is a semiconductor substrate configured to withstand temperatures up to about 1000° C.

18. The method according to claim 1,
wherein the substrate is an insulator substrate configured to withstand temperatures up to about 1000° C.

19. The method according to claim 1,
wherein depositing a transfer medium such that the device structure is at least partially covered by the transfer medium comprises depositing a transfer medium such that the device structure is encapsulated by the transfer medium.

* * * * *